(12) United States Patent
Gu et al.

(10) Patent No.: US 11,023,360 B2
(45) Date of Patent: Jun. 1, 2021

(54) SYSTEMS AND METHODS FOR CONFIGURING PROGRAMMABLE LOGIC DEVICES FOR DEEP LEARNING NETWORKS

(71) Applicant: The MathWorks, Inc., Natick, MA (US)

(72) Inventors: Yongfeng Gu, Brookline, MA (US); Girish Venkataramani, Cambridge, MA (US); Wang Chen, Brookline, MA (US); Bharathi Yogaraj, Hyderabad (IN); Yuteng Zhou, Framingham, MA (US); Vibha Patil, Hyderabad (IN); Anusha Vasantala, Hyderabad (IN); Purshottam Vishwakarma, Ashland, MA (US)

(73) Assignee: The MathWorks, Inc., Natick, MA (US)

( * ) Notice: Subject to any disclaimer, the term of this patent is extended or adjusted under 35 U.S.C. 154(b) by 62 days.

(21) Appl. No.: 16/270,082

(22) Filed: Feb. 7, 2019

(65) Prior Publication Data
US 2020/0151088 A1 May 14, 2020

(30) Foreign Application Priority Data

Nov. 14, 2018 (IN) .............................. 201811042759

(51) Int. Cl.
*G06F 11/36* (2006.01)
*G06F 8/41* (2018.01)
(Continued)

(52) U.S. Cl.
CPC ............ *G06F 11/3656* (2013.01); *G06F 5/06* (2013.01); *G06F 8/41* (2013.01); *G06F 15/7807* (2013.01); *G06N 3/063* (2013.01); *G06N 7/005* (2013.01)

(58) Field of Classification Search
CPC .......... G06F 11/3656; G06F 5/06; G06F 8/41; G06F 15/7807; G06N 3/063; G06N 7/005
See application file for complete search history.

(56) References Cited

U.S. PATENT DOCUMENTS 4,686,645 A   8/1987  McCanny et al.
9,817,931 B1  11/2017 Gu et al.
(Continued)

FOREIGN PATENT DOCUMENTS

CN          101639901 A    *  2/2010

OTHER PUBLICATIONS

Zhang et al., Optimizing fpga-based accelerator design for deep convolutional neural networks, 2015, Proceedings of the 2015 ACM/SIGDA international symposium on field-programmable gate arrays (Year: 2015).*

(Continued)

*Primary Examiner* — Matthew M Kim
*Assistant Examiner* — Matthew N Putaraksa
(74) *Attorney, Agent, or Firm* — Cesari and McKenna, LLP; Michael R. Reinemann

(57) ABSTRACT

Systems and methods may configure a programmable logic device to efficiently run a deep learning (DL) network. Architecture code and algorithmic code may be generated. The architecture code may define convolutional and fully connected processor cores structured to run the layers of a Deep Neural Network (DNN). The processor cores may be interconnected by a First In First Out (FIFO) memory. The architecture code may also define stride-efficient memories for implementing convolution. The algorithmic code may include configuration instructions for running the DNN's (Continued)

layers at the processor cores. The algorithmic code may also include a schedule for executing the configuration instructions on the processor cores, for moving network parameters to the processor cores, and for transferring outputs between the layers.

41 Claims, 32 Drawing Sheets

(51) Int. Cl.
   *G06F 5/06* (2006.01)
   *G06N 7/00* (2006.01)
   *G06F 15/78* (2006.01)
   *G06N 3/063* (2006.01)

(56) References Cited

U.S. PATENT DOCUMENTS

| | | | |
|---|---|---|---|
| 10,114,917 | B1 | 10/2018 | Venkataramani et al. |
| 10,157,045 | B2 | 12/2018 | Venkataramani et al. |
| 10,606,651 | B2* | 3/2020 | Burger .................. G06F 9/3885 |
| 2003/0182642 | A1 | 9/2003 | Schubert et al. |
| 2016/0321081 | A1* | 11/2016 | Kim .................. H04L 67/12 |
| 2018/0157471 | A1 | 6/2018 | Venkataramani et al. |
| 2018/0204115 | A1* | 7/2018 | Lee .................. G06N 3/082 |
| 2019/0180441 | A1* | 6/2019 | Peng .................. G16H 50/30 |
| 2019/0286973 | A1* | 9/2019 | Kovvuri .................. G06N 3/063 |
| 2020/0066029 | A1* | 2/2020 | Chen .................. G06T 7/70 |
| 2020/0151549 | A1* | 5/2020 | Hwang .................. G06F 17/15 |
| 2020/0193274 | A1* | 6/2020 | Darvish Rouhani ....................... G06N 3/0454 |

OTHER PUBLICATIONS

CN-101639901-A Machine Translated English, 2009 (Year: 2009).*
Calderón, Humberto, et al., "Soft Core Processors and Embedded Processing: A Survey and Analysis," Conference Proceedings, Nov. 2005, pp. 483-488.
"Efficient Implementation of Neural Network Systems," Solution Brief, OpenCL Efficient Neutral Networks, Intel Corporation, 2016, pp. 1-2.
Fu, Yao, et al., "Deep Learning with INT8 Optimization on Xilinx Devices," XILINX All Programmable, Xilinx, Inc., WP486 (v1.0.1), Apr. 24, 2017, pp. 1-11.
Hao, Yufeng, "A General Neural Network Hardware Architecture on FPGA," Department of Electronic, Electrical and Systems Engineering, University of Birmingham, Birmingham, United Kingdom, Nov. 6, 2017, pp. 1-6.
"Intel® OpenVINO™ with FPGA Support Through the Intel FPGA Deep Learning Acceleration Suite," Solution Brief, Intel Corporation, pp. 1-5.
Sharma, Hardik, et al., "From High-Level Deep Neural Models to FPGAs," IEEE, Appears in the Proceedings of the 49$^{th}$ Annual IEEE/ACM International Symposium on Microarchitecture (MICRO), Taipei, Taiwan, Oct. 15-19, 2016, pp. 1-12.
Shure, Loren, "MATLAB to FPGA using HDL Coder™," Loren on the Art of MATLAB, The MathWorks, Inc., <https://blogs.mathworks.com/loren/2013/04/11/matlab-to-fpga-using-hdl-codertm/>, Apr. 2013, pp. 1-8.
"English Translation of Israeli Office Action," Israeli Application No. 265682, Israel Patent Office (ILPO), dated Mar. 1, 2021, pp. 1-7.
"Israeli Search Report," Israeli Application No. 265682, Israel Patent Office (ILPO), dated Feb. 25, 2021, pp. 1-2.

* cited by examiner

```
bcc bcc = struct with fields:

conv:  [1-1 struct]
      fc:  [1-1 struct]
   fifo1:  [1-1 struct]

bcc.conv ans = struct with fields:

imageNumWLimit: 128
                     layerModeNumWLimit: 8
                              imgWLimit: 227
                       featureSizeLimit: [3-1 double]
                          origOpWLimit: 12
                    resultMemDepthLimit: [3-1 double]
                     inputMemDepthLimit: [3-1 double]
                                   opW: 3
         superConvolutionFirstDimensionLimit: 4
                        strideModeWLimit: 8
                       paddingModeWLimit: 8
                      dilationModeWLimit: 8
                         layerNumWLimit: 32
                    layerConfigNumWLimit: 91
                       debugIDNumWLimit: 65536
                     debugBankNumWLimit: 65536
                      debugCounterWLimit: 32
                     debugDMADepthLimit: 4.2950e+09
                     debugDMAWidthLimit: 128
             Fixdt_0_16_0_To_SingleLatency: 4
                            ProdLatency: 3
                             SumLatency: 3
                             MADLatency: 4
                             CmpLatency: 1
                             ExpLatency: 25
                             LogLatency: 20
                          DivideLatency: 17
                         MemReadLatency: 1
                     DataMemReadLatency: 6
                    DebugMemReadLatency: 5
             DebugMemRegularReadLatency: 2
                        Addr3DTo1DLatency: 5
           ControlLogicInputFeatureAddrIdx: 4
          ControlLogicOutputFeatureAddrIdx: 5
                ControlLogicTileXAddrIdx: 2
                ControlLogicTileYAddrIdx: 3
                         threadNumLimit: 4
                  CONV_TRANS_CTRL_LATENCY: 5
                       opBitWidthLimit: 32
                    opDDRBitWidthLimit: 512
                    opDUTBitWidthLimit: 128
                  supportedProfileEvents: {1-6 cell}
```

FIG. 5A

514 {
```
bcc.conv.supportedProfileEvents ans =

1-6 cell array

{'Processor_Start'}    {'Processor_Done'}    {'Layer_Start'}
    {'Layer_Done'}    {'WeightBurst_Start'}    {'WeightBurst_Done'}
```

516 {
```
bcc.fifo1 ans = struct with fields:

CONV_LIMIT: 9216
         CONV_THREAD_NUM: 4
           FC_THREAD_NUM: 16
                BIN_SIZE: 9
    CONV_TRANS_CTRL_LATENCY: 5
    supportedProfileEvents: {}
```

518 {
```
bcc.fc ans = struct with fields:

layerModeNumWLimit: 8
               matrixSizeLimit: [2-1 double]
             resultMemDepthLimit: 4096
              inputMemDepthLimit: 9216
                  resultNumWLimit: 128
                      fcOpDataType: 'single'
                    layerNumWLimit: 32
              layerConfigNumWLimit: 12
                  debugIDNumWLimit: 65536
                debugBankNumWLimit: 65536
                  debugCounterWLimit: 32
                  debugDMADepthLimit: 4.2950e+09
                  debugDMAWidthLimit: 128
                        MADLatency: 4
                       ProdLatency: 3
                        SumLatency: 3
                        CmpLatency: 1
        Fixdt_0_16_0_To_SingleLatency: 4
                    MemReadLatency: 1
                DataMemReadLatency: 2
               DebugMemReadLatency: 5
          DebugMemRegularReadLatency: 2
        ControlLogicInputFeatureAddrIdx: 1
       ControlLogicOutputFeatureAddrIdx: 3
                  coefFifoSizeLimit: 512
                 opDDRBitWidthLimit: 512
                 opDUTBitWidthLimit: 128
                     threadNumLimit: 16
             supportedProfileEvents: {1-6 cell}
```

FIG. 5B

520 {
bcc.fc.supportedProfileEvents ans =

1-6 cell array

{'Processor_Start'}    {'Processor_Done'}    {'Layer_Start'}
  {'Layer_Done'}    {'WeightBurst_Start'}    {'WeightBurst_Done'}
}

*FIG. 5C*

| Layer Number | Layer Name | Layer Type | Layer Description |
|---|---|---|---|
| 1 | data | Image Input | 227x227x3 images with 'zerocenter' normalization |
| 2 | conv1 | Convolution | 96 11x11x3 convolutions with stride [4 4] and padding [0 0 0 0] |
| 3 | relu1 | ReLU | ReLU |
| 4 | norm1 | Cross Channel Normalization | cross channel normalization with 5 channels per element |
| 5 | pool1 | Max Pooling | 3x3 max pooling with stride [2 2] and padding [0 0 0 0] |
| 6 | conv2 | Convolution | 256 5x5x48 convolutions with stride [1 1] and padding [2 2 2 2] |
| 7 | relu2 | ReLU | ReLU |
| 8 | norm2 | Cross Channel Normalization | cross channel normalization with 5 channels per element |
| 9 | pool2 | Max Pooling | 3x3 max pooling with stride [2 2] and padding [0 0 0 0] |
| 10 | conv3 | Convolution | 384 3x3x256 convolutions with stride [1 1] and padding [1 1 1 1] |
| 11 | relu3 | ReLU | ReLU |
| 12 | conv4 | Convolution | 384 3x3x192 convolutions with stride [1 1] and padding [1 1 1 1] |
| 13 | relu4 | ReLU | ReLU |
| 14 | conv5 | Convolution | 256 3x3x192 convolutions with stride [1 1] and padding [1 1 1 1] |
| 15 | relu5 | ReLU | ReLU |
| 16 | pool5 | Max Pooling | 3x3 max pooling with stride [2 2] and padding [0 0 0 0] |
| 17 | fc6 | Fully Connected | 4096 fully connected layer |
| 18 | relu6 | ReLU | ReLU |
| 19 | fc7 | Fully Connected | 4096 fully connected layer |
| 20 | relu7 | ReLU | ReLU |
| 21 | fc8 | Fully Connected | 1000 fully connected layer |
| 22 | prob | Softmax | softmax |
| 23 | output | Classification Output | |

FIG. 15

SYSTEMS AND METHODS FOR CONFIGURING PROGRAMMABLE LOGIC DEVICES FOR DEEP LEARNING NETWORKS

CROSS-REFERENCE TO RELATED APPLICATIONS

The present application claims priority under 35 U.S.C. § 119(a) to Application Serial No. 201811042759 filed Nov. 14, 2018 at the Indian Patent Office, which application is hereby incorporated by reference in its entirety.

BRIEF DESCRIPTION OF THE DRAWINGS

The description below refers to the accompanying drawings, of which:

FIGS. 5A-C are partial views of an example data structure for basic chip information (bcc) in accordance with one or more embodiments;

FIG. 15 is an example table listing the layers included in the AlexNet Convolutional Neural Network (CNN);

DETAILED DESCRIPTION OF ILLUSTRATIVE EMBODIMENTS

Figure 1:
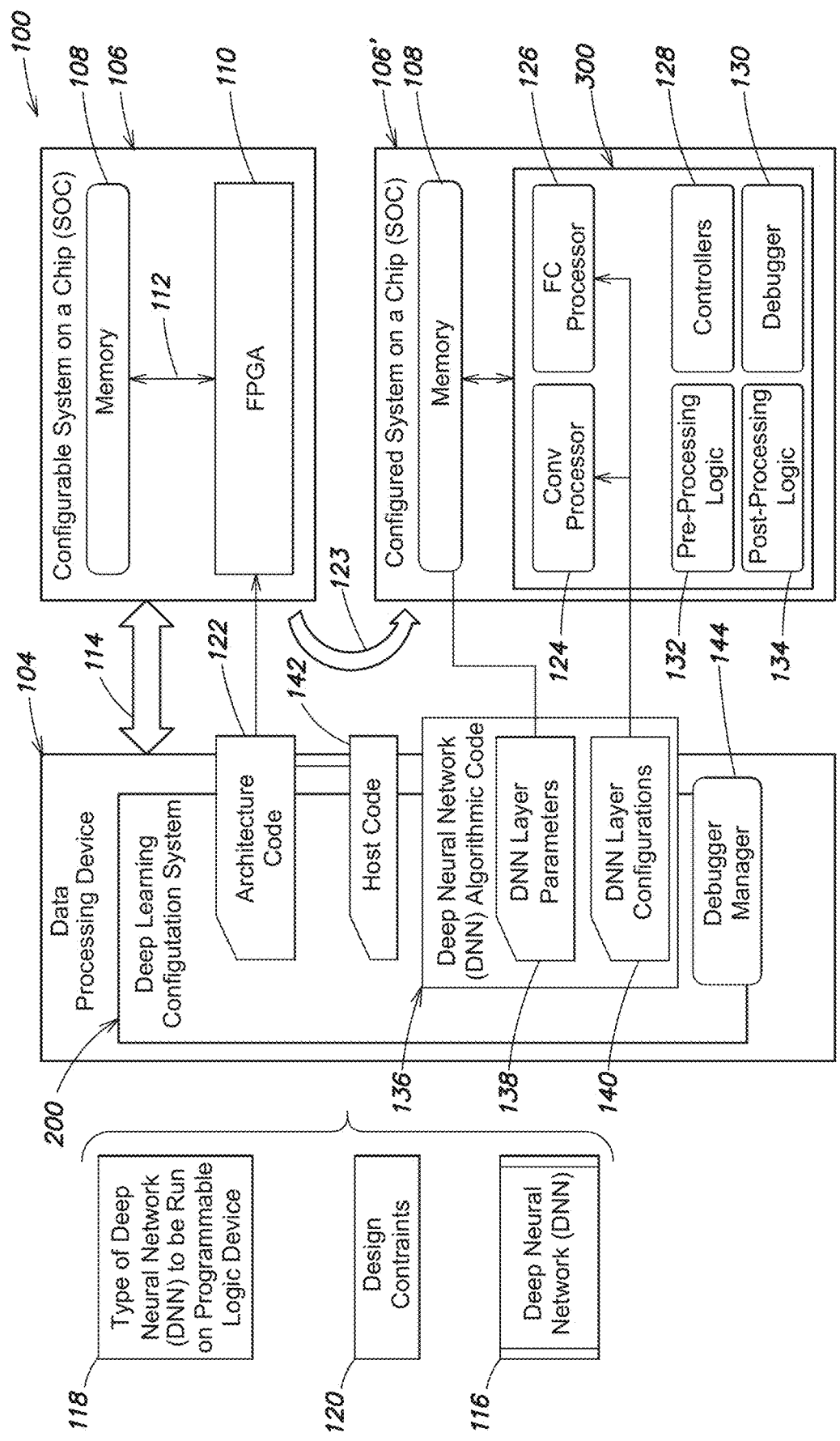
FIG. 1 is a schematic illustration of an example environment in accordance with one or more embodiments.

Deep learning refers to a class of machine learning used to perform complex tasks, such as recommendation engines, object detection, image classification, speech recognition, de-noising signals, segmentation, translation, image/video/text generate, etc. Deep learning is typically performed using a computer program that implements a Deep Neural Network (DNN). A neural network refers to a computer program or algorithm that includes processing nodes arranged in layers. The first layer, also called the input layer, receives the input data to be processed, e.g., classified. The last layer, also called the output layer, provides the classification calculated by the network of the input data. The layers in between the input and output layers are called the hidden layers of the neural network. A DNN refers to a neural network having more than one, and more often many, hidden layers.

A non-exhaustive list of examples of Deep Neural Networks (DNNs) include Convolutional Neural Networks (CNNs or ConvNets), Region-based CNNs (R-CNNs), Residual Neural Networks (ResNets), Fully Convolutional Networks (FCNs), Deconvolutional Neural Networks (DeconvNets), Directed Acyclic Graph (DAG) networks, and Recurrent Neural Networks (RNNs), such as Long Short Term Memory (LSTM), and Generative Adversarial Networks (GANs), among others. DNNs are a widely used tool for implementing deep learning programs used to classify images, text, audio, speech, etc. In some embodiments, the layers of a DNN may include convolutional layers, rectified linear unit (ReLu) layers, max-pooling or average-pooling layers, normalization layers, and fully-connected layers, among others. The architecture of a particular DNN, for example the number and type of layers and their order in the DNN, can vary depending on the application and/or input data being classified.

At least some of the layers of a DNN may include nodes arranged in multiple dimensions. For example, in a four dimensional (4D) DNN, the dimensions may be batch sizes (N), width (W), height (H), and channels (C) or depth. A layer may transform input data to output data, e.g., for processing by the next layer of the DNN. In the example of image data, width may be the width of the image or a portion thereof, height may be the height of the image or a portion thereof, and the channels or depth may correspond to Red, Blue, and Green (RBG) color channels. The nodes of some layers of the CNN, such as the convolutional and pooling layers, are often only connected to a small region of the layer before it, instead of all of the nodes, as in a fully-connected layer.

Examples of the functionality of different types of layers in DNNs are provided as follows. In some implementations, the outputs computed by at least some layers may be collected in a feature map that may be processed by the next layer of the DNN. Convolution layers, for example, may transform an input feature map to an output feature map. Convolution can sometimes be considered as a filter; and convolutional layers can filter an input feature map for information of interest, such as edges of objects within an image. ReLU layers may perform threshold operations, such as setting input values less than zero to zero. Nonetheless, layers implementing other activation functions besides and/or in addition to ReLU may be included in a DNN. Other activation functions include an identity function and non-linear activation functions, such as Sigmoid, Tansig, Tanh, leaky ReLU, and clipped ReLU, among others. A cross channel normalization layer may replace input elements with normalized values. Nonetheless, layers implementing other normalization techniques, such as Local Response Normalization (LRN) and/or Batch normalization, may be included in a DL. Pooling layers may perform downsampling. For example, pooling layers may return the maximum values or the average values of regions of its input. Nonetheless, layers implementing other pooling techniques besides max-pooling and average-pooling may be included. Fully connected layers may combine all of the features, e.g., local information, learned by the previous layers, for example to identify larger patterns in the input data, e.g., input images, as compared to patterns identified in feature maps by convolutional layers.

Some DNNs may include a Softmax layer after the Convolution and Fully Connected layers. A Softmax layer is optional and may be considered as applying post-processing functionality. In some embodiments, a Softmax layer may perform an activation function, for example to generate a value between 0 and 1 for each node of the Softmax layer. For example, for a given input image, the values generated by a Softmax layer may be interpreted as relative measurements of how likely it is that the image falls into each target class. A classification or other layer may follow the Softmax layer. At least some layers of a DNN, such as convolutional layers, may have adjustable network parameters, such as weights and biases.

In some embodiments, a DNN may be in the form of a Directed Acyclic Graph (DAG) network that includes branches and merges in the topology, or a Long Short-Term Memory (LSTM) form of recurrent neural network, among others. It should also be understood that a DNN may include additional and/or other layers. For example, a DNN also may include one or more dropout layers, which may randomly set input elements to zero, and is used during training. A regression layer may be included in a DNN designed to solve regression problems.

After a DNN is created, it may be trained. A DNN may be trained using training data. With supervised training, the training data is labeled with the actual classifications or results. With unsupervised training, the training data is not labeled. Before training, the DNN's adjustable parameters may be set to default or initial values. During training, adjustable network parameters are tuned to particular values. The training data may be run forward through the DNN, e.g., from the input layer to the output layer. Because the tuning of a given network parameter to make a correct prediction may result in a previously correct prediction becoming incorrect, it often takes many iterations and a large set of training data to train a DNN, e.g., to converge on values for the network parameters. Once trained, a DNN may be used to predict input data. For example, the trained DNN may be deployed and run on a deployed system, such as a host system, an embedded platform, a data-center, or a cloud-computing platform or service, among others.

Several frameworks exist to facilitate creating and training DNNs. Exemplary frameworks include: Caffe (Convolutional Architecture for Fast Feature Embedding) originally developed at University of California, Berkeley and now available under open source license through GitHub, Torch also available through GitHub, TensorFlow originally developed for internal use by Google LLC and now available through GitHub, Darknet an open source neural network framework written in C and CUDA by Joseph Redmon, Lightnet a lightweight deep learning framework written in MATLAB available through GitHub, Theano a numerical computation library for Python developed at the University of Montreal, Microsoft Cognitive Toolkit (CNTK) from Microsoft Corp., and the Neural Network Toolbox (NNT) from The MathWorks, Inc., among others.

Once a DNN is trained, it may be deployed, e.g., installed and embedded into a target platform. Target platforms may include single or multi-core Central Processing Units (CPUs), Graphics Processing Units (GPUs), and/or programmable logic devices, such as Field Programmable Gate Arrays (FPGAs). Advantages exist to running DNNs on FPGAs as compared to running them on CPUs and/or GPUs. For example, DNNs may execute faster and require less power when running on FPGAs. Unlike CPUs and GPUs, FPGAs are not encumbered by an Operating System (OS), which can introduce reliability concerns. Instead, FPGAs provide hardware circuits that execute the tasks of a DNN in parallel, resulting in fast, deterministic execution.

FPGAs typically include large numbers of Configurable Logic Blocks (CLBs) that can be configured to perform a wide range of operations. For example, CLBs can be configured as lookup tables in order to perform various logic and/or mathematical operations. As FPGAs have become increasingly used to perform digital signal processing (DSP) operations, FPGA vendors have created FPGA architectures that include specialized programmable logic blocks in addition to CLBs. Because many DSP operations involve a multiply followed by an add, these specialized programmable logic blocks, known as DSP slices or DSP blocks, depending on device vendor, typically include one or more hard multipliers, one or more hard adders/subtractors, one or more hard accumulators, and one or more pipeline registers. Pipeline registers are typically used to isolate signals between the stages of a pipeline. The multipliers, adders and subtractors may be combinatorial circuits, while the accumulators may be adders with feedback that include registers. DSP slices may also include other elements, such as muxes, demuxes, and registers. The FPGAs may also include memory blocks, such as RAM blocks, and the DSP slices may be connected to the RAM blocks through high-speed interconnects. FPGAs may also include clocks and Input/Output (I/O) blocks.

A DNN may have millions of parameters and may perform billions of arithmetic operations to classify input data, such as an image. For example, the well-known AlexNet Convolutional Neural Network (CNN), which classifies images to 1000 categories, has 230 million parameters and performs one and a half billion operations to classify one image of size 227×227×3. Accordingly, configuring a programmable logic device, such as a FPGA, to run all or part of a DNN efficiently, for example in terms of area usage, speed, and power consumption, is a complex and difficult design problem. The memory required to store parameters and activations of a DNN, and the number of operations to be performed may exceed the available resources, e.g., RAM blocks and DSP slices, of even modern, powerful FPGAs.

Briefly, embodiments of the disclosure relate to systems and methods, including workflows, for configuring one or more programmable logic devices, such as Field Programmable Gate Arrays (FPGAs) included in Systems on a Chip (SoCs), to efficiently run a deep learning (DL) network. The systems and methods may generate architecture code defining processors cores and other Intellectual Property (IP) at the SoC, and may compile the DNN to create algorithmic code including instructions for running the DNN on the processor cores. The DNN may correspond to a known type of DNN, and the architecture code may define particular processor cores to be created on the FPGA, where the particular processor cores and other IP are structured to run DNNs of that type. For example, for a series type of DNN, the architecture code may define at least one convolutional (Conv) processor and at least one fully connected (FC) processor that are interconnected by a memory module, such as a First In First Out (FIFO) memory module. The architecture code may also define particular memory structures to support convolutional layers of the DNN, such as one or more stride-efficient memory structures. The algorithmic code may include configuration instructions for running the DNN's layers at the Conv and FC processors and for fetching and storing data. The algorithmic code may also provide a schedule for executing the configuration instructions on the Conv and FC processors for moving parameters, such as weights and biases, into the Conv and FC processors, and for providing the computations output by one layer as input to a next layer. The schedule provided by the algorithmic code may be implemented, e.g., carried out, during execution. The systems and methods may generate the architecture and algorithmic code to meet one or more design constraints set for running the DNN at the SoC.

The systems and methods may estimate the performance of running the DNN on the configured SoC, e.g., during compilation of the DNN. For example, the systems and methods may estimate execution speed, area usage, and/or power consumption of the FPGA. If the estimates are unacceptable for a particular design, e.g., exceed performance thresholds, changes to one or more design constraints may be made. The systems and methods may thus support an iterative design flow that permits a user to explore the effects of trade-offs in design choices to performance estimates.

The systems and methods may further configure the FPGA to include a hardware debugger for debugging the DNN running at the SoC. The hardware debugger may have access to the processor cores and other IP. The hardware debugger may be operated remotely, for example by a debugger manager running on a workstation, to set breakpoints, read data stored at memories of the configured FPGA, such as data computed by the processor cores, and transmit that data to the debugger manager, e.g., for presentation to a user, among other functionality. The hardware debugger also may write data received from the debugger manager to the memories of the configured FPGA, and continue execution of the DNN, e.g., in steps corresponding to the network's layers.

The systems and methods may be device vendor independent. That is, the architecture code for configuring the FPGA, including creating the particular processor cores, may be target device agnostic.

FIG. 1 is a schematic illustration of an example environment 100 in accordance with one or more embodiments. The environment 100 may include a Deep Learning (DL) configuration system 200. In some embodiments, the DL configuration system 200 may be implemented as one or more software application programs running on a data processing device 104, such as a workstation. The environment 100 may further include a configurable system on a chip (CSoC) 106. The CSoC 106 may include at least one memory unit 108 and a programmable logic device 110, such as a Field Programmable Gate Array (FPGA). The memory unit 108 may be a Double Data Rate (DDR) Random Access Memory (RAM) coupled to the programmable logic device 110, for example by an interconnect 112. The memory unit 108 may be referred to as an external memory, e.g., external relative to the FPGA 110. The data processing device 104 may be coupled to the CSoc 106, for example by another interconnect 114.

The DL configuration system 200 may configure the CSoc 106 to run a Deep Learning (DL) network 116. The DNN 116 may be a trained network. The DL configuration system 200 may receive one or more inputs, such as an indication of the type of DNN 116 that is to be run on the CSoC 106, as indicated at 118, and one or more design constraints, as indicated at 120. Exemplary types of DNNs include Series Networks, in which the DNN's layers are arranged one after the other with the output of one layer being the input of the next layer, Directed Acyclic Graph (DAG) networks, in which the network's layers can have inputs from and outputs to multiple layers, and Long Short-Term Memory (LSTM) networks, which are a type of Recurrent Neural Network (RNN) in which one or more of the network's layers, such as a convolutional layer, includes a feedback loop. Exemplary design constraints include information on the resources of the CSoC 106, such as the size and/or speed of the memory unit 108, the number and/or type of hardware elements on the FPGA 110, such as Configurable Logic Blocks (CLBs), Block RAMs (BRAMs), Digital Signal Processor (DSP) slices, Lookup Tables (LUTs), etc., that are available to run the DNN 116, the data type(s) of variables included in the DNN 116, etc.

The DL configuration system 200 may generate architecture code 122 that configures logic elements of the FPGA 110 into processor cores and other IP for running the DNN 166 on the SoC 106. The architecture code 122 may be used to synthesize or configure the SoC 106 as a configured CSoC 106' having a configured programmable logic device 300, as indicated by arrow 123. The processor cores defined by the architecture code 122 may include at least one Convolution (Conv) processor 124 and at least one Fully Connected (FC) processor 126. Other IP defined by the architecture code 122 may include one or more hardware controllers, which are depicted at Controllers 128, and one or more hardware debuggers, such as a Debugger 130, on the configured programmable logic device 300. The Conv processor 124, the FC processor 126, the Controllers 128, and the Debugger 130 may each be created from Configurable Logic Blocks (CLBs), DSP slices, LUTs, BRAMs, and/or other generic or basic hardware elements of the programmable logic device 110. The Conv processor 124 may include one or more memory elements, which may be set up for ping-pong buffering and configured to efficiently support a selected convolution implementation, such as stride-efficient convolution, among others. The FC processor 126 may include one or more memory elements, which may also be set up for ping-pong buffering. In some embodiments, the architecture code 122 may also create pre-processing logic 132, and post-processing logic 134 at the configured programmable logic device 300. Exemplary pre-processing functionality includes resizing input data from a camera to the DNN's input size. Exemplary post-processing functionality includes sorting classification results and report at least some of those results.

In some embodiments, the architecture code 122 may define one or more additional processors or other elements that may be created on the FPGA. For example, in addition to the Conv and FC processors, the architecture code 122 may also define one or more add-concatenate processors, one or more activation processors, and one or more inter-processor communication units, such as a First In First Out (FIFO) memory unit.

The DL configuration system 200 may generate different architecture code 122 defining different processor cores and/or other IP depending on the type 118 of DNN and on one or more of the design constraints 120. For example, through the design constraints 120, a user may specify the available resources of the target FPGA, such as its available memory. The DL configuration system 200 may generate architecture code 122 that conforms to the available memory specified in the design constraint 120, because the Conv processor 124, the FC processor 126, as well as other hardware elements on the FPGA are compile-time configurable. Accordingly, the DL configuration system 200 may generate architecture code 122 such that the maximum feature size processed by the Conv processor 124 is within the available memory of the target FPGA. If a DNN does not have any fully connected (FC) layers, the DL configuration system 200 may omit the FC processor 126 from the architecture code 122, thereby saving resources on the FPGA. The DL configuration system 200 may also configure the sizes the of the Conv and FC processors 124 and 126 so that the loads on them are balanced. The architecture code may be independent of the particular DNN 116. That is, processor cores and IP defined by the architecture code 122 may be used to run any DNN of that same type 118 and with those same one or more design constraints 120.

In some embodiments, the architecture code 122 may be Hardware Description Language (HDL) code. The Conv processor 124 and the FC processor 126 may be soft cores implemented in the HDL code. More specifically, the Conv and FC processors 124, 126 may be defined using FPGA hardware elements, such as Configurable Logic Blocks (CLBs), DSP slices, etc., and thus may be implanted in FPGAs of different designs, such as FPGAs from different vendors, and different types of FPGAs from a given vendor. In other embodiments, the design constraints 120 may indicate a particular FPGA design, e.g., by product name or product family. In this case, the Conv processor 124 and the FC processor 126 may be firm cores that are optimized to the identified FPGA design. More specifically, the DL configuration system 200 may include particular hardware elements of the identified FPGA design, such as vendor-specific IP, in the HDL code implementing the Conv processor 124 and the FC processor 126.

The DL configuration system 200 may also compile the DNN 116 and generate DNN algorithmic code 136 for running the DNN 116 on the configured SoC 106'. The algorithmic code 136 may include DNN layer parameters 138 and DNN layer configurations 140. The DNN layer parameters 138 may include variables utilized by the various layers of the DNN 116, such as weights and biases. The DNN layer configurations 140 may include instructions for running the layers of the DNN 116 at the configured SoC 106'.

In some embodiments, the DL configuration system 200 also may generate host code 142 for execution by the data processing device 104 or another host machine. The host code 142 may include instructions for initializing the configured SoC 106', loading data into the external memory 108, and commanding the configured FPGA 300 to start running the DNN 116. In some embodiments, the host code 142 may also perform one or more layers of the DNN 116. That is, in some cases, not all the layers of the DNN are executed on the configured FPGA. The DNN algorithmic code 136 may schedule one or more layers for execution on the data processing device 104, or on another device. For example, the host code 142 may run a softmax layer of the DNN 116 based on the output computed by the configured SoC 106'. The host code 142 may also run an output layer of the DNN 116, which may present the determined classification for an input, e.g., on a display.

Additionally, the DL configuration system 200 may include a debugger manager 144. The debugger manager 144 may be implemented in the form of an application program running on the data processor device 104. The debugger manager 144 may include functionality for interfacing with and operating the hardware debugger 130 on the configured FPGA 300. The debugger manager 144 may provide a Graphical User Interface (GUI) and/or a Command Line Interface (CLI) through which a user may interface with the debugger manager 144. As described, the hardware debugger 130 under the control of the debugger manager 144 may set breakpoints and retrieve data or other information generated at the configured FPGA 300 at run-time. The hardware debugger 130 may transmit this information to the debugger manager 144, e.g., for logging and/or presentation to the user at the GUI and/or CLI. The debugger manager 144 may run on or be accessible via other data processing devices besides the data processing device 104.

During execution of the DNN 116 on the configured CSoC 106', the Controllers 128 may manage the movement of input data from the memory unit 108 into the configured programmable logic device 300. The Controllers 128 also may manage the movement of the DNN layer parameters 138, e.g., weights and biases, loaded into the memory unit 108 into the Conv processor 124. The Controllers 128 also may manage the loading of the DNN layer configurations 140 into the Conv and FC processors 124 and 126, and the transfer of data among layers of the DNN 116. The functionality implemented by the Controllers 128 may be specified in the algorithmic code 136. The output of the DNN 116, e.g., the classifications determined for the input data, as computed at the configured CSoC 106' may be provided to the data processing device 104.

Exemplary SoCs include the Zynq family of SoCs from Xilinx, Inc. of San Jose, Calif., and the Stratix, Arria, and Cyclone series of SoC FPGAs from Intel Corp. of Santa Clara, Calif.

The interconnect 112 may be configured to operate in accordance with the Advanced eXtensible Interface (AXI), which is part of the ARM Advanced Microcontroller Bus Architecture (AMBA). Nonetheless, other interfaces and/or communication protocols may be used.

In some embodiments, the DNN 116, which may be referred to as a deployable network, may be an object of the Series Network Class created in the Neural Network Toolbox, which supports Object Oriented Programming (OOP), from The MathWorks. A SeriesNetwork object includes the layers of a trained network. The SeriesNetwork object may be created in the MATLAB environment or imported as a SeriesNetwork object from another environment. A trained DNN may be imported from Caffe, Torch, TensorFlow, Darknet, Lightnet, Theano, Microsoft Cognitive Toolkit (CNTK), or another environment as a MATLAB SeriesNetwork object. For example, a pre-trained convolutional neural network model from Caffe may be imported as a SeriesNetwork object using the MATLAB command 'importCaffeNetwork'. Other importers may be used to convert DNNs from other frameworks to the MATLAB framework, e.g., a SeriesNetwork object, a Directed Acyclic Graph (DAG), a MATLAB file, a .prototxt file, etc.

Figure 2:
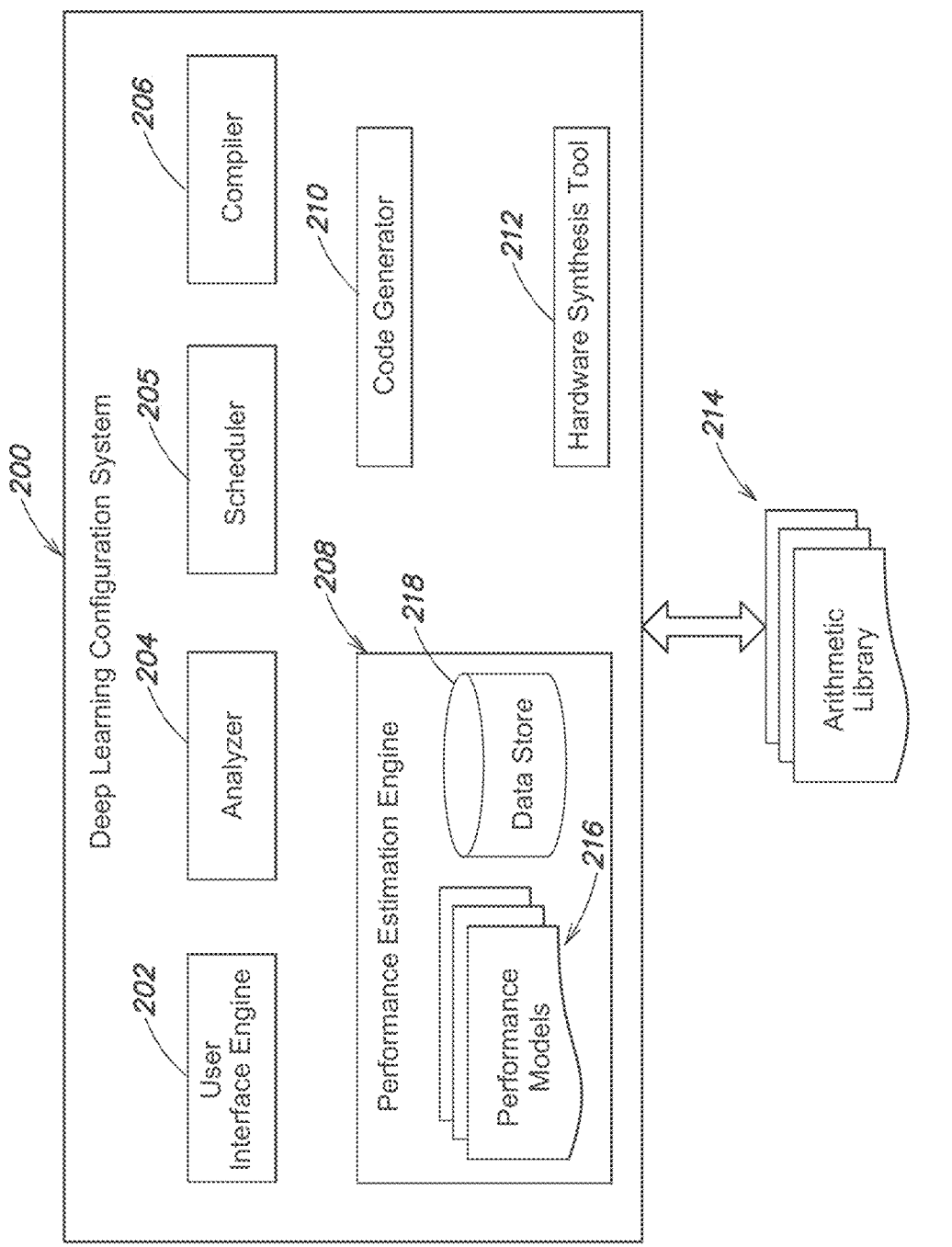
FIG. 2 is a schematic illustration of an example of the Deep Learning (DL) configuration system in accordance with one or more embodiments.

FIG. 2 is a schematic illustration of an example of the DL configuration system 200 in accordance with one or more embodiments. The DL configuration system 200 may include a User Interface (UI) engine 202, an analyzer 204, a scheduler 205, a compiler 206, a performance estimation engine 208, and a code generator 210. In some embodiments, the DL configuration system 200 may include or have access to one or more hardware synthesis tools indicated at 212. In some embodiments, the code generator 210 and/or the hardware synthesis tool 212 may be external to the DL configuration system 200, but in communication with one or more of its components. The DL configuration system 200 also may have access to one or more arithmetic libraries or packages, as indicated at 214. The arithmetic libraries 214 may contain hardware implementations of operations, such as adders, subtractors, multipliers, counters, shifters, etc. The hardware implementations may be optimized for use with particular programmable logic devices, and included in HDL code, such as VHDL code. Exemplary arithmetic libraries include the Intel FPGA IP library from Intel Corp. of Santa Clara, Calif., the HDL Floating Point Operations from The MathWorks, Inc., the Xilinx Math Intellectual Property from Xilinx, Inc. of San Jose, Calif., the LabVIEW FPGA Floating-Point library from National Instruments, Corp. of Austin, Tex., and the Variable Precision Floating Point library (VFLOAT) from Northeastern University of Boston, Mass. The performance estimation engine 208 may include performance models as indicated at 216 and at least one data store 218.

The UI engine 202 may create and present one or more User Interfaces (UIs), such as Graphical User Interfaces (GUIs) and/or Command Line Interfaces (CLIs), on a display of a workstation, terminal, or other data processing device. The UIs may be operated by a user to initiate various tasks, such as inputting information. The analyzer 204 may analyze the DNN 116 and determine the number, type, and sequence of layers included in the DNN 116, the size of input data, filters, and output utilized or computed by the DNN 116, the data types of variables included in the DNN 116, etc. The scheduler 205 may determine a schedule, e.g., a static and a dynamic schedule for running the DNN 116 at the configured SoC 106'. For example, execution of the layers of the DNN 116 may be statically scheduled, while accesses to the external memory 108, which may be non-deterministic, may be dynamically scheduled. The compiler 206 may compile the DNN 116 and the code generator 210 may generate code, for example from the compiled DNN 116. The performance estimation engine 208 may compute performance metrics, such as speed, area usage, and power consumption for the DNN 116. The hardware synthesis tool 212 may synthesize the SoC 106. For example, it may produce the configured SoC 106' including the configured FPGA 300.

In some embodiments, one or more of the User Interface (UI) engine 202, the analyzer 204, the scheduler 205, the compiler 206, the performance estimation engine 208, the code generator 210, and the hardware synthesis tool 212 may be implemented through one or more software modules or libraries containing program instructions pertaining to the methods described herein. The software modules may be stored in a memory, such as a main memory, a persistent memory and/or a computer readable media, of a workstation, server, or other data processing machine or device, such as the data processing device 104, and executed by one or more processors. Other computer readable media may also be used to store and execute these program instructions, such as non-transitory computer readable media, including optical, magnetic, or magneto-optical media. In another embodiment, the User Interface (UI) engine 202, the analyzer 204, the scheduler 205, the compiler 206, the performance estimation engine 208, the code generator 210, and the hardware synthesis tool 212 and/or one or more of the parts thereof may comprise hardware registers and combinatorial logic configured and arranged to produce sequential logic circuits that implement the methods described herein. In alternative embodiments, various combinations of software and hardware, including firmware, may be utilized to implement the described methods.

Figure 3:
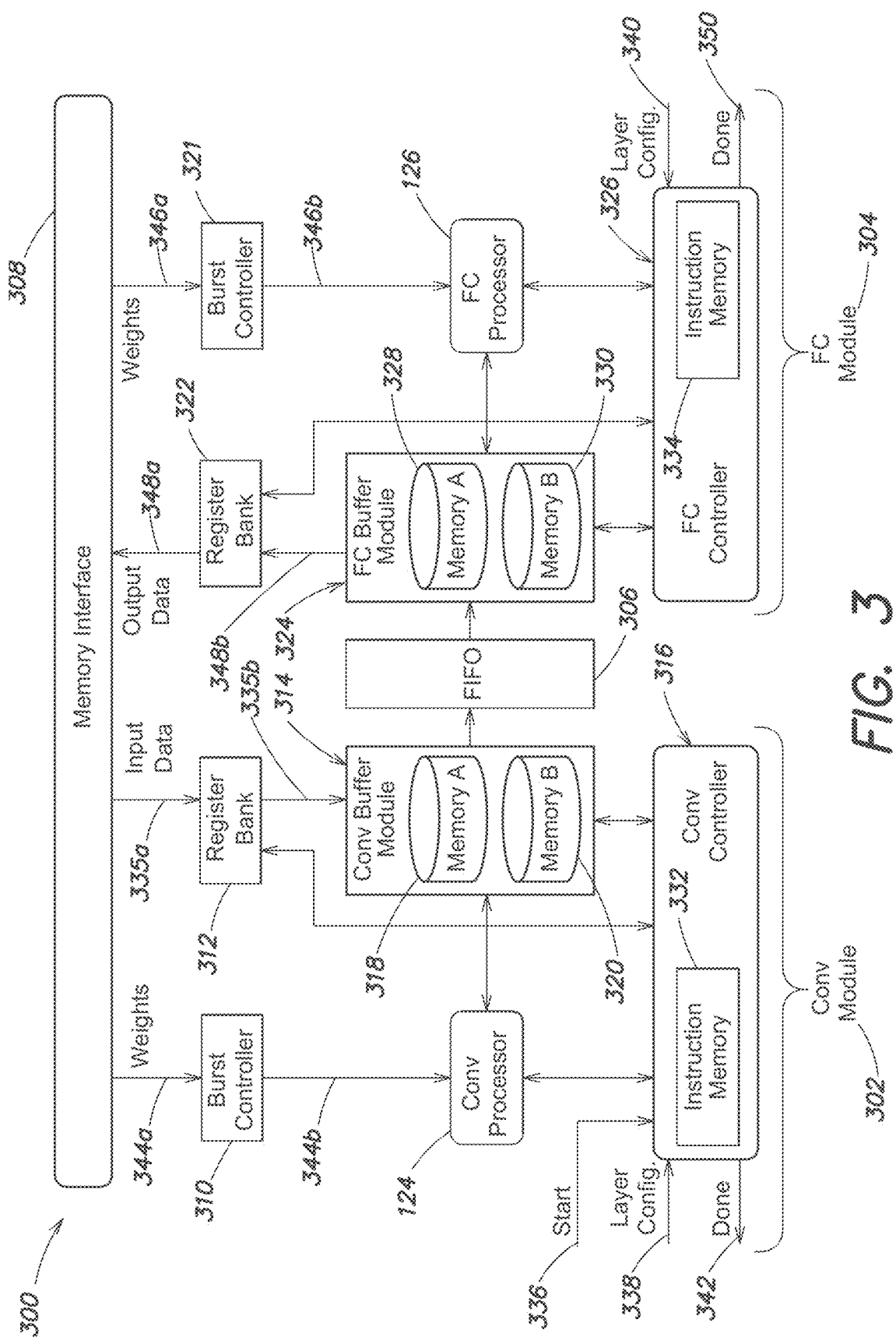
FIG. 3 is a schematic illustration of an example of a portion of a configured programmable logic device in accordance with one or more embodiments.

FIG. 3 is a schematic illustration of an example of a portion of the configured FPGA 300 in accordance with one or more embodiments. The configured FPGA 300 may include a convolution (conv) module 302 and a fully connected (FC) module 304, which may be interconnected through a memory 306, which may be a First In First Out (FIFO) memory. The configured FPGA 300 also may include a memory interface 308.

The conv module 302 may include a burst controller 310, a register bank 312, the conv processor 124, a convolution (conv) buffer module 314, and a convolution (conv) controller 316. The conv buffer module 314 may include two memory units 318 and 320 labeled 'Memory A' and 'Memory B'. The FC module 304 may include a burst controller 321, a register bank 322, a fully connected (FC) buffer module 324, the FC processor 126, and a fully connected (FC) controller 326. The FC buffer module 324 may include two memory units 328 and 330 labeled 'Memory A' and 'Memory B'. The conv controller 316 and the FC controller 326 may each include instruction memories indicated at 332 and 334. As described, during runtime, the configured FPGA 300 may receive a Start command, such as Start command 336, which may be received at the conv controller 316. Instructions indicated at Layer Configurations 338 and 340 may be loaded into the instruction memories 332 and 334, for example for operating the Conv and FC processors 124 and 126 to perform the network layers. When processing by the Conv module 302 is complete, a Done signal may be sent, such as Done signal 342 from the conv controller 316. When processing by the FC module 304 is complete, a Done signal may be sent, such as Done signal 350 from the FC controller 326. As described, the burst controllers 310 and 321 may interface from the Conv and FC processors 124 and 126 to the memory interface 308.

The memory interface 308 may implement a shared memory channel. In some embodiments, the memory interface 308 may implement the AXI interface protocol. For example, one or more of the Cony controller 316, the burst controller 310, the Cony processor 124, the register bank 312, the FC controller 326, the burst controller 321, the FC processor 126, and the register back 322 may be master devices of the AXI interface protocol and the external memory 108 may be a slave device. A master device may initiate communication, such as reading/writing data, and the slave fulfils the master's requests.

In some embodiments, the memory units 318 and 320 of the buffer module 314 may be configured for ping-pong buffering and/or the memory units 328 and 330 of the buffer module 324 may be configured for ping-pong buffering. The present disclosure supports other buffering techniques besides ping-pong buffering. In other embodiments, intermediate data may be buffered at the external memory 108. For example, intermediate data, such as intermediate results, may be buffered at the external memory 108 when one or more of the buffer modules on the FPGA are not large enough to hold the intermediate data, such as for an implementation of the You Only Look Once (YOLO) detection system. In this case, the DNN configuration system 200 may generate and include in the architecture code 122 logic for accessing one or more parts of the external memory 108 allocated to buffer intermediate data. For a DAG network, the logic may be configured to retrieve data from multiple parts of the external memory 108 and load the data into multiple input buffers configured on the FPGA.

It should be understood that FIG. 3 is for illustrative purposes, and that the configured programmable logic device 300 may include additional or other hardware elements.

Generating Architecture Code

Figure 4:
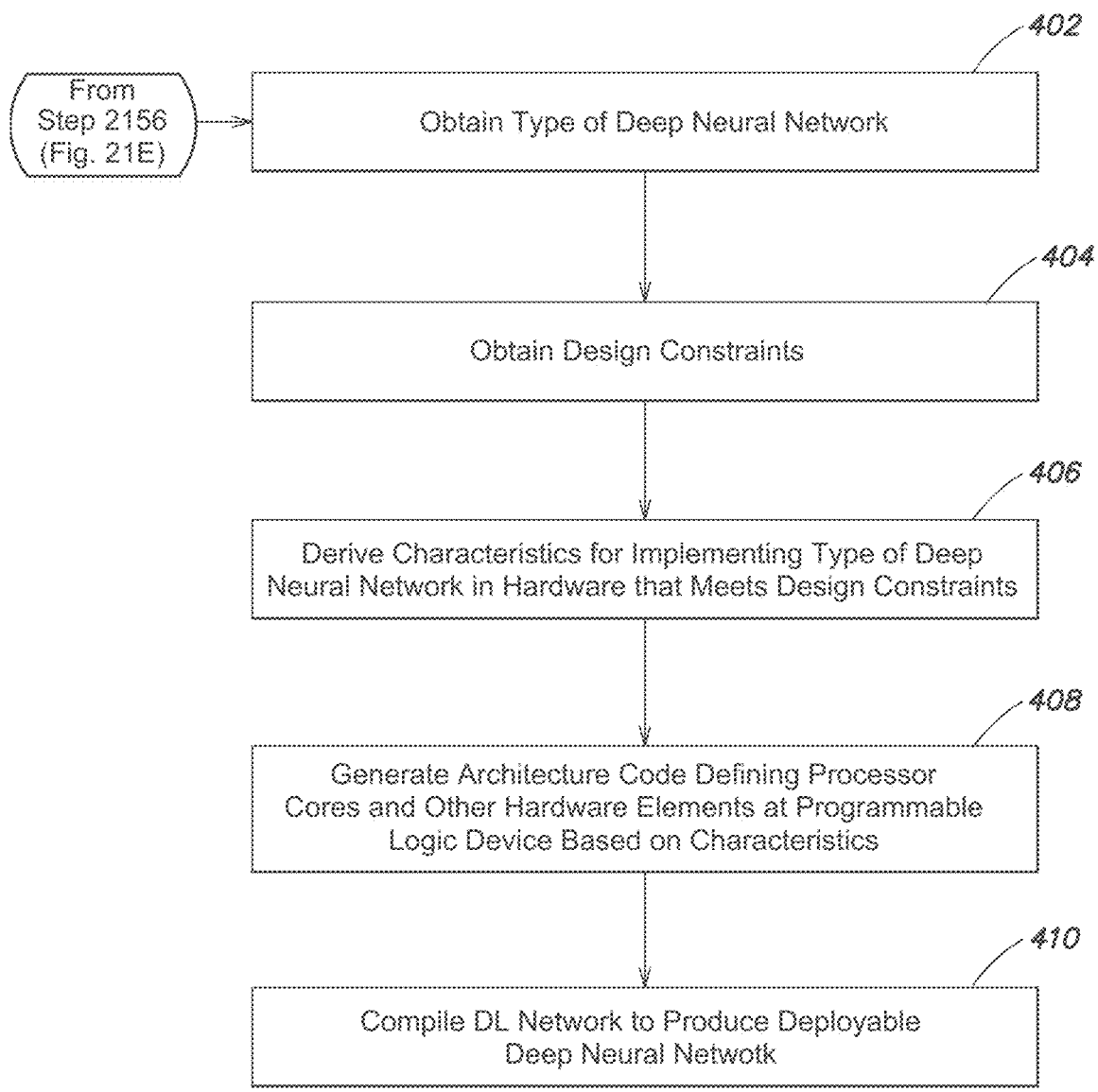
FIG. 4 is a flow diagram of an example method for generating architecture code defining processor cores for running a Deep Neural Network (DNN) on programmable hardware in accordance with one or more embodiments.

FIG. 4 is a flow diagram of an example method for generating the architecture code 122 for configuring the System on a Chip (SoC) 106 in accordance with one or more embodiments. It should be understood that the flow diagrams described herein, such as the flow diagram of FIG. 4, are representative, and intended for illustrative purposes only. In some embodiments, one or more steps may be omitted, one or more steps may be optionally performed, multiple steps described individually may be combined or consolidated into a single step, additional steps may be added, the order of steps may be changed, one or more sequences among steps as illustrated by the arrows may be omitted, and/or the steps may be sub-divided into separate flows.

The type of DNN 116 may be obtained by the DL configuration system 200, as indicated at step 402. The design constraints 120 also may be obtained by the DL configuration system 200, as indicated at step 404. Steps 402 and 404 may be independent. Exemplary design constraints 120 may include information regarding the particular SoC on which the DNN 116 is to be run, information regarding the DNN 116, and one or more algorithmic choices or options. Exemplary information regarding the SoC may include one or more of:

1. resources of the memory unit 108, such as size and/or bandwidth;
2. resources of the FPGA 110, such as number of CLBs, DSP slices, LUTs, and BRAMs;
3. vendor, product family, and/or product name for the SoC 106, the memory unit 108, and/or the FPGA 110 from which resources of the memory unit 108 and/or the FPGA 110 may be derived; and
4. one or more design goals or budgets, such as speed goals, e.g., latency and throughput, area usage goals or budgets, such as a key resource budget, such as number of available CLBs, DSP slices, BRAMS, LUTs, bandwidth of the interconnect 112, etc.

Exemplary information regarding the DNN 116 may include:

1. data types of variables of the DNN 116, such as input data, weights, biases, and intermediate results between layers, e.g., activations.
2. hyperparameters. Exemplary hyperparameters for a DNN may include:
   the number of channels of input data, and output of each layer;
   for convolutional layers—number of filters, filter size, stride, and zero-padding;
   for pooling layers—window size and window stride; and
   for fully connected layers—number of nodes.

Exemplary algorithmic choices or options may include:

1. convolution implementation, such as stride-efficient, as described herein, direct convolver with line buffer, e.g., McWhirter-McCanny Systolic Array, or Winograd.
2. the arithmetic library 214 for use implementing the DNN 116.

The analyzer 204 of FIG. 2 may derive characteristics for implementing the DNN type 118 in programmable hardware, as indicated at step 406. The characteristics may also be derived to meet one or more of the design constraints, as also indicated at step 406. The characteristics may be attributes whose derived values define a hardware design space.

In some embodiments, the DL configuration system 200 may include an Application Programming Interface (API), and the UI engine 202 may provide a Command Line Interface (CLI) through which a user may access the API to indicate to the analyzer 204 the type of DNN and/or the design constraints 120. An exemplary API command is:

wfObj=dnnfpga.Workflow('network', snet, 'constraints', csts)

This API command declares a function named 'dnnfpga.Workflow', where the inputs to the function are 'network' is a DNN object, such as the MATLAB SeriesNetwork object. It may indicate the type of DNN and the computational graph, including the network's layers, sizes, and data types;

snet is the DNN 116, such as a SeriesNetwork object;

'constraints' is an object describing at least a portion of the design constraints 120; and csts is a design constraint object, which may include information such as speed/area requirements and device/board information.

An exemplary API command for calling the dnfpga.Workflow function is:

bcc=wfObj.propose( );

where 'bcc', which stands for basic chip information, is the output from calling the 'propose' function. The return value 'bcc' includes values derived for attributes of the proposed SoC architecture, such as attributes of the input data, attributes of the Cony module 302, attributes of the FC module 304, attributes of the FIFO 306, attributes of the debugger 130, etc. In some embodiments, the bcc may also include values derived for attributes of the memory 308 and the interconnect 112.

The analyzer 204 may perform the functionality defined by the 'propose' function, which may include design space exploration to derive the values of the bcc. For example, the propose function may include one or more cost functions to derive values of the bcc that satisfy the design constraints 120 and can run the type of DNN 118. The functionality of the propose function includes analyzing the reference network to determine the limits to make sure the proposed hardware architecture is big enough. The propose function may use performance, area, and device requirements from the constraints input, as hard limitations, such as memory read latency. The propose function may also use options such as floating-point libraries and/or library options. The propose function may use this information to solve an area/performance estimation function set up as a cost function to derive the values for the bcc parameters.

FIGS. 5A-C are partial views of an example data structure for basic chip information (bcc) 500 in accordance with one or more embodiments. The bcc 500 may be implemented as a data model expressed as a collection of 2-tuple elements in the form <attribute name, value>. In some embodiments, the elements of the bcc 500 may be organized by SoC architecture component, e.g., Conv module 302, FC module 304, etc., and for each such architecture component, the elements of the bcc 500 may include a group of Limit elements, a group Latency elements, and a group of elements regarding the functional capability of the components. The group of Limit elements may include values for attributes such as input image size limits, e.g., 227×227 pixels, convolution kernel size limits, e.g., 12×12, atomic convolution kernel size, e.g., 3×3, etc. The group of Latency elements may include values for attributes such as the latency for a single floating-point add operation, e.g., 3 cycles, which may be a function of the selected arithmetic library 214. The group of elements regarding functional capability may include values for attributes concerning data collection by the performance estimation engine 208, such as hardware implemented event taps.

For example, the bcc 500 may include a region 502 (FIG. 5A), noting that the bcc 500 has fields for the Conv processor 124, the FC processor 126, and the FIFO 306. The bcc 500 may include another region 504 (FIG. 5A) listing the fields for the Conv processor 124, which may include limit, latency, and functional capability elements. For example, the region 504 includes an 'imageNumWLimit' element 506, which defines the maximum number of images handled in one batch. This element 506 is set to 128. A user may send multiple images together to the configured FPGA 300 to benefit from pipelining. An 'imgWLimit' element 508 defines the maximum size of an activation. This element 508 is set to 227. These limit elements define underlying hardware elements included in the configured FPGA, such as image counter size—ranging from 0 to 127, and the width of the address to access input images. The region 504 further includes a 'ProdLatency' element 510, which defines the number of cycles to complete a product operation. This element 510 is set to 3. A 'MemReadLatency' element 512 defines the number of cycles needed for a memory read and is set to one.

The bcc 500 may include a further region 514 (FIG. 5B) listing the profile events supported by the Conv processor 124. The bcc 500 may include yet another region 516 listing the fields for the FIFO 306. The bcc 500 may include still another region 518 listing the fields for the FC processor 126, which may include limit, latency, and functional capability elements. The bcc 500 also may include a still further region 520 (FIG. 5C) listing the profile events supported by the FC processor 126.

The bcc 500 of FIGS. 5A-C includes attribute values derived for running the AlexNet network. As described, the code generator 210 generates the architecture code 122, and customizes hardware elements defined in the architecture code 122 to meet the limits, latencies, and functional capabilities set forth in the bcc 500 derived for the DNN.

It should be understood that other and/or additional APIs and/or User Interfaces (UIs) may be used including other CLIs or Graphical User Interfaces (GUIs).

The code generator 210 may utilize the bcc to generate the architecture code 122, as indicated at step 408. The architecture code 122 may be in the form of Hardware Description Language (HDL) code and may specify the structure of the Conv module 302, the FC module 304, the FIFO 306, and the debugger 130. It may also specify the number of threads, the memory sizes, the number of pipeline stages, register/counter sizes, data types, and other processor details. The code generator 210 may determine and the architecture code 122 may specify the ports of the FPGA 110 to be used by the Conv and FC processors 124 and 126 and/or other elements to access the external memory 108. The AXI protocol supports multiple masters, and the processors 124 and 126 and/or other elements that access the external memory 108 may each be designated as masters to access the external memory 108, e.g., the slave, simultaneously. In some embodiments, the code generator 210 may utilize predefined bus arbitrator logic included on the FPGA 110 to buffer and sequentialize the physical access. In other embodiments, the code generator 210 may define arbitration logic, which may be included in the architecture code 122. Each processor 124 and 126 and/or other elements may be given individual master interface access to the external memory 108, e.g., to access weights and activations independently. In this way, explicit scheduling of external memory accesses among the Conv and FC processors 124 and 126 and other elements accessing the external memory 108 may be avoided.

The architecture code 122 may be Hardware Description Language (HDL) code, such as VHDL code, Verilog code, SystemC code, etc. The architecture code 122 may be vendor and device independent.

In some embodiments, the DL configuration system 200 may next compile the DNN 116 to produce a deployable network for run-time execution at the configured SoC 106', as indicated at step 410.

Synthesizing the Hardware

The hardware synthesis tool 212 may utilize the architecture code 122 to configure the FPGA 110 to produce the configured FPGA 300, as indicated at step 410. During hardware synthesis, the hardware synthesis tool 212 may translate the architecture code 122 (in HDL), and synthesize the Conv module 302, the FC module 304, the FIFO 306, and the debugger 130 utilizing particular CLBs, DSP slices, BRAMs, LUTs, and other hardware elements of a vendor and device specific FPGA.

Compiling the DL Network

FIGS. 21A-E are partial views of a flow diagram of an example method for compiling the DNN 116 to produce a deployable network for run-time execution at the configured SoC 106' in accordance with one or more embodiments.

The compiler 206 may access the DNN 116, as indicated at step 2102. As described, the DNN 116 may be a Series-Network object. The compiler 206 also may access the derived hardware characteristics, e.g., the bcc, as indicated at step 2104. As described, the compiler 206 may use information from the DNN 116 and from the bcc to produce the deployable network, which may include instructions for running the network's layers at the configured SoC 106', including hardware elements of the configured FPGA 300. In some embodiments, the compiler 206 may additionally or alternatively access the architecture code 122 and utilize information in the architecture code 122 to produce the deployable network. For example, the compiler 206 may take as inputs any of the DNN 116, the bcc, or the architecture code 122 to produce a deployable network that can be run on the configured SoC 106'. Unlike compiling a deep learning network for execution by a Central Processing Unit, which has a well-understood architecture, the compiler 206 may utilize information from the DNN 116, the bcc, and/or the architecture code 122 to customize the deployable network to run on the configured SoC 106'. The compiler 206 may produce deployable networks for different hardware architectures, e.g., having various arrangements and combinations of soft core processors and/or other hardware elements. The hardware architecture of the FPGA 300 is configurable and the compiler 206 may receive a particular configuration of the FPGA 300 as one of its inputs and compile the DNN so that it runs on the particular configuration of the FPGA 300. For example, the compiler 206 may produce a deployable network for one hardware architecture that includes one Conv processor and one FC processor. The compiler 206 also may produce another deployable network for another hardware architecture that includes more than one Conv processor and more than one FC processor, a further deployable network for a further hardware architecture that includes only a Conv processor, and so on. These deployable networks may be based on the same or on different DNNs. Prior compilers may be limited to compiling DNNs for a single processor architecture.

The compiling of the DNN 116 may include several stages. For example, it may include memory allocation, static scheduling, and convolution implementation.

The scheduler 205 and compiler 206 may work together to produce the deployable network. For example, the compiler 206 may generate one or more Intermediate Representations (IRs) of the DNN 116. The IRs may be stored in-memory. The IRs may be directed graphs of nodes and edges representing the DNN 116. The scheduler 205 may transform one or more of the IRs to schedule instructions and/or operations implementing the DNN 116. In some embodiments, the scheduler 205 may be a part of the compiler 206.

Memory Allocation

The compiler 206 may allocate one or more portions, e.g., buffers, of the external memory 108 to store variables defined by the DNN 116, such as weights and biases used in convolutional and fully connected layers, as indicated at step 2106. The compiler 206 may also allocate one or more portions of the external memory 108 to store input data to be processed by the DNN 116 running on the configured SoC 106', as indicated at step 2108. The compiler 206 may generate and include respective memory allocation instructions in the DNN algorithmic code 136.

Static Scheduling

The scheduler 205 may map the layers of the DNN 116 to either the Conv processor 124 or the FC processor 126 for execution, as indicated at step 2110. The scheduler 205 may map convolutional layers of the DNN 116 and layers adjacent to the convolutional layers, such as adjacent activation, pooling, and normalization layers, to the Conv processor 124. The scheduler 205 may map fully connected layers of the DNN 116 and layers adjacent to the fully connected layers to the FC processor 126. The scheduler 205 may fuse, e.g., combine, adjacent layers of the DNN, as indicated at step 2112 (FIG. 21B), which is an optional step. For example, to improve processing speed, the Conv processor 124 and the FC processor 126 may each be structured to compute a ReLU or other point-to-point operation immediately following a convolution operation or a matrix-vector multiplication operation as a single operation or transaction.

Accordingly, when a convolution→ReLU pattern or FC→ReLU pattern appears in the DNN 116, the scheduler 205 may fuse those two layers to take advantage of the improvement in processing speed achieved by the structure of the Conv and FC processors 124 and 126. For example, the scheduler 205 may fuse a convolutional layer followed by a ReLU layer. The scheduler 205 may also fuse a convolutional layer followed by a pooling layer. In some embodiments, the Conv and FC processors 124 and 126 may be configured to include ReLU units. For more complicated activation functions, such as tanh, the scheduler 205 may choose to split its execution between the Conv and FC processors 124 and 126.

The configuring of the FPGA 110 to include Conv and FC processors 124 and 126, among other hardware components, and the mapping and scheduling of the layers of the DNN 116 to these Conv and FC processors 124 and 126 provides several advantages. For example, by including two configured soft processors at the FPGA 300, faster execution of the DNN 116 can be achieved as compared to executing the DNN 116 on an FPGA having other configurations, such as a single soft processor.

The compiler 206 may generate an instruction for executing each of the DNN's layers at the respective processor, e.g., the Conv or FC processors 124 and 126, as indicated at step 2114. These instructions may constitute the DNN layer configurations 140.

For example, a convolutional layer of the DNN 116 may compute $$O = I * W + B$$

where, represents the output features,

I represents the input features,

W represents the filter (also referred to as a convolution kernel), and

B represents the bias.

The highest level scheduling for this convolutional layer may be:

For each input features I[i]
  For each output features O[o]
    O[o]=O[o]+Convolve(W[i,o], I[i])

O may be a three dimensional (3D) matrix of size(x,y,i), such as (227,227,3) for AlexNet input.

I may be another 3D matrix of size(x1,y1, o), such as (55,55,96) for AlexNet's first conv layer output.

W may be a four dimensional (4D) matrix of size (kx, ky, i, o), such as (11, 11, 3, 96) for an AlexNet filter.

I[i] represents the ith input feature of size (x, y), such as 227×227.

O[o] represents the oth output feature of size (x, y), such as 55×55.

W[i,o] represents a two dimensional (2D) filter of size of (kx, ky), such as (11×11) for AlexNet.

Convolve(W[i,o], I[i]) represents a 2D convolution to calculate a partial result of O[o], i.e. the impact from I[i] on O[o].

For a convolution operation that fits in the Conv processor 124, the compiler 206 may break the kernel into 3×3 pieces, if necessary, since the Conv processor 124 is configured to perform a 3×3 atomic convolution operation. For example, a 5×5 kernel may be broken into four 3×3 pieces after padding one column and row with zeros to make it 6×6. W becomes (W_00, W_01)
(W_10, W_11)

where W_ij are 3×3. The convolution operation with W may be scheduled as the following nested loop at compile-time.

for i=0 to 1
   for j=0 to 1
     O=I*W_ij+B

Since the i,j order is predefined, this loop may be simplified as for each weight piece
   conv(3×3 W_ij, I)

The compiler 206 may also reorganize data to match scheduling. In this example, the weights may be reorganized so that the data in one W_ij piece are in one continuous block, although originally W is stored in either row or column major order across the entire matrix.

In order to execute the nested loop efficiently (as this is the bottom of the scheduling and running most frequently), the compiler 206 may generate a deployable network such that the hardware is configured to perform the following:

1. Fetch input feature I and output feature O (for accumulation) and first piece of weights.
2. Start computation and start weight fetching for the next piece of weight at the same time.
3. After the first piece of weight is done with computation and the second piece is loaded, go to step 2.

The scheduler 205 may determine a sequence, e.g., a schedule, for invoking the layer configurations in order to run the DNN 116 at the configured SoC 106', as indicated at step 2116. The sequence may match the order of layers set out in the DNN 116, and will be reflected in the algorithmic code 136.

The sizes of the memory units 318 and 320 of the Conv buffer module 314 and the sizes of the memory units 328 and 330 of the FC buffer module 324 may be specified, e.g., by the user, in the design constraints 120 or their sizes may be derived by the DL configuration system 200 from one or more of the design constraints, as indicated at step 2118. The scheduler 205 may schedule the outputs of layers mapped to the Conv processor 124 to be stored at particular memory units 318 and 320 of the Conv buffer module 314, as indicated at step 2120. For example, input data to be processed by a convolutional layer may be scheduled for storage at memory unit A 318, while the output computed by the convolutional layer may be scheduled for storage in memory unit B 320. This output may then be scheduled as the input to the next layer of the DNN 116 following this convolutional layer.

The compiler 206 may determine whether the input to a given layer, such as a convolutional layer, or the output computed by the layer is larger than the memories of the buffer modules, as indicated at step 2122. If so, the scheduler 205 may store the input and/or output in the external memory, as also indicated at step 2122. The scheduler 205 may break up the input and/or output into sub-regions that fit in at least one of the memories of the buffer modules. The scheduler 205 may determine a schedule for retrieving these sub-regions and loading them in the scheduled memories of the buffer modules.

Figure 21A:
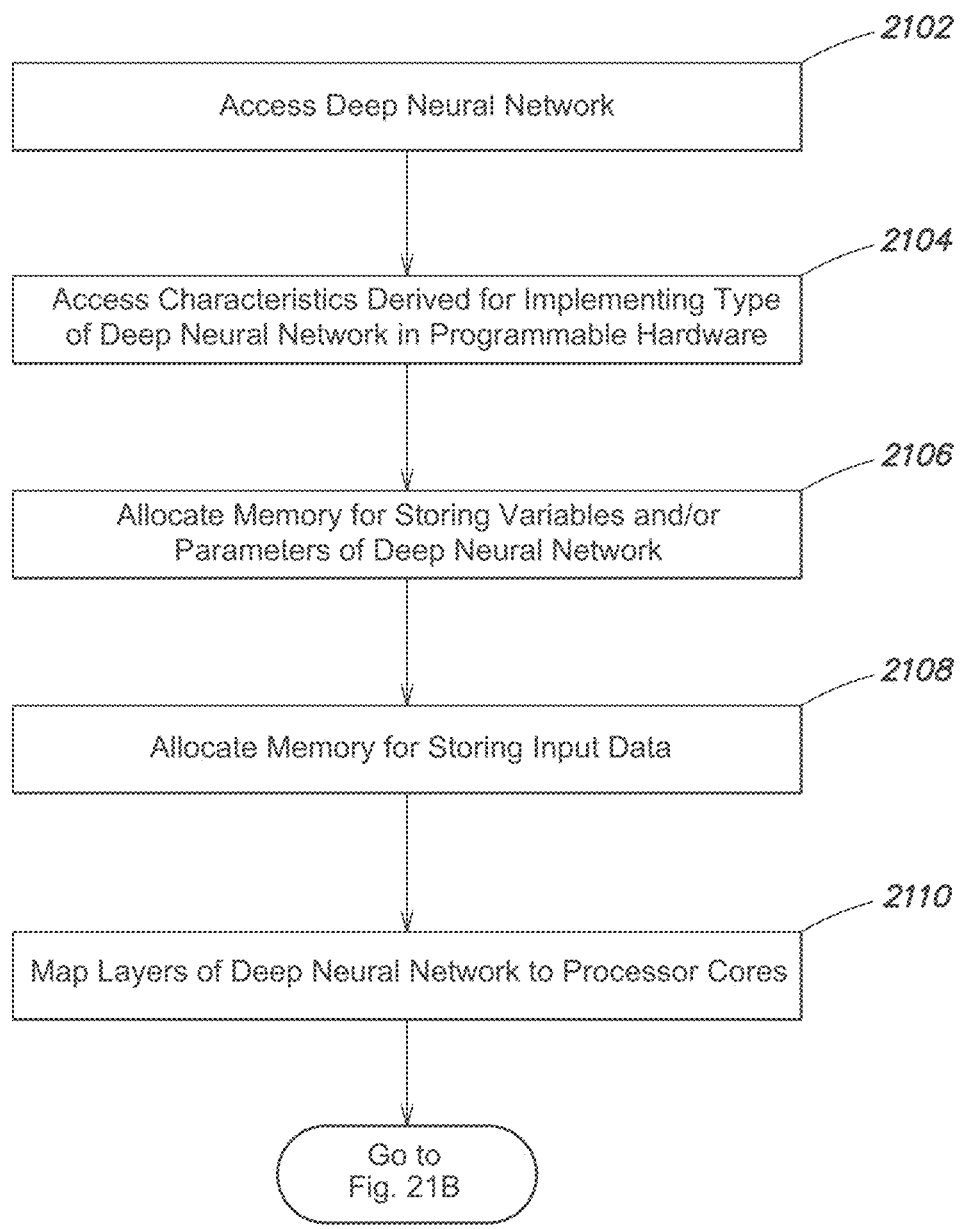
FIGS. 21A-E are partial views of a flow diagram of an example method for compiling a deep learning network to run on a configured System on a Chip (SoC) in accordance with one or more embodiments.
Figure 21B:
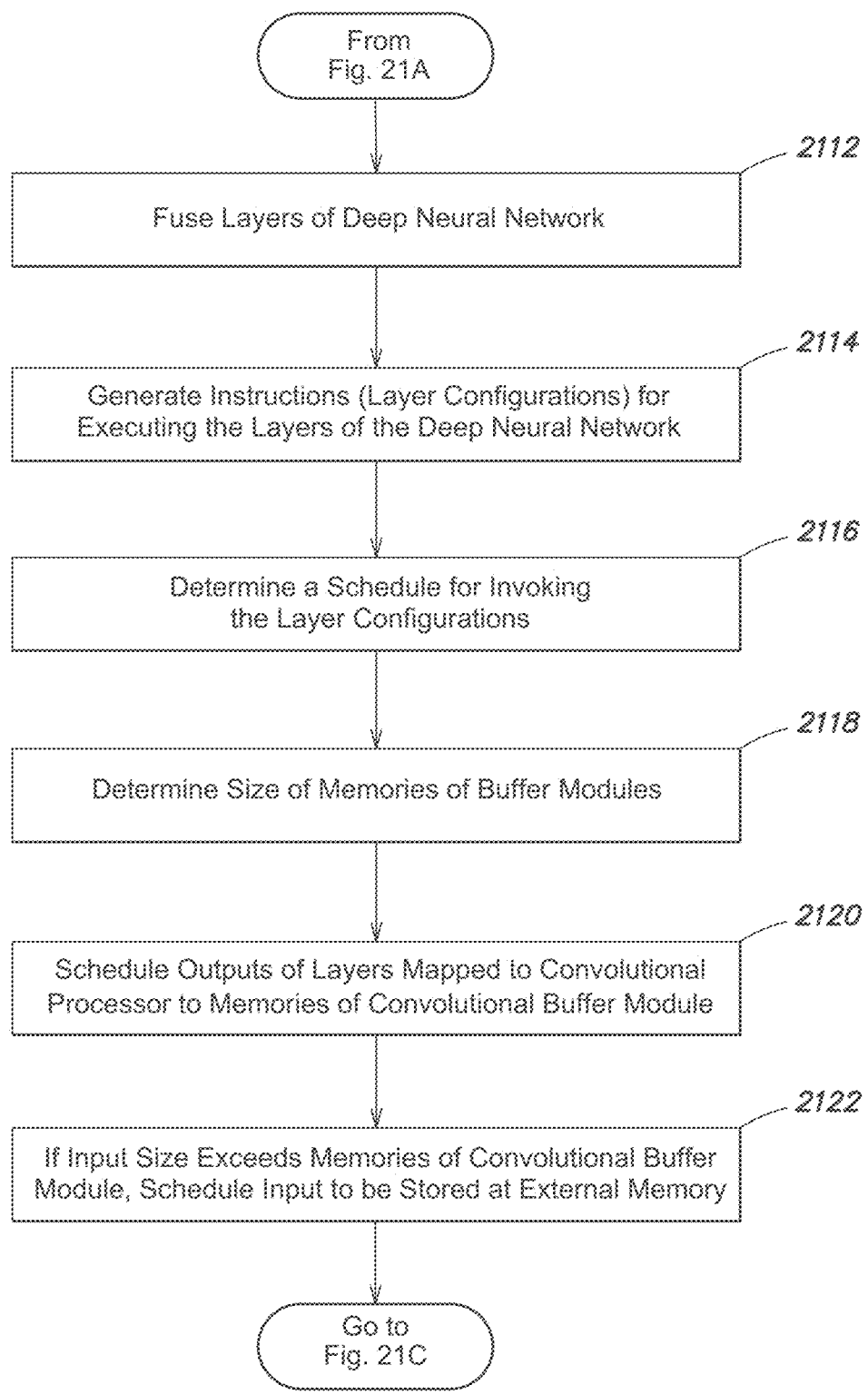
Figure 21C:
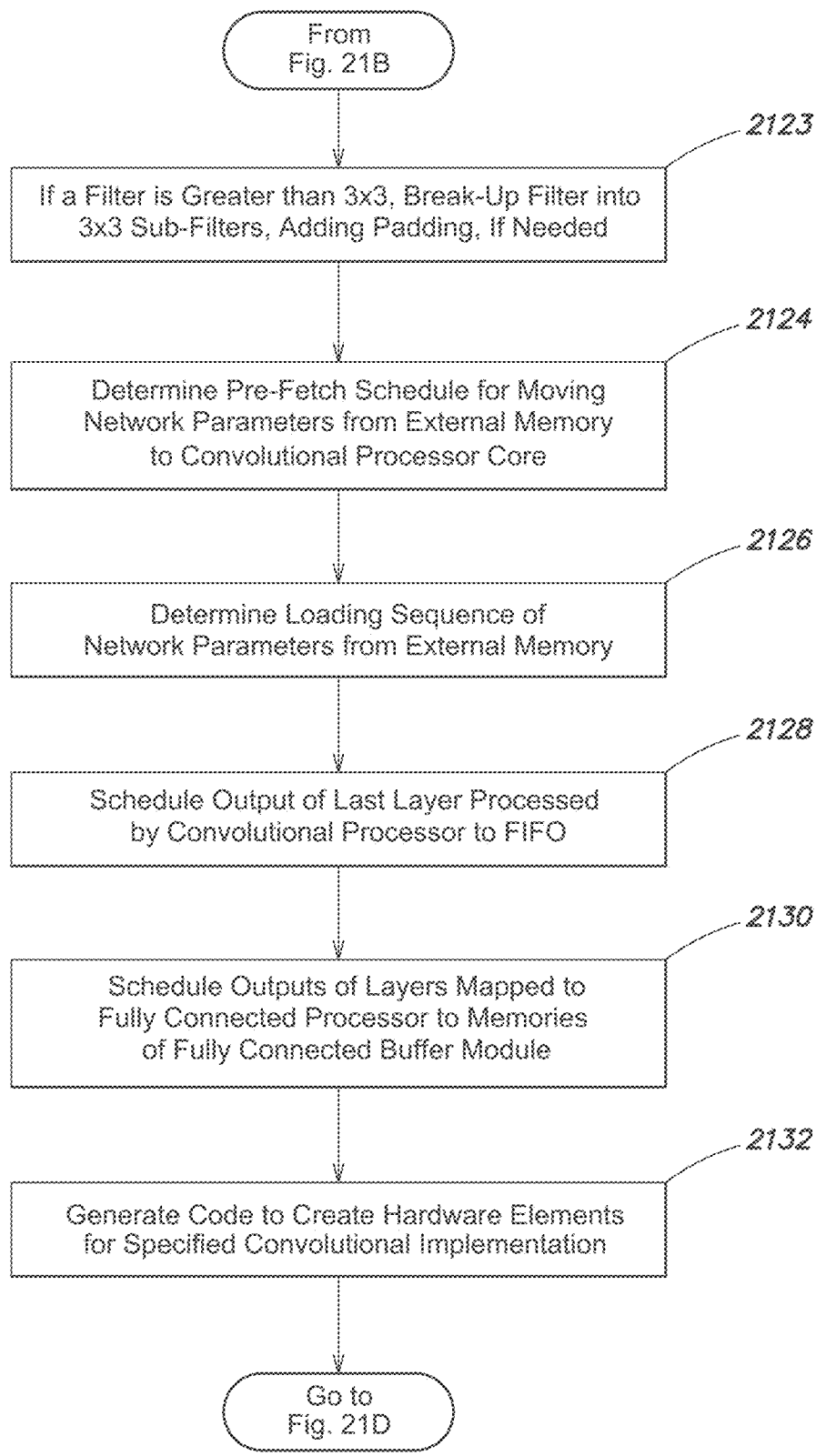

The scheduler 205 may break-up filters used by convolutional layers of the DNN 116 that are greater than 3×3 into multiple 3×3 sub-filters, as indicated at step 2123 (FIG. 21C). The scheduler 205 add padding to one or more of the 3×3 sub-filter, as necessary, as also indicated at step 2123.

The scheduler 205 may determine a pre-fetch schedule for moving the set of weights defining a filter from the external memory 108 to the Conv processor 124, as indicated at step 2124. For example, while one set of weights are being used by the Conv processor 124, a next set of weights, for example for another filter, may be scheduled to be pre-fetched from external memory 108.

Figure 17:
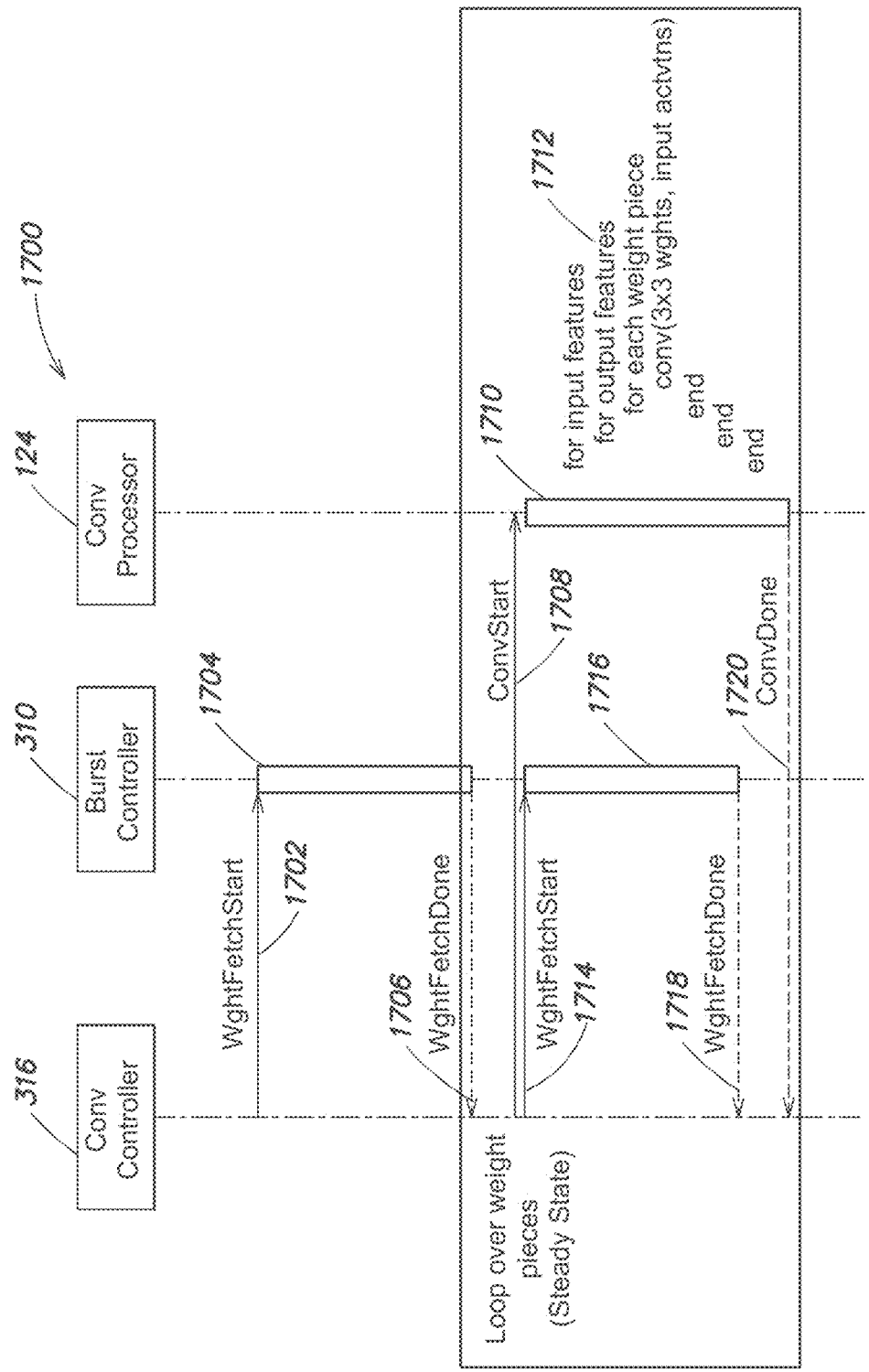
FIG. 17 is a schematic illustration of an example timing sequence in accordance with one or more embodiments.

FIG. 17 is a schematic illustration of an example timing sequence 1700 in accordance with one or more embodiments. In some embodiments, the algorithmic code 136 as generated by the compiler 206 may include a sequence of commands or operations as described in FIG. 17. The Conv controller 316 may signal the Burst controller 310 to fetch the weights for executing a convolutional layer, as indicated by the WghtFetchStart command 1702. The Burst controller 310 may fetch the weights from the external memory 108, as indicated at 1704. The fetching of weights from the external memory 108, as indicated at 1704, is non-deterministic. The Burst controller 310 may signal the Conv controller 316 when the weights have been fetched, as indicated by the WghtFetchDone command 1706. The Conv controller 316 may signal the Conv processor 124 to start the convolution, as indicated by the ConyStart command 1708. The Conv processor 124 may perform the convolution operation, as indicated by 1710 and as described in the nested loop 1712. The Conv controller 316 may signal the Burst controller 310 to fetch the next set of weights for the next convolutional layer, as indicated by the next Wght-FetchStart command 1714. The Burst controller 310 may fetch the next set of weights from the external memory 108, as indicated at 1716, which again is non-deterministic. The Burst controller 310 may signal the Conv controller 316 when the next set of weights have been fetched, as indicated by the next WghtFetchDone command 1718. Finally, the Conv processor 124 may signal the Conv controller 316 when the convolution is finished, as indicated by the ConvDone command 1720.

In addition, the scheduler 205 may determine a schedule for loading the weights from the external memory 108 to the configured FPGA 300 in burst mode, as indicated at step 2126. For example, the scheduler 205 may reorganize the weights in sequential order to support burst mode, and to reduce random access to the external memory 108. Continuing with the above example, the weights may be reorganized so that the data in one W_ij piece is in one continuous block, although originally W is stored in either row or column major order across the entire matrix.

It may not be possible to know, in advance, how long it will take the configured FPGA 300 to receive data from the external memory 108 in response to any particular request. For example, the Conv and FC processors 124 and 126 as well as other hardware components may be fetching data, e.g., weights, from the external memory 108 simultaneously and independently of each other. Because the transferring of data between the external memory 108 and the configured FPGA 300 is not deterministic, the compiler 206 may generate instructions for the Conv and FC processors 124 and 126 to generate run-time control signals to synchronize the Conv processor 124 at run-time. For example, one instruction may execute a conv layer in the Conv processor 124. The execution of the conv layer, however, takes many cycles. The instruction may direct the Conv processor 124 to emit for example a Done signal, e.g., to the inter-processor FIFO 306 when the execution finishes. The Conv processor 124 may be blocked from performing another operation/layer until the data has been moved, e.g., into the FIFO 306 or the Conv buffer module 314.

The schedule of computations to be performed at the Conv and FC processors 124 and 126 may be in a static order determined by the scheduler 205. Even though accesses to the memory 108 may be non-deterministic, and may thus introduce uncertainty, the computations scheduled for the Conv and FC processors 124 and 126 may still have a fixed sequential order, e.g., a static order.

The scheduling for pooling layers may be similar to the scheduling of convolutional layers, although pooling does not use weights.

The scheduler 205 may schedule the output from the last layer mapped to the Conv processor 124 to be stored at the FIFO 306, as indicated at step 2128. The compiler 206 and/or the scheduler 205 may generate instructions for the Conv and FC processors 124 and 126 to issue run-time control signals to synchronize the FIFO 306 with the Conv and FC processors 124 and 126, which may act as producers and consumers relative to the FIFO 306. For example, the scheduler 205 may implement a valid/ready/full protocol at the FIFO 306.

The scheduler 205 may schedule the outputs of layers mapped to the FC processor 126 to be stored at one of the memory units 328 and 330 of the FC buffer module 324, as indicated at step 2130.

Convolution Implementation

The code generator 210 may generate and include in the architecture code 122 code to configure hardware elements, such as BRAMs, for the specific convolution implementation, as indicated at step 2132. The particular convolution implementation may be specified in the design constraints 120. As described, the design constraints 120 may indicate a particular type of convolution implementation, such as stride-efficient, McWhirter-McCanny systolic array, as described in U.S. Pat. No. 4,686,645, Winograd, or Fast Fourier Transform (FFT), among others. The code generator 210 may create a different structure of the Conv processor 124 and the memory units 318 and 320 depending on the particular convolution implementation.

Suppose the design constraints 120 selected the stride-efficient implementation. The code generator 210 may generate code to implement each of the memory units 318 and 320 from nine memory bins, which may be arranged in a 3×3 array. Each memory bin of the 3×3 array may be one or more BRAMs.

Figure 6:
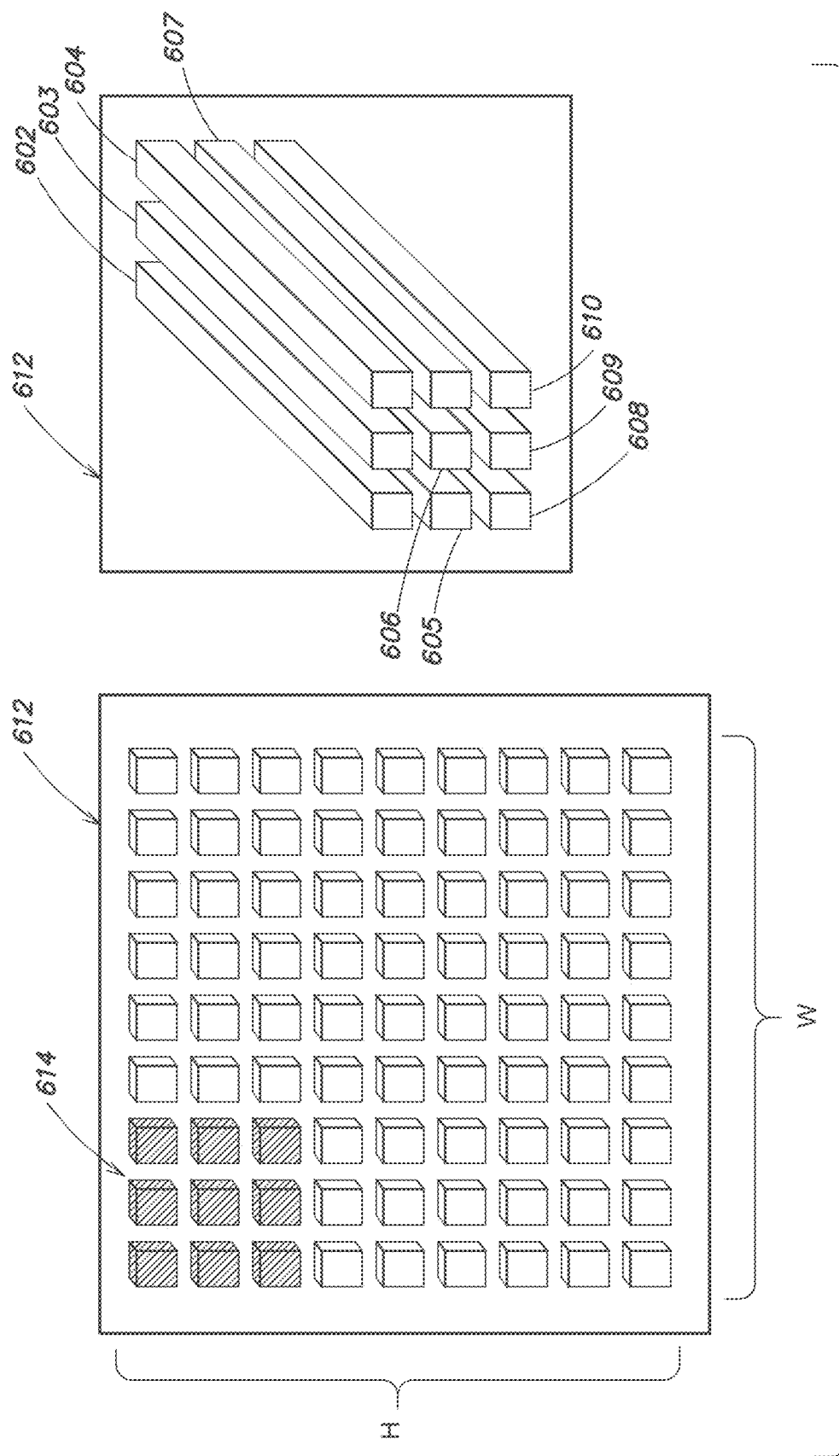
FIG. 6 is a schematic illustration of an example of a stride-efficient memory structure in accordance with one or more embodiments.

FIG. 6 is a schematic illustration of an example of a stride-efficient memory structure 600 in accordance with one or more embodiments. The stride-efficient memory structure 600 may include nine memory bins 602-610 arranged in a 3×3 array. Each memory bin 602-610 may be configured to store a plurality of data elements sequentially. For example, each memory bin 602-610 may include a series of storage locations, e.g., 1, 2, 3, etc. The scheduler 205 may determine a schedule for loading input data 612 into the stride-efficient memory structure 600 to support efficient convolution by the Conv processor 124. The input data 612 may be an array of data elements having a height (H) and a width (W). As illustrated, the input data 612 has a height of nine data elements and a width of nine data elements, e.g., nine rows and nine columns. For a first convolutional layer of the DNN 116, the input data may be an image and the data elements may be pixels. For other convolutional layers, the data may be convolutional layer data.

Figure 21D:
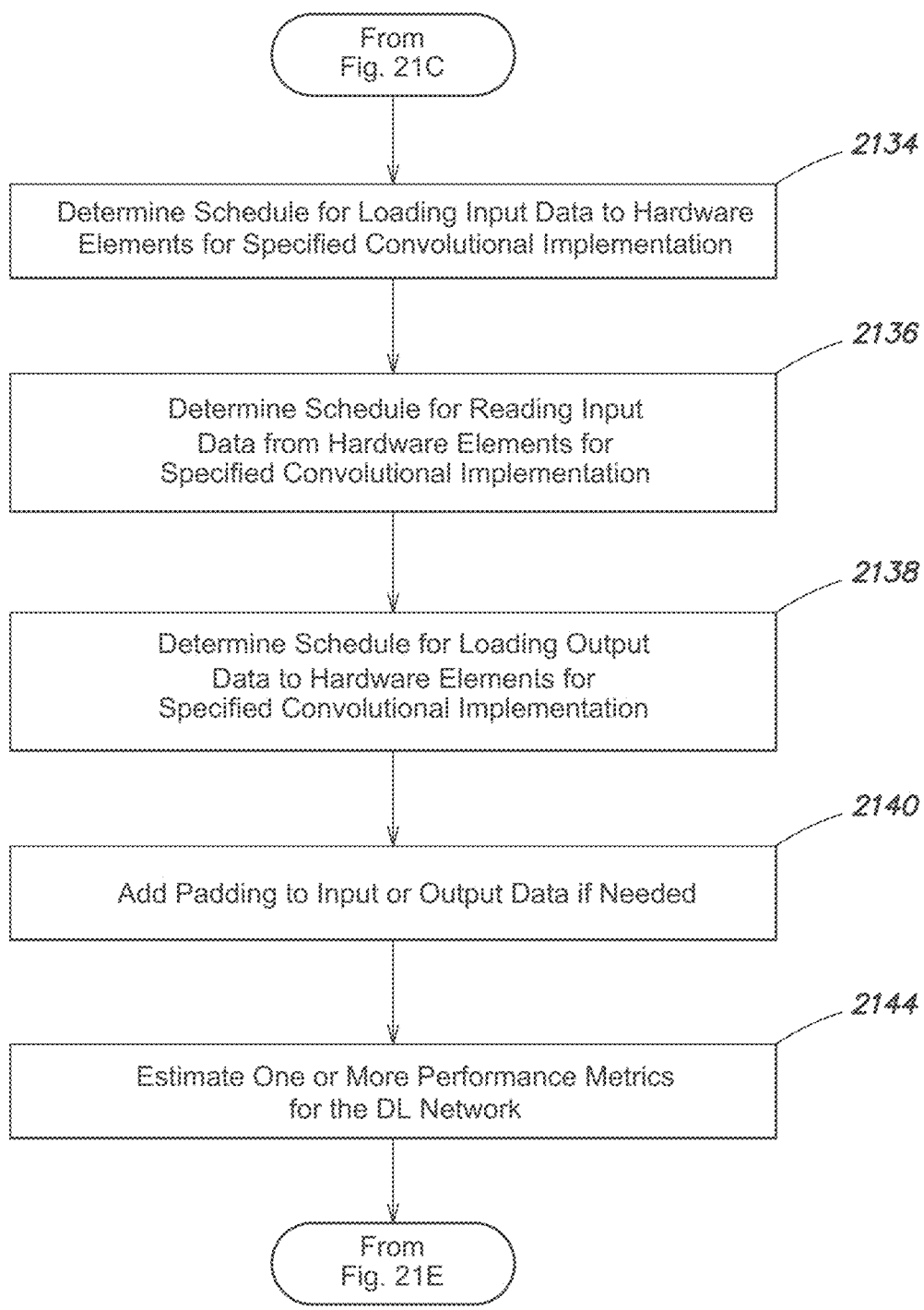

The scheduler 205 may determine a schedule for loading the input data 612 into the stride-efficient memory structure 600, as indicated at step 2134 (FIG. 21D).

Figure 7:
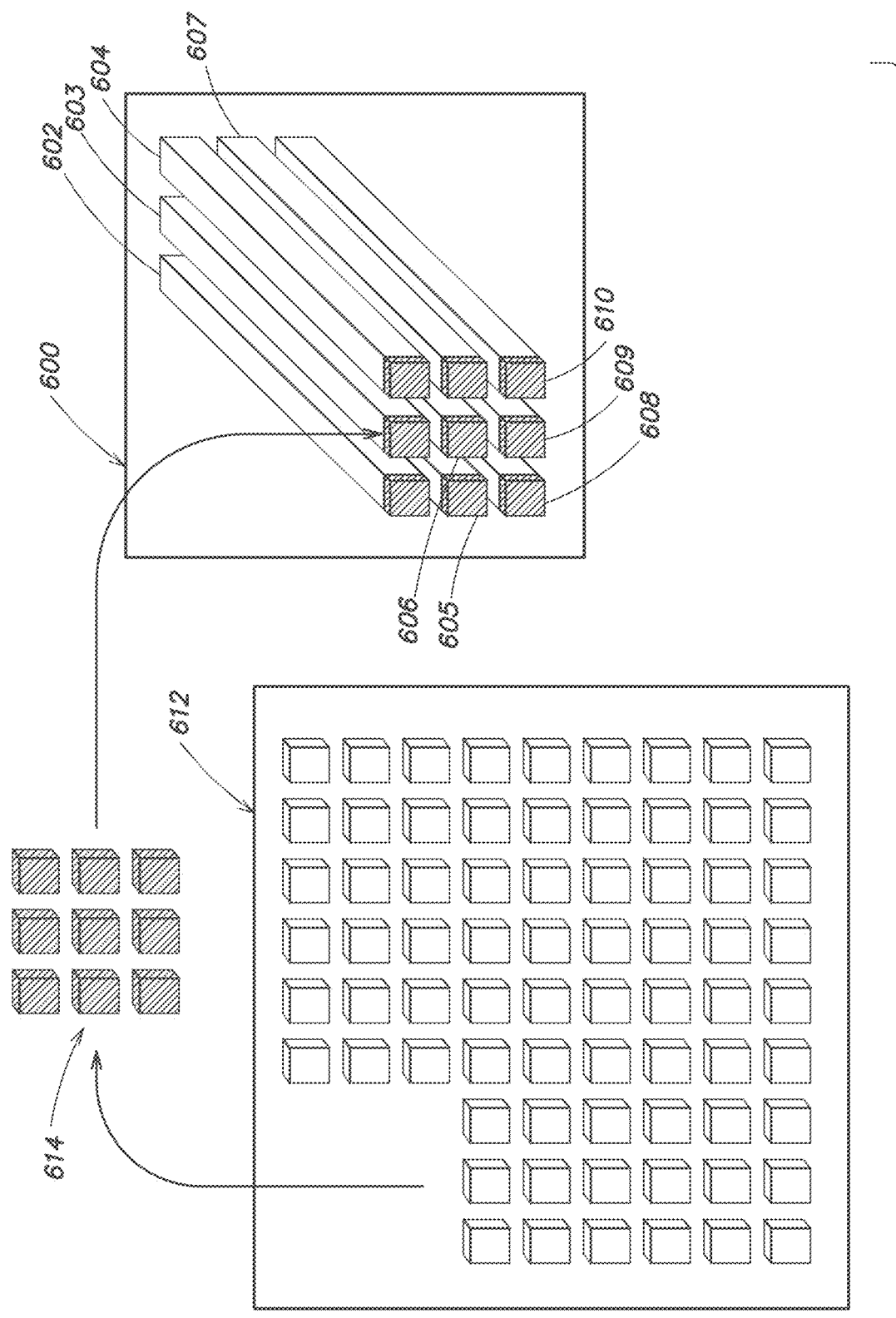
FIG. 7 is a schematic illustration of an example partial schedule for loading a stride-efficient memory structure in accordance with one or more embodiments.
Figure 8:
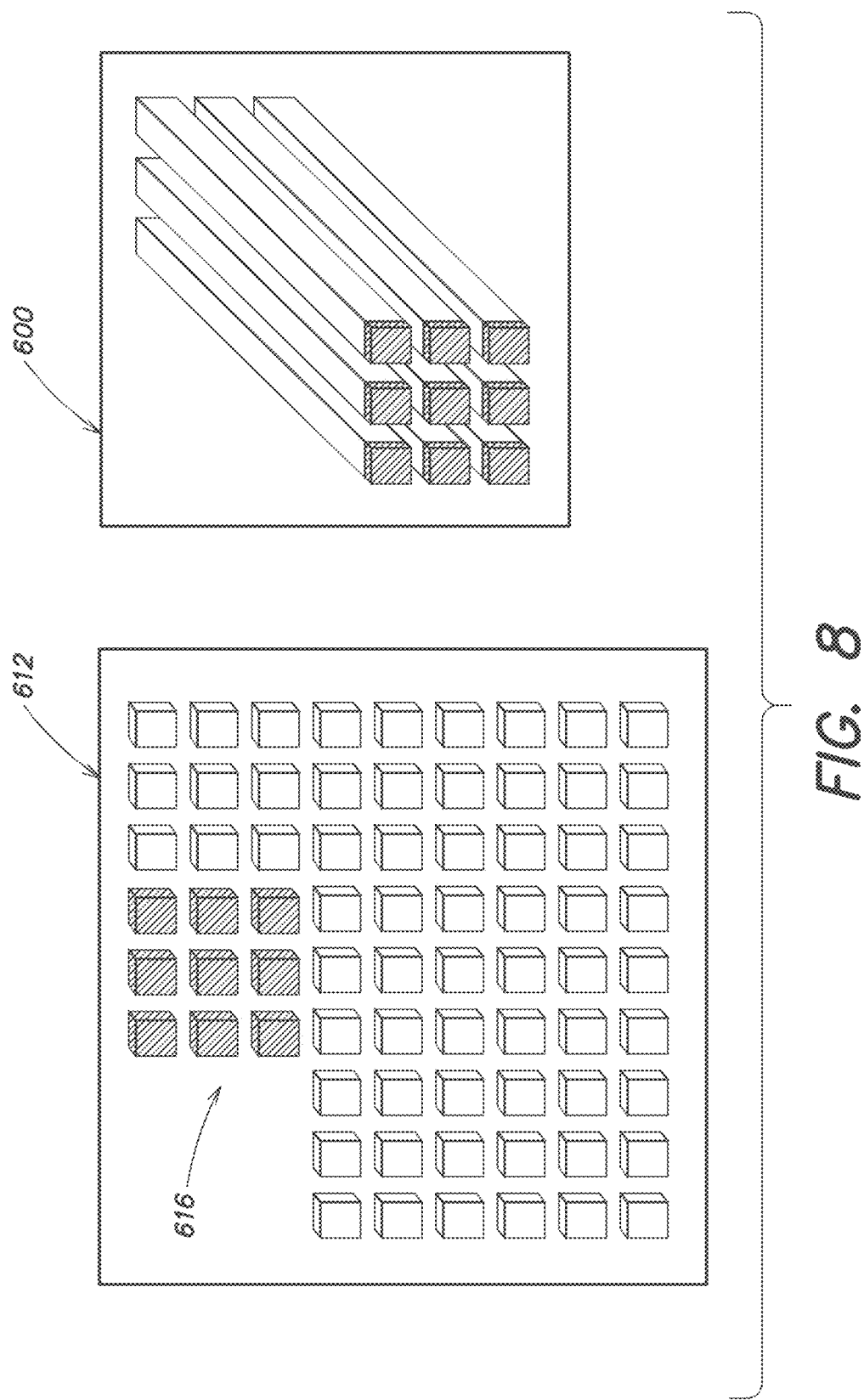
FIG. 8 is a schematic illustration of an example partial schedule for loading a stride-efficient memory structure in accordance with one or more embodiments.
Figure 9:
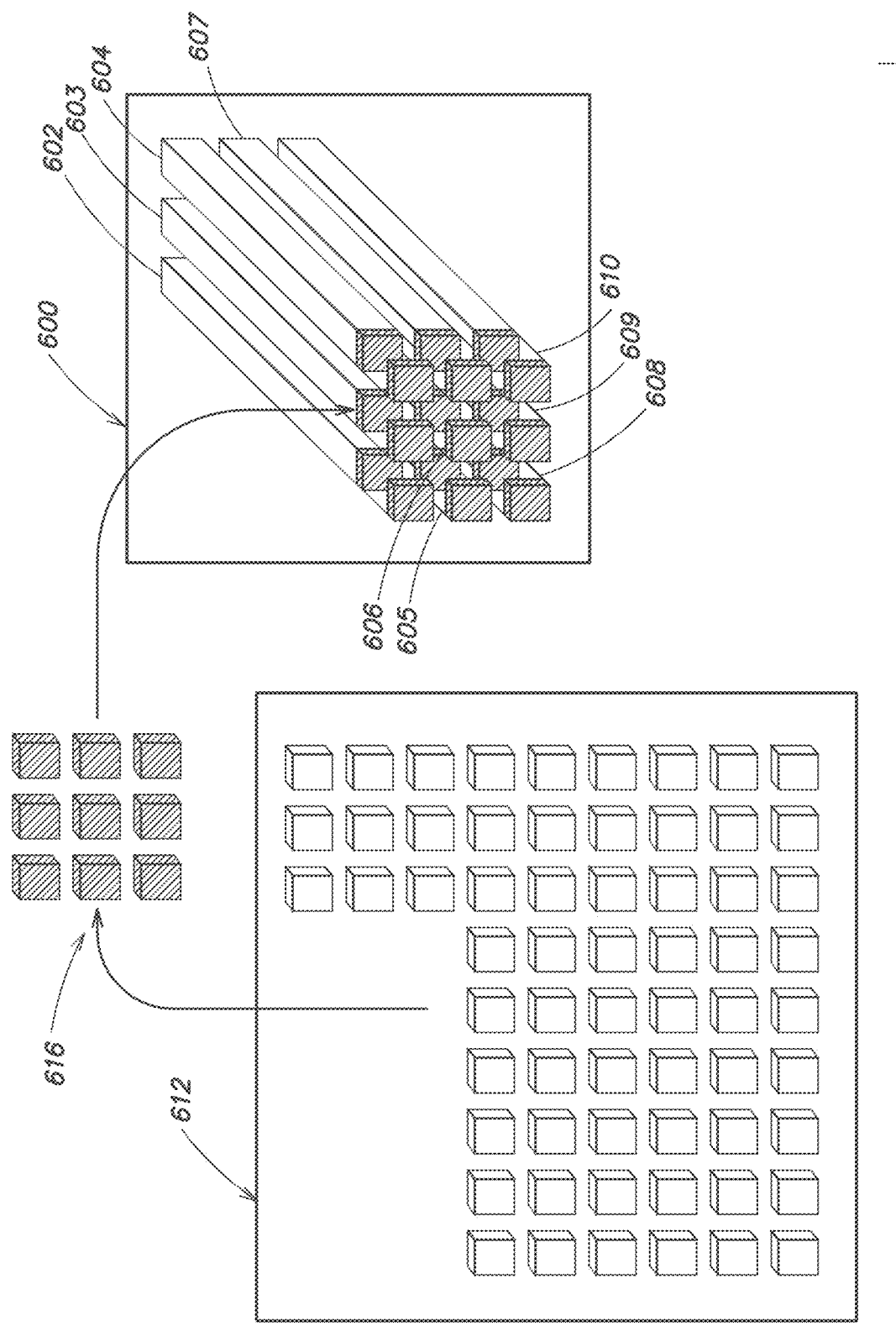
FIG. 9 is a schematic illustration of an example partial schedule for loading a stride-efficient memory structure in accordance with one or more embodiments.

FIGS. 7-9 are schematic illustrations of an example partial schedule for loading the stride-efficient memory structure 600 in accordance with one or more embodiments. Referring to FIG. 7, the nine data elements corresponding to columns 1-3 and rows 1-3 of the input data 612, which are marked with a downward diagonal pattern and are indicated at 614, may be scheduled for loading in the first storage location of each memory bin 602-610. Referring to FIGS. 8 and 9, the nine data elements corresponding to columns 4-6 and rows 1-3 of the input data 612, which are marked with a downward diagonal pattern and are indicated at 616, may be scheduled for loading in the second storage location of each memory bin 602-610.

The scheduler 205 may repeat this ordering until all of the data elements of the input data 612 are loaded into the nine bins 602-610 of the stride-efficient memory structure 600. For example, the nine data elements corresponding to columns 7-9 and rows 1-3 of the input data 612 may be scheduled for loading in the third storage location of each memory bin 602-610. The nine data elements corresponding to columns 1-3 and rows 4-6 of the input data 612 may be scheduled for loading in the fourth storage location of each memory bine 602-610, and so on. In other words, the data elements of the input data 612 may be organized into rows and columns of 3×3 tiles of data elements, and the data elements corresponding to these 3×3 tiles may be loaded into the stride-efficient memory structure 600 row-by-row, e.g., starting at row 1, column 1 (top left portion) of the input data 612, and ending at row N, column M (bottom right portion) of the input data 612. As indicated, the 3×3 tiles of data elements are non-overlapping. Each data element of the input data 612 is loaded once in the stride-efficient memory structure 600.

The scheduler 205 may also determine a schedule for reading data elements from the bins of the stride-efficient memory structure 600 for performing convolution to compute an output, as indicated at step 2136. The schedules for loading data to and reading data from the bins of the stride-efficient memory structure 600 may be referred to as activation tiling.

Other sequences may be used to load data into and/or read data from the memory structure 600. The architecture code 122 produced by the code generator 210 may generate hardware controllers to control the accessing of the memory structure 600. The functionality of at least some of the hardware controllers may be implemented in the form of predefined state machines. The hardware controllers may take one instruction as provided in the algorithmic code 136 as input, and generate control signals (e.g. addresses, enables) to access the memory structure 600 for many cycles to complete the instruction. For example, one instruction may direct the hardware controllers to do one convolutional layer. The instruction may include information, such as where input/output data is in the memory structure 600, the sizes of the input/output data, and so on. The hardware controllers may then generate reading address to the input memory structure 600 and read/writing address (reading for accumulation) to the output memory structure 600 and enable/valid signals to the data path for the computation. One convolutional layer of the DNN 116 may require many memory accesses and many cycles. The instructions generated by the compiler 206 direct the hardware controllers to generate control signals in every cycle.

As described, the scheduling among layers of the DNN 116 may be represented in the algorithmic code 136. The detailed scheduling within a given layer, such as accessing inputs/weights, which may also be represented in the algorithmic code 136, may be executed by the hardware controllers.

Figure 10:
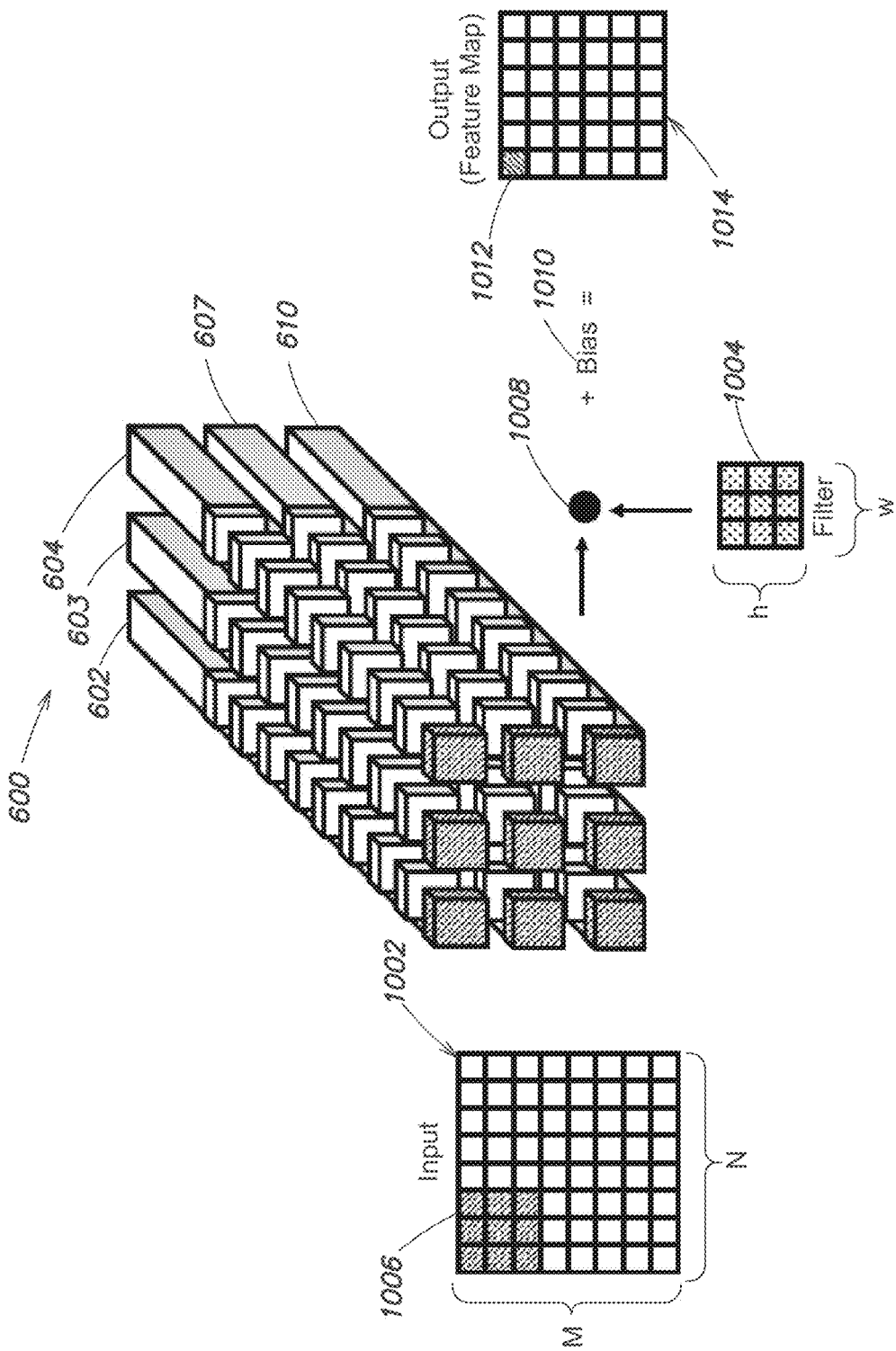
FIG. 10 is a schematic illustration of an example partial schedule for reading data elements from a stride-efficient memory structure in accordance with one or more embodiments.
Figure 11:
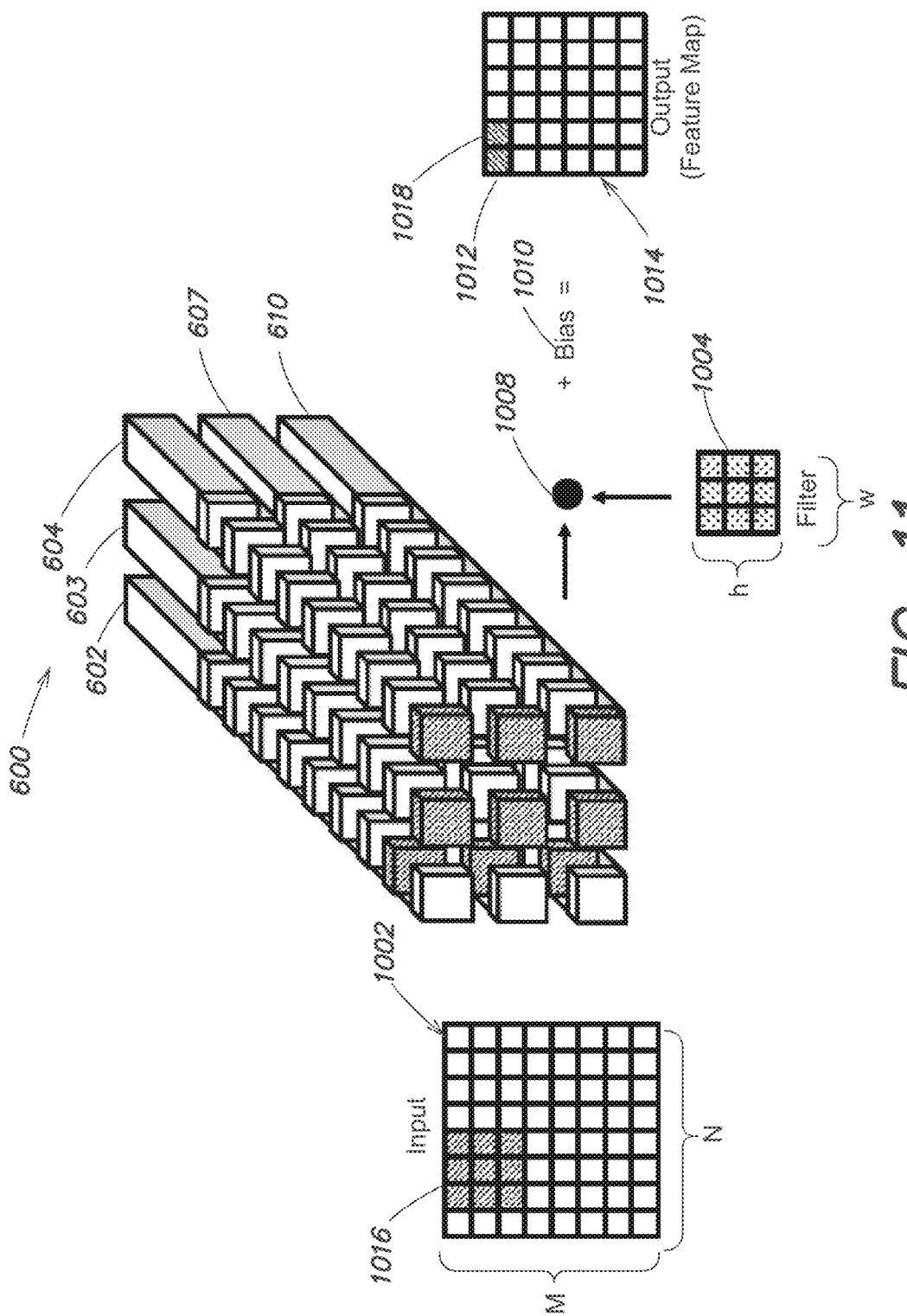
FIG. 11 is a schematic illustration of an example partial schedule for reading data elements from a stride-efficient memory structure in accordance with one or more embodiments.
Figure 12:
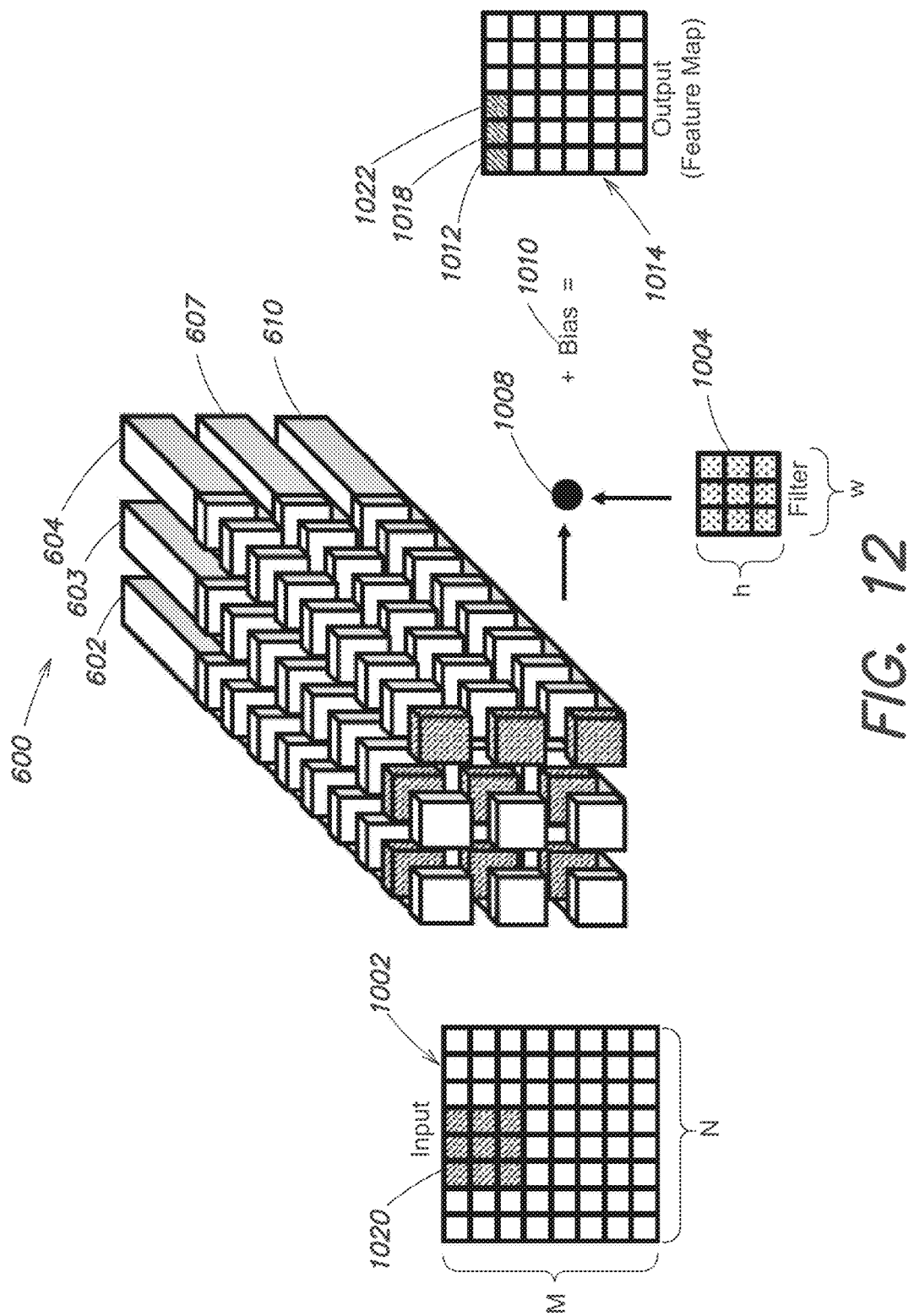
FIG. 12 is a schematic illustration of an example partial schedule for reading data elements from a stride-efficient memory structure in accordance with one or more embodiments.

FIGS. 10-12 are schematic illustrations of an example partial schedule for reading data elements from the stride-efficient memory structure 600 to perform convolution in accordance with one or more embodiments. The data may be pixels, intermediate results, or other data. Referring to FIG. 10, an input 1002, which may be an M×N array, for the convolution may be stored in the stride-efficient memory structure 600, which includes nine bins 602-610. The convolution may involve applying a filter 1004 to regions of the input 1002. The filter 1004 may contain a set of weights organized as an array of size height (h) by width (w), such as a 3×3 array. For the first convolution on the input 1002, the filter 1004 may be applied to first region 1006 marked with a downward diagonal pattern of the input 1002. The first region 1006 may be a 3×3 array whose data elements are stored at the first memory location of the nine bins 602-610 of the stride-efficient memory structure 600 as marked with the downward diagonal pattern. Thus, only a single data element is retrieved from each bin 602-610. The convolution may include performing a dot product, indicated at 1008, on the first region 1006 and the filter 1004, and adding a bias (b), indicated at 1010. A resulting output data element 1012, marked with an upward diagonal pattern, is produced and this output data element 1012 may be used to form an output 1014 of the convolution, which may be called a feature map.

The convolution continues by applying the filter 1004 to a next region of the input 1002. The step size by which the filter 1004 is moved along the input 1002 is called the stride of the convolution. Suppose the stride is one. Referring to FIG. 11, a second region 1016 of the input 1002 that is one step from the first region 1006 is identified, and the corresponding data elements scheduled for retrieval from the stride-efficient memory structure 600. For this convolution, three data elements are located at the second memory location of bins 602, 605, and 608, and six data elements are located at the first memory location of bins 603, 604, 606, 607, 609, and 610, as marked with the downward diagonal pattern. Nonetheless, once again only a single data element is retrieved from each bin 602-610. A resulting output data element 1018 is produced, and this output data element 1018 is added to the output 1014.

Referring to FIG. 12, a third region 1020 of the input 1002 that is one step from the second region 1016 is identified, and the corresponding data elements are scheduled for retrieval from the stride-efficient memory structure 600. For this convolution, six data elements are located at the second memory location of bins 602, 603, 605, 606, 608, and 609, and three data elements are located at the first memory location of bins 604, 607, and 610, as marked with the downward diagonal pattern. Nonetheless, once again, only a single data element is retrieved from each bin 602-610. A resulting output data element 1022 is produced, and this output data element 1022 is added to the output 1014.

The scheduler 205 determines the schedule for reading out data elements from the stride-efficient memory structure 600 based on the stride.

The scheduler 205 may further determine a schedule for loading the output 1014 of the convolution computations to the designated stride-efficient memory structure, as indicated at step 2138. For example, suppose the input 1002 is stored at the Mem A memory unit 318. The scheduler 205 may schedule the output 1014 for storage at the Mem B memory unit 320. In addition, the scheduler 205 may schedule the output data elements for storage in respective bins of the Mem B memory unit 320 as described above. This output 1014, moreover, represents the input of the next layer of the DNN 116. Accordingly, for this next layer, the Mem B memory unit 320 contains the "input", and the "output" computed by this next layer is scheduled for storage in the Mem A memory unit 318. The memory units 318 and 320 may thus flip or "ping-pong" between storing "input" and "output" as the computation for each layer of the DNN 116 is performed.

In some embodiments, the scheduler 205 may add padding to the input or output of a convolutional layer so that the row and column sizes, such as Height and Width, of the input or output are both a multiple of three, as indicated at step 2140. For example, if an output has a width of 16 and a height of 23, two columns of padding and one row of padding may be added. The scheduler 205 may also pad the weights to match the padded input size.

In addition, when generating multiple threads for running multiple convolution operations in parallel, e.g., where each thread operates on a different channel of the input, as described herein, the scheduler 205 may pad the input so that the number of channels is a multiple of three. To implement multiple threads, the architecture code 122 may generate multiple convolvers within a Conv processor at the configured FPGA 300. Each convolver may perform a 3×3 dot product every cycle. The multiple convolvers operate as a Single Instruction Multiple Data (SIMD) architecture in which all of the convolvers share the same instruction and work synchronously. The scheduler 205 may map the threads to the convolvers of the Conv processor, and, in order to synchronize the convolvers, the scheduler 205 may generate instructions for the Conv processor to issue signals of a valid/ready protocol.

In some embodiments, the code generator 210 may include code creating multiple Conv processors (or multiples of other elements) in the architecture code 122. For example, the code generator may define two back-to-back Conv processors in the architecture code 122, and the scheduler 205 may map early convolutional layers of a DNN to the first Conv processor and later convolutional layers to the second Conv processor. In this way, the convolutional layers may be pipelined in the two Conv processors, thereby speeding up throughput for certain networks.

The present disclosure improves execution speed and reduces memory usage as compared to existing approaches. For example, when performing convolution with a stride greater than one, some existing systems perform the convolution operation with a stride of one, and then drop the unnecessary outputs to produce the result for the particular stride value. The present disclosure, including the stride-efficient memory structure 600, does not apply a stride of one in such cases. Instead, the present disclosure computes only the outputs needed for the particular stride value. This results in fewer computations as compared to the existing systems, thereby improving the execution speed, e.g., by not performing unneeded calculations. For example, the systems and methods of the present disclosure can compute convolution with a stride of two as fast as a Winograd approach, and even faster than Winograd when the stride is greater than two.

In some cases, the scheduler 205 may schedule the output computed for a given layer of the DNN 116 to be written back to the same memory unit of the buffer module from which the input for that layer was read out. For example, the scheduler 205 may generate a schedule in which the output for an LRN layer is written back to the same memory unit, memory unit 320 say of the Conv buffer module 314, since each input activation is read out only once, and the output of the LRN layer is the same size as the input activation size. The scheduler 205 may thus direct each individual output to be written back to the location of the respective input. Such a schedule is advantageous when the input activation for the LRN layer (and therefore the output) can only fit in one of the memory units, e.g., memory unit 320. By scheduling the LRN layer to route its output back to the same memory unit, e.g., memory unit 320, the code generator 210 can avoid having to increase the size of the of the other memory unit, e.g., memory unit 318, to accommodate the output of the LRN layer.

Performance Estimation/Trade-Off

In some embodiments, the performance estimation engine 208 may estimate one or more performance metrics for the DNN 116, as indicated at step 2144.

Figure 13A:
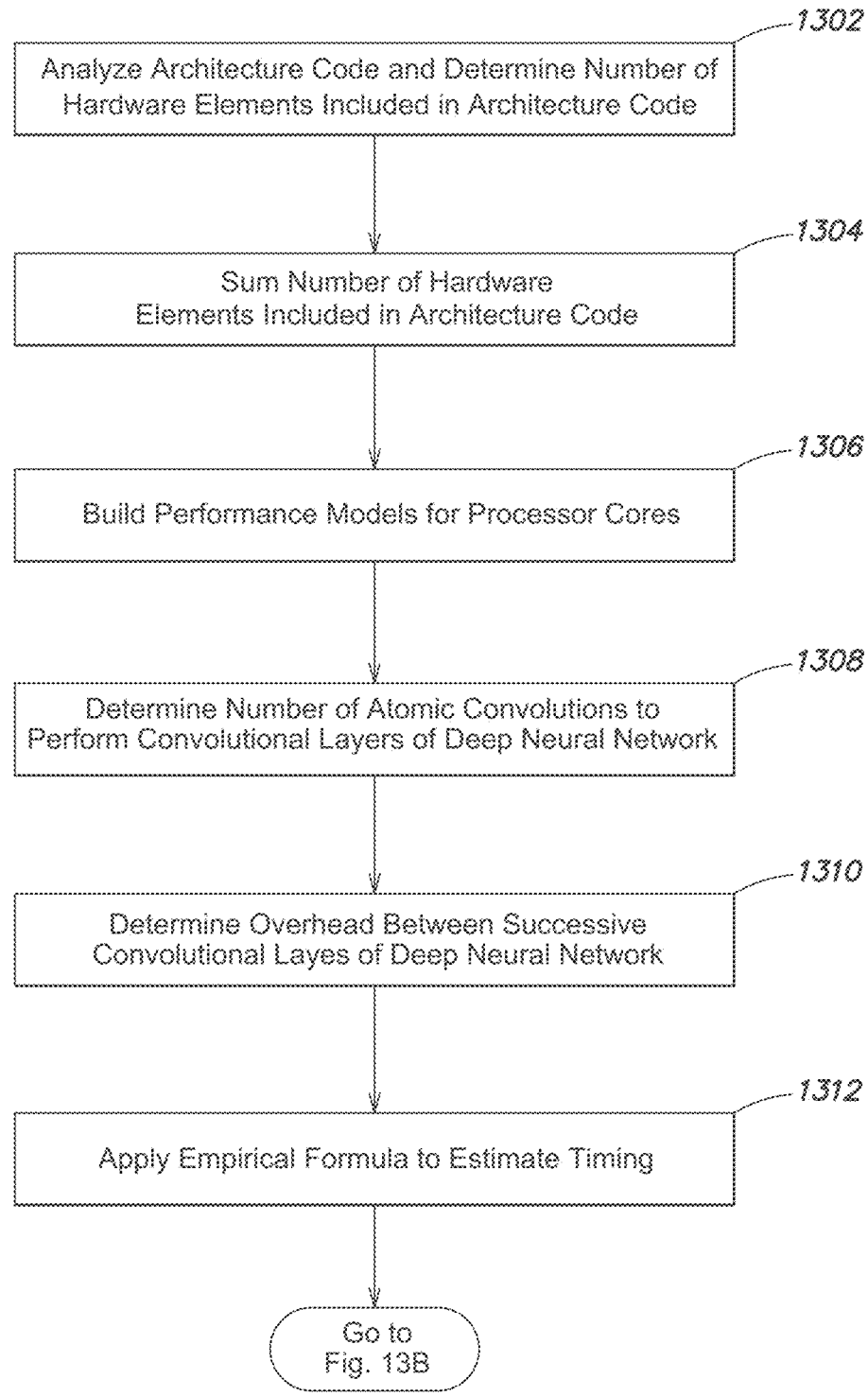
FIGS. 13A-B are partial views of a flow diagram of an example method for estimating performance metrics for a Deep Neural Network (DNN) in accordance with one or more embodiments.
Figure 13B:
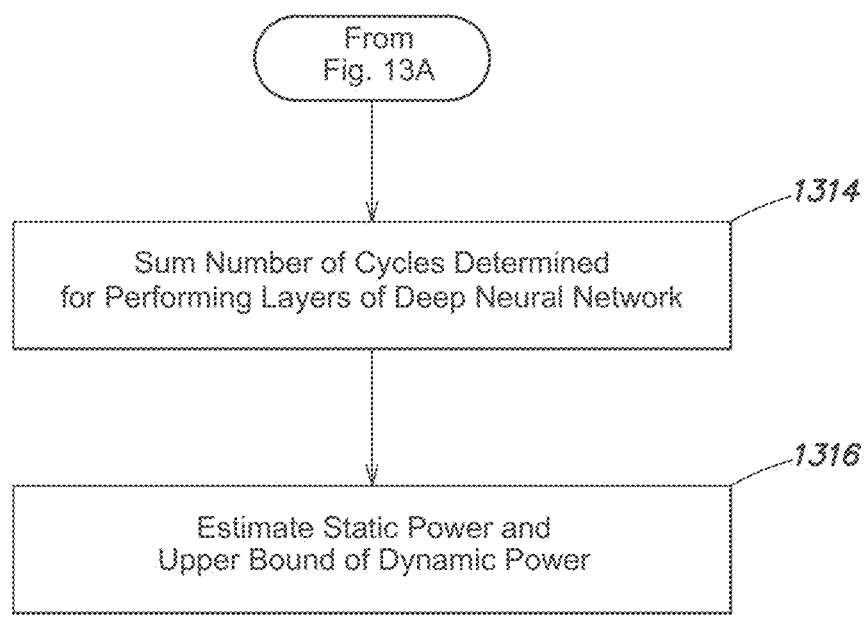

FIGS. 13A-B are partial views of a flow diagram of an example method for estimating performance metrics for the DNN 116 in accordance with one or more embodiments. The performance estimation engine 208 may determine an estimated area usage of the configured FPGA 300. The performance estimation engine 208 may analyze the basic chip information (bcc) and identify each instance where a Configurable Logic Block (CLB), DSP slice, LUT, and BRAM is defined, as indicated at step 1302. For example, the bcc may include code for assigning CLBs, DSP slices, LUTs, and BRAMs to construct the Conv module 302, including the Conv processor 124, the FC module 304, including the FC processor 126, the FIFO 306, and the Debugger 130. The performance estimation engine 208 may sum the number of CLBs, DSP slices, LUTs, and BRAMs used to create the Conv module 302, the FC module 304, the FIFO 306, and the Debugger 130, as indicated at step 1304.

In some embodiments, the data store 218 may include area usage information. To generate the area usage information, the deep learning configuration system 200 may be run to generate architecture code for one or more sample deep learning networks, such as the AlexNet network. This architecture code may then be used to synthesize vendor specific FPGAs, and the area usage for critical resources may be evaluated. Exemplary vendor-specific FPGAs include the Zynq family of SoCs from Xilinx, Inc. and the Arria series of SoC FPGAs from Intel Corp. Exemplary critical resources include the number of DSP slices and LUTs used to implement the Conv processor. Different architecture code for each vendor-specific FPGA may also be generated by tuning one or more architecture parameters, such as the number of threads and the memory sizes of the memory units of the buffer modules. For example, different architecture code may be generated for 2, 4, 8, and 12 threads, and the area usage of critical resources for each of the different architecture codes determined and stored as the data 218. The performance estimation engine 208 may then interpolate and/or extrapolate from this area usage information to generate area usage estimates for the user's DNN design, e.g., the DNN 116. For example, suppose the user's DNN design has six threads. The performance estimation engine 208 may generate area usage for this DNN design by interpolating the empirical data generated for four and eight threads.

Memories of the configured FPGA 300, such as the memory units used to create the buffer modules are generally built with BRAMs. The data store 218 may include a model of the relationship between memory size, e.g., of the buffer modules, and the BRAM usage. For example, the BRAM usage may have a linear relationship to the memory size. The performance estimation engine 208 may apply this linear relationship to generate area usage for a user's DNN design. In some embodiments, the overhead may be factored into the model of the relationship for BRAM usage, e.g., by the Conv processor 124.

The performance estimation engine 208 may determine an estimated speed for running the DNN 116 at the configured SoC 106'. The performance estimation engine 208 may build performance models 216 for the Conv processor 124, the FC processor 126, and the FIFO 306, as indicated at step 1306. The performance models 216, which may be sets of estimation equations, may model how long the respective processor (or other hardware element) takes to process a given input. At least some of the performance models 216 for the Conv processor 124, the FC processor 126, and the FIFO 306 may be aggregated into different composite processor models, for example into composite models that model sequential, parallel, and pipelined operation of the underlying processors. As described, the convolutional layers of the DNN 116 are scheduled as sets of atomic 3×3 dot-product operations performed at the Conv processor 124. The performance estimation engine 208 may determine the number of atomic 3×3 dot-product required to perform each convolutional layer of the DNN, as indicated at step 1308. For a single thread implementation, each atomic 3×3 dot-product operation may be a cycle of the configured FPGA 300. In the case of 4×4 convolution threads, 16 3×3 dot-product operations may be performed during a cycle of the configured FPGA 300. The performance estimation engine 208 also may determine the overhead between two successive convolutional layers, as indicated at step 1310. For example, the performance estimation engine 208 may analyze the static schedule that was determined for pre-fetching weights for the filters and for resetting controllers. The performance estimation engine 208 may also consider pipeline initialization and flushing time. The performance estimation engine 208 may use an empirical formula to estimate the timing, e.g., in cycles, for access the external memory 108, as indicated at step 1312. The empirical formula may require calibration depending on the particular SoC 106. For example, one formula may be used for Altera/Intel SoC platforms, and another formula may be used for Xilinx SoC platforms.

Different performance models 216 may be created for modeling how a processor performs on a specific network layer. For example, since a max pooling layer may reuse the convolution kernel, the max pooling layer may share the performance model for the convolutional layer. An LRN layer performed by the Conv processor 124 may have its own performance model as its logic differs from the convolutional and max pooling layers. Some layers, such as input/output layers and the inter-processor FIFO may have a de minimis impact on overall performance and may be ignored by the performance estimation engine 208.

The performance estimation engine 208 may sum the number of determined cycles for performing each layer of the DNN 116 to compute a total number of cycles to process a given input data, e.g., an image, as indicated at step 1314 (FIG. 13B).

The performance estimation engine 208 may determine an estimated power consumption for running the DNN 116 at the configured SoC 106'. The performance estimation engine 208 may estimate static power consumption and an upper bound of dynamic power consumption, as indicated at step 1316. The estimated power consumption may be based on target clock frequency, target operating temperature, estimated clock cycles, and estimated resource usage. In some embodiments, the architecture code 122 may be in the form of Hardware Description Language (HDL) code. A hardware synthesis tool may estimate power consumption from the HDL code. Exemplary synthesis tool chains include the Design Compiler from Synopsys, Inc. of Mountain View, Calif., the Encounter RTL Compiler from Cadence Design Systems, Inc. of Mountain View, Calif., Quartus from Intel, Precision RTL from Mentor Graphics of Wilsonville, Oreg., and Vivado Design Suite from Xilinx, among others.

Figure 21E:
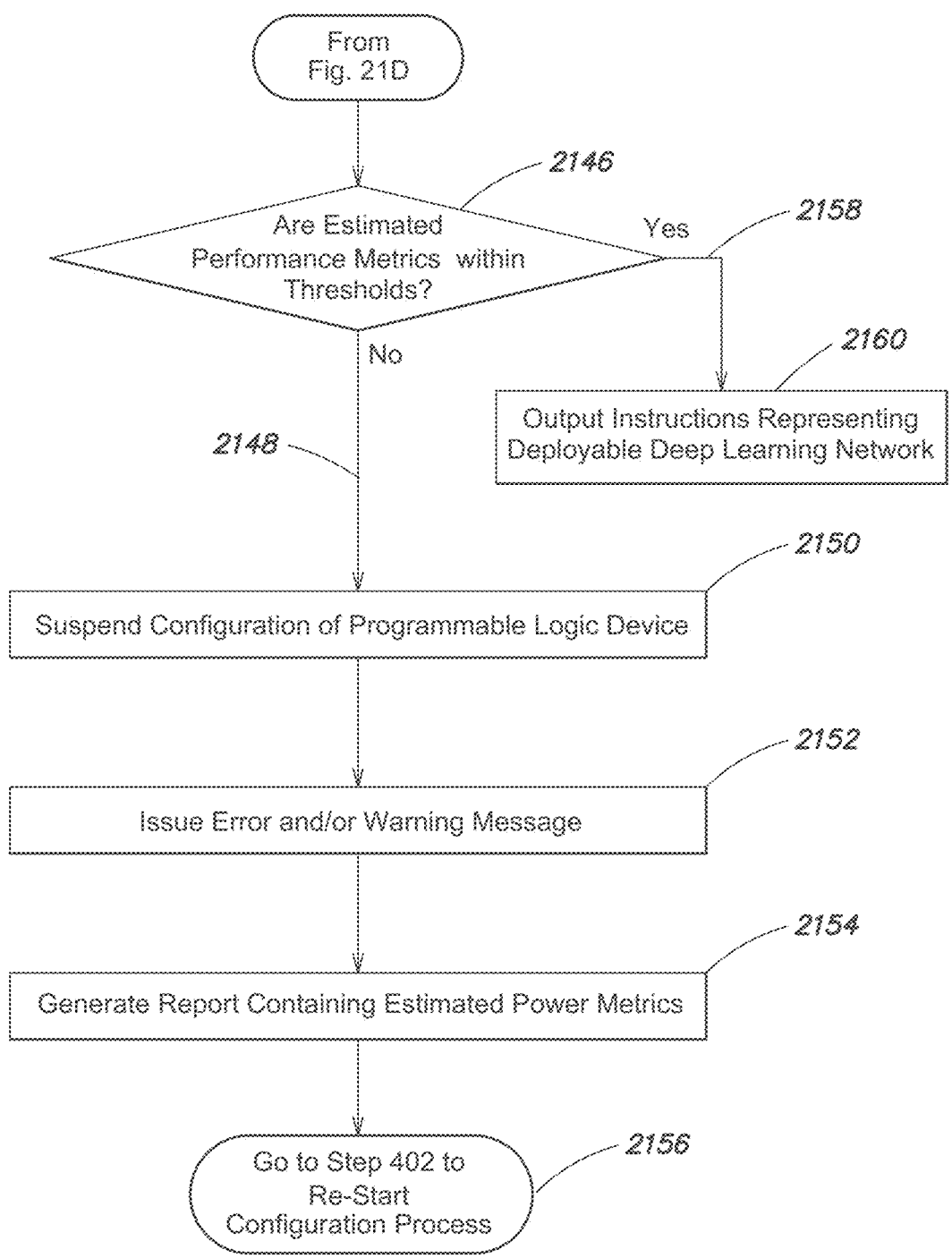

Referring to FIG. 21E, the power estimation engine 208 may determine whether the estimated area usage, speed, and/or power consumption are within respective values, such as thresholds, included in the design constraints 120, as indicated at decision step 2146. If not, the configuration process may be suspended, as indicated by No arrow 2148 leading to step 2150. In addition, the UI engine 202 may issue a report and/or an error or warning message, e.g., to a user, as indicated at step 2152. The report may include the estimated area usage, speed, and/or power consumption. It may also indicate which threshold was exceeded. In addition to or instead of an error or warning message, the UI engine 202 may create and present a report containing the area usage, speed, and/or power consumption information derived by the performance estimation engine 208, as indicated at step 2154. The user may then direct the DL configuration system 200 to re-start the configuration process, as indicated by GoTo step 2156. The user may specify a different type of DNN, may change one or more of the design constraints 120, and/or select a different DNN. The DL configuration system 200 may then generate new architecture code and new algorithmic code, and the performance estimation engine 208 may generate new estimates for area usage, speed, and/or power consumption. Again, the user may evaluate these performance estimates, and choose whether to adjust one or more inputs, or continue with the configuration process. This iterative configuration process may be repeated until a design having acceptable performance estimates is obtained.

If the estimated area usage, speed, and/or power consumption metrics are acceptable, for example if they are within the respective thresholds included in the design constraints 120, the configuration process may continue. For example, the code generator 210 may output (or save) the DNN algorithmic code 136, as indicated by Yes arrow 2158 leading to step 2160. The algorithmic code 136 may be or may include an executable. For example, the algorithmic code 136 or a portion thereof, such as the layer configurations 140, may be in the form of a MATLAB executable file having a .m file extension, and the layer parameters 138 may be in the form of a MATLAB data file having a .mat file extension. Nonetheless, the algorithmic code 136 may take other forms.

Configuring the SoC

The hardware synthesis tool 212 may utilize the architecture code 122 to configure the FPGA 110 to produce the configured FPGA 300. During hardware synthesis, the hardware synthesis tool 212 may translate the architecture code 122, for example from HDL to Register Transfer Level (RTL) code or other representations. The hardware synthesis tool 212 may use the RTL code to generate a bitstream. The hardware synthesis tool 212 may feed the bitstream to the SoC, for example via a configuration port at the SoC 106 and/or the FPGA 110, to synthesize the Conv module 302, the FC module 304, the FIFO 306, and the debugger 130 utilizing particular CLBs, DSP slices, BRAMs, LUTs, and other hardware elements of a vendor and device specific FPGA.

Running the DL Network on the Configured SoC

FIGS. 14A-E are partial views of a flow diagram of an example method of running the DNN 116 on the configured System on a Chip (CSoC) 106' in accordance with one or more embodiments.

The variables of the DNN 116, such as weights and biases used by the convolutional and fully connected layers, may be loaded into the external memory 108 of the configured SoC 106', for example, into the buffers allocated to store those values, as indicated at step 1402. In some embodiments, the weights may be loaded into the external memory 108 by the data processing device 104. Input data, such as one or more images for classification, may be loaded into the external memory 108, for example into the buffer allocated to store input data, as indicated at step 1404. The Start command 336 may be sent to the configured SoC 106', as indicated at step 1406. Steps 1402-1406 may be included in the host code 142.

The Cony Controller 316 may direct the external memory 108 to transfer the first input data, e.g., the first image, to Mem A 318 or Mem B 320 of the Cony buffer module 314 according to the determined schedule as illustrated by arrows 335a and 335b, as indicated at step 1408. If the first input is too large to fit on the Mem A 318 or Mem B 320, then only a portion of the first input is transferred.

Figure 14A:
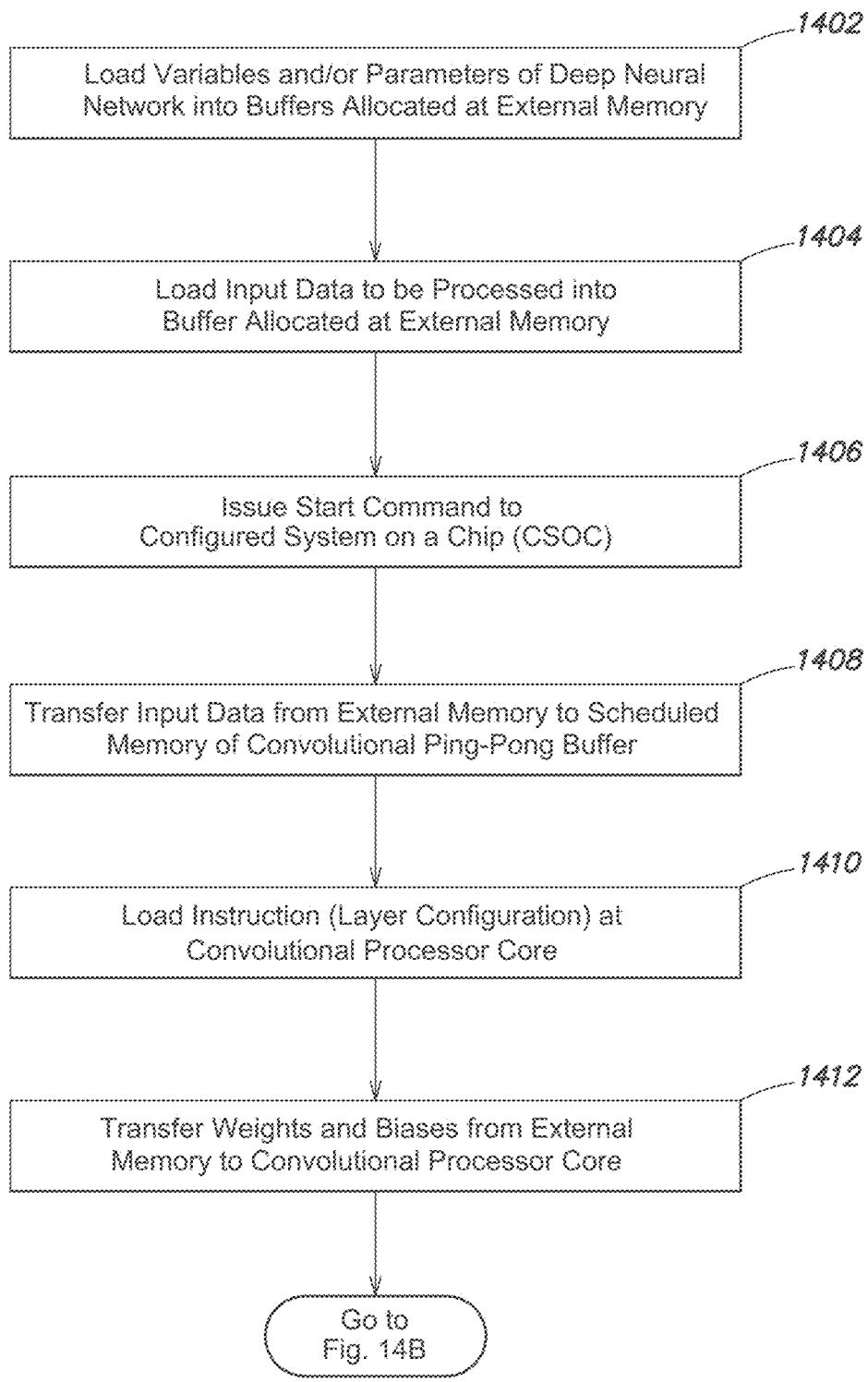
FIGS. 14A-E are partial views of a flow diagram of an example method of running a Deep Neural Network (DNN) on a configured System on a Chip (CSoC) in accordance with one or more embodiments.
Figure 14B:
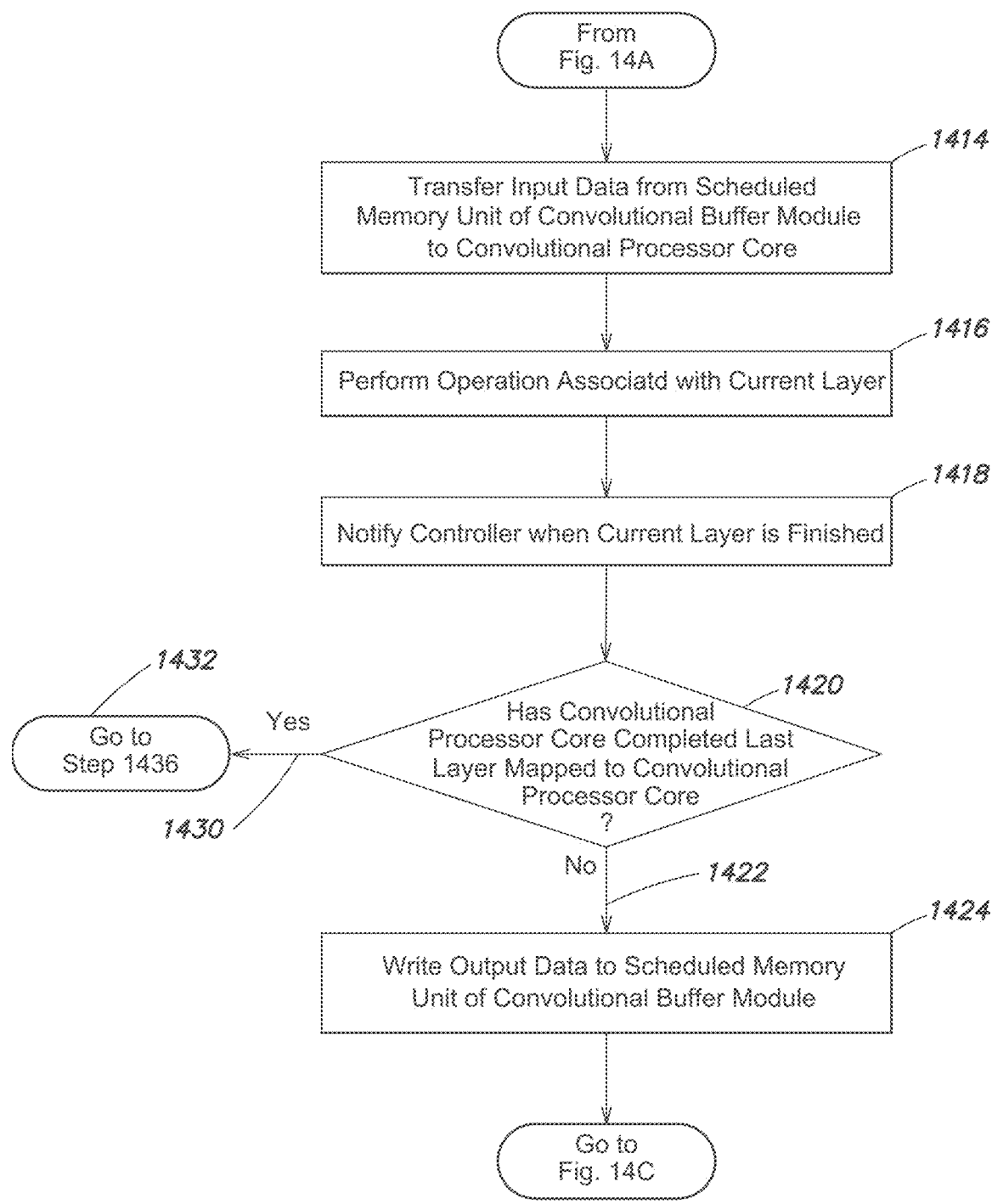
Figure 14C:
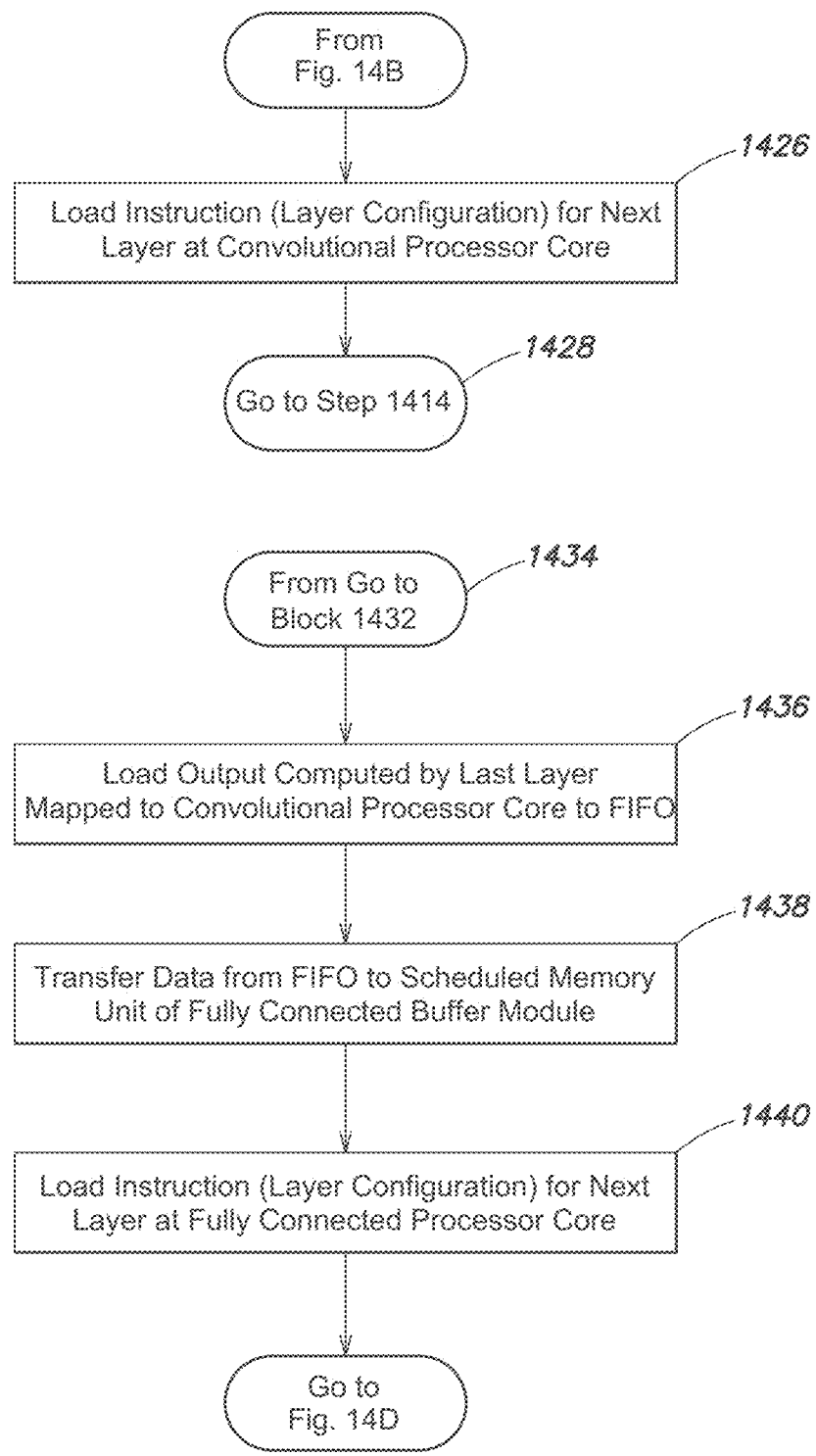

The layer configs instruction of the DNN layer configurations 140 for performing the first layer of the DNN 116 at the configured FPGA 300 may be transferred to Cony processor 124, for example from the data processing device 104 to the instruction memory 332 of the Cony Controller 316, as illustrated by the arrow 338 as indicated at step 1410. The set of weights and the bias(es) for performing the current convolutional layer are transferred to the Cony processor 124 via the memory interface 308 and the burst controller 310, as illustrated by arrows 344a and 344b as indicated at step 1412. The first input (or a portion thereof) is moved into the Cony processor 124 from the scheduled memory unit 318 or 320 of the Cony buffer module 314, as indicated at step 1414 (FIG. 14B). The Cony processor 124 may perform the operation for the current layer, such as a convolution operation, as indicated at step 1416.

The Conv processor 124 may notify the Conv controller 316 when the operation for the current layer is completed, as indicated at step 1418. The Conv controller 316 may determine whether the Conv processor 124 has completed the last layer of the DNN 116 scheduled for execution by the Conv processor 124, as indicated at decision step 1420. If not, the results may be written to the scheduled memory unit 318 or 320 of the Conv buffer module 314, as indicated by No arrow 1422 leading to step 1424. While the Conv processor 124 is performing a convolutional layer, it may pre-fetch the set of weights needed for a next convolutional layer according to the determined schedule. The layer configs instruction of the DNN layer configurations 140 for performing the next layer mapped to the Conv processor may be transferred to Conv processor 124, as indicated at step 1426 (FIG. 14B). Processing may then resume at step 1414, as indicated by Go To block 1428.

These steps may be repeated until the Conv processor 124 completes the last layer of the DNN mapped to the Conv processor 124, at which point the results computed by the Conv processor 124 may be loaded in the FIFO 306, as indicated by Yes arrow 1430, Go To block 1432, and From block 1434 (FIG. 14C) leading to step 1436. The Conv controller 316 and/or the FIFO 306 may signal the FC controller 326 that input data is ready for processing.

The data may be transferred from the FIFO 306 to the scheduled memory unit of the fully connected buffer module 324, as indicated at step 1438. The layer configs instruction of the DNN layer configurations 140 for performing the respective layer of the DNN 116 by the FC processor 126 may be transferred to FC processor 126, for example from the data processing device 104 to the instruction memory 334 of the FC Controller 326, as indicated by the arrow 340 as indicated at step 1440.

Figure 14D:
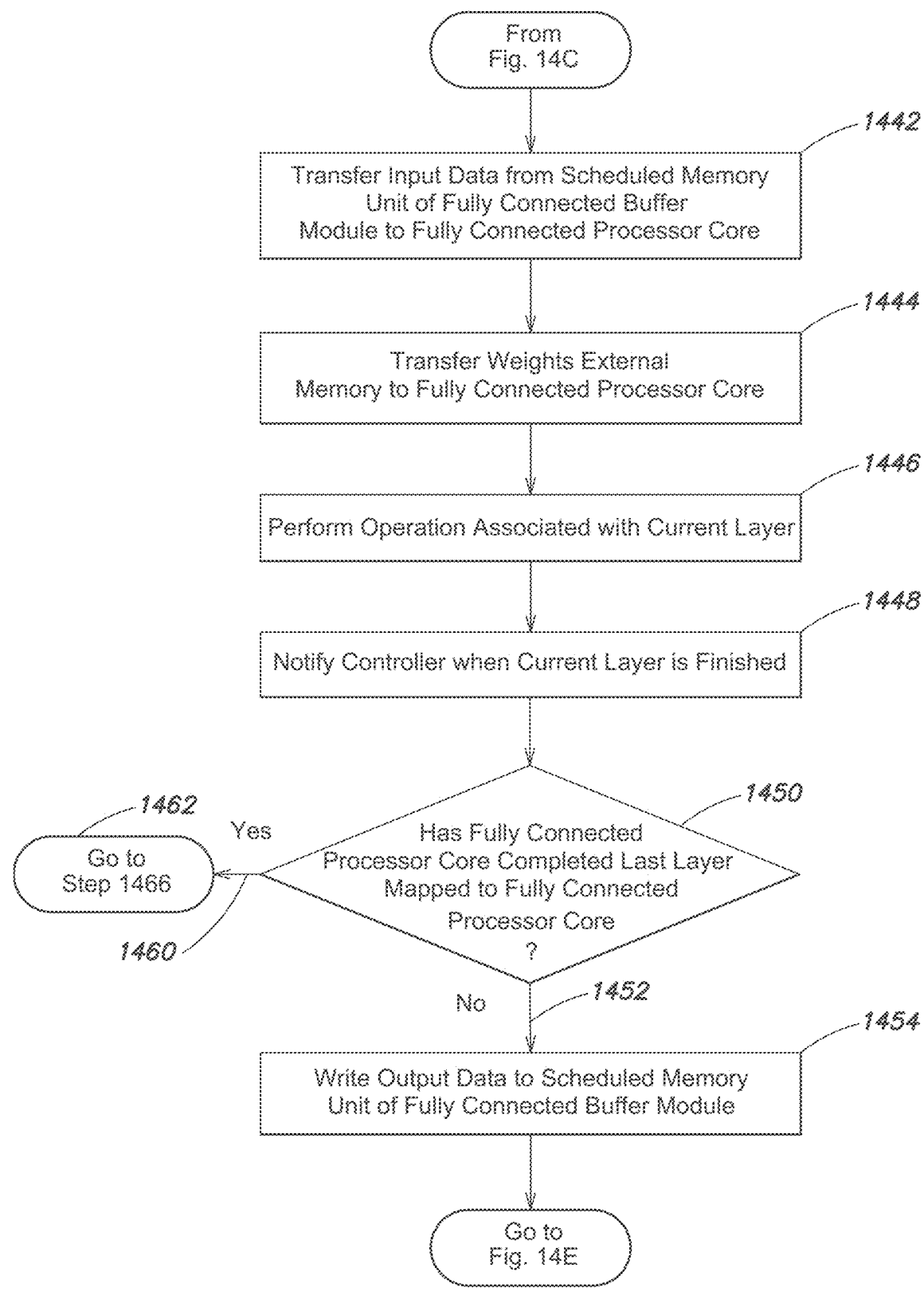

The input (or a portion thereof) for the respective layer may be read out of the FC buffer module 324 in the form of a vector and streamed into the FC processor 126 from the scheduled memory unit 328 or 330 of the FC buffer module 324, as indicated at step 1442 (FIG. 14D). The weights may be streamed into the FC processor 126, for example via the memory interface 308 and the burst controller 321, as indicated by arrows 346a and 346b also indicated at step 1444. The FC processor 126 may perform the operation for the current layer, such as vector-matrix multiplication on the input and weights accumulating product with partial results and adding a bias, as also indicated at step 1446. Weights may be discarded upon use, and pre-fetching of weights may not be performed for the FC processor 126.

The FC processor 126 may notify the FC controller 326 when the operation for the current layer is completed, as indicated at step 1448. The FC controller 326 may determine whether the FC processor 126 has completed the last layer of the DNN 116 scheduled for execution by the FC processor 126, as indicated at decision step 1450. If not, the results may be written to the scheduled memory unit 328 or 330 of the FC buffer module 324, as indicated by No arrow 1452 leading to step 1454.

Figure 14E:
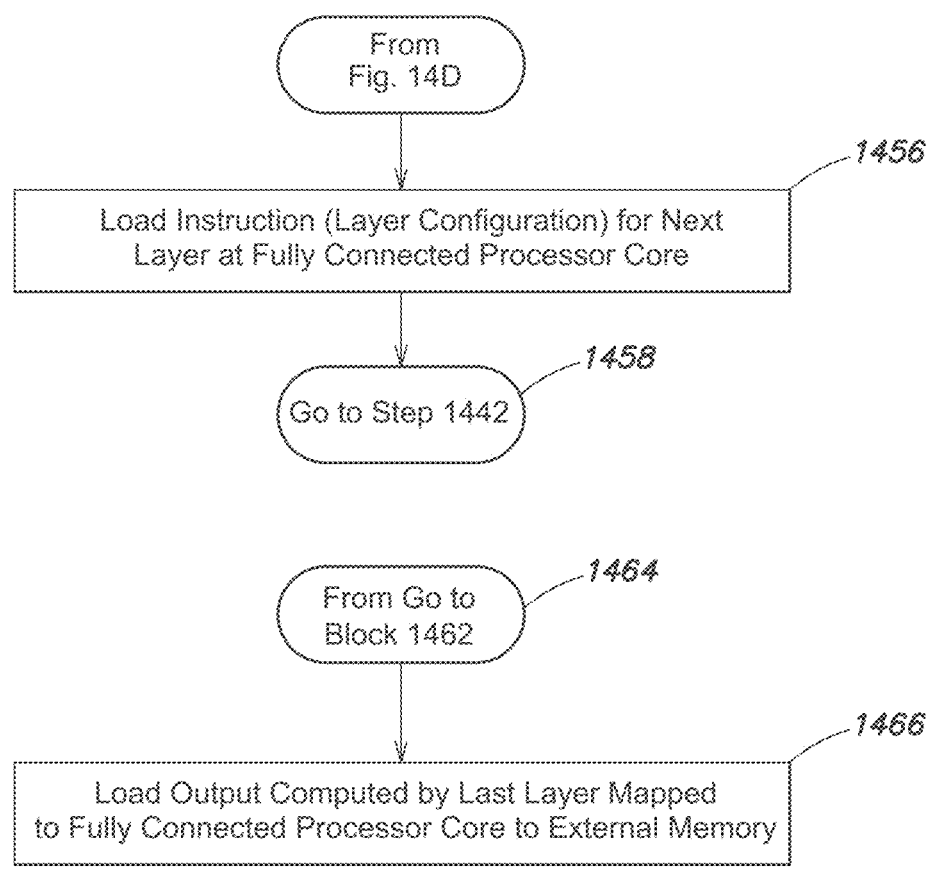

The layer configs instruction of the DNN layer configurations 140 for performing the next layer mapped to the FC processor 126 may be transferred to FC processor 126, as indicated at step 1456 (FIG. 14E). Processing may then resume at step 1442, as indicated by Go To block 1458.

These steps may be repeated until the FC processor 126 completes processing the last layer of the DNN mapped to the FC processor 126. At this point, the results computed by the FC processor 126 for this final layer may be loaded in the external memory 108 via the register bank 322 and the memory interface 308 as illustrated by arrows 348a and 348b, as indicated by Yes arrow 1460, Go To block 1462, and From block 1464 (FIG. 14E) leading to step 1466.

It should be understood that, with the output of the Conv processor 124 loaded in the FIFO memory 306, the Conv processor 124 may begin processing new input data, e.g., a next image. As described, the Conv processor 124, the FIFO memory 306, and the FC processor 126 can handle one input data element, e.g., one image, independently. For example, considering images A, B, and C, the FC processor 126 may be processing image A, the FIFO memory 306 is storing image B, and the Conv processor 124 is processing image C. The FIFO memory 306 may be configured to double buffer the Conv and FC buffer modules 314 and 324, thereby allowing the Conv and FC processors 124 and 126 to continue processing input data. When processing is complete, the Done signal 342 may be issued.

As described, in some embodiments, a SoC may be configured to include multiple Conv and FC processors 124 and 126 as well as other hardware components, and may process multiple input data, e.g., images, simultaneously. The multiple Conv and FC processors 124 and 126 may be running in parallel. In this case, some of the steps of FIG. 14 may be running simultaneously.

Example

AlexNet is a convolutional neural network (CNN) for classifying images. It has been trained on over a million images, and can classify input images into 1000 object categories, such as keyboard, coffee mug, pencil, etc. AlexNet has five convolutional layers and three fully connected (FC) layers.

FIG. 15 is a table 1500 listing the layers included in the AlexNet CNN. The table 1500 includes columns for Layer Number 1502, Layer Name 1504, Layer Type 1506, and Layer Description 1508. The table includes 23 rows 1510a-w each corresponding to a layer of the AlexNet CNN.

The DL configuration system 200 may generate architecture code 122 and DNN algorithmic code 136 for running the AlexNet CNN on the configured SoC 106'. For example, the scheduler 205 may map layers 1510b through 1510p to the Conv processor 124, and layers 1510q through 1510u to the FC processor 126. The scheduler 205 may schedule the input image to be processed, indicated at layer 1510a, for storage in the Mem A memory unit 318 of the Conv buffer module 314. The compiler 206 may fuse the conv1 and relu1 layers 1510b and 1510c, and schedule the output of these layers 1510b and 1510c for storage in the Mem B memory unit 320. This output, stored at the Mem B memory 320, then becomes the input for the norm1 layer 1510d. The flipping between the memory units 318 and 320 may be continued for the other layers mapped to the Conv processor 124.

The scheduler 205 may schedule the output of the pool5 layer 1510p to be stored at the FIFO 306. The scheduler 205 may schedule the output of the pool5 layer 1510p to be transferred to the Mem A memory unit 328 of the FC buffer module 324. Outputs computed by the fc6 layer 1510q to the relu7 layer 1510t may be flipped between the memory units 328 and 330 of the FC buffer module 324. The scheduler 205 may schedule the output of the fc8 layer 1510v to be stored at the external memory 108.

The operations of the prob layer 1510v and the output layer 1510w may be incorporated in the host code 142, and performed at the data processing device 104.

Table 1 provides a list of hardware resources utilized on two SoCs configured to run the AlexNet network.

TABLE 1

| | SoC | |
| --- | --- | --- |
| | Xilinx ZC706 Board with xc7z045ffg900-2 chip | Intel Arria10 |
| Conv processor | 152809 LUTs, 41079 slices, 267 DSPs, 516 BRAMs | 159919 LUTs, 142777 ALMs, 741 DSPs, 1106 BRAMs |
| 3 × 3 stride-efficient memory of Conv processor | 9812 LUTs, 5578 slices, 0 DSPs, 514 BRAMs | 11787 LUTs, 14666 ALMs, 0 DSPs, 945 BRAMs |
| FC processor | 6868 LUTs, 2546 slices, 4 DSPs, 13 BRAMs | 28544 LUTs, 21770 ALMs, 256 DSPs, 208 BRAMs |

It should be understood that the values included in Table 1 are representative only. Furthermore, because of the differences in the design fabrics of the two SoCs, the values are not directly comparable. For example, the Xilinx ZC706 has only 2×2 conv threads and two FC threads. The Arria10 SoC has 7×7 conv threads and 16 FC threads. The Arria10 DSP is also capable of doing one single precision multiplication and addition.

Debugging

As described, the architecture code 122 generated by the DL configuration system 200 may configure one or more hardware debuggers, such as the debugger 130, in the configured FPGA 300.

Figure 16:
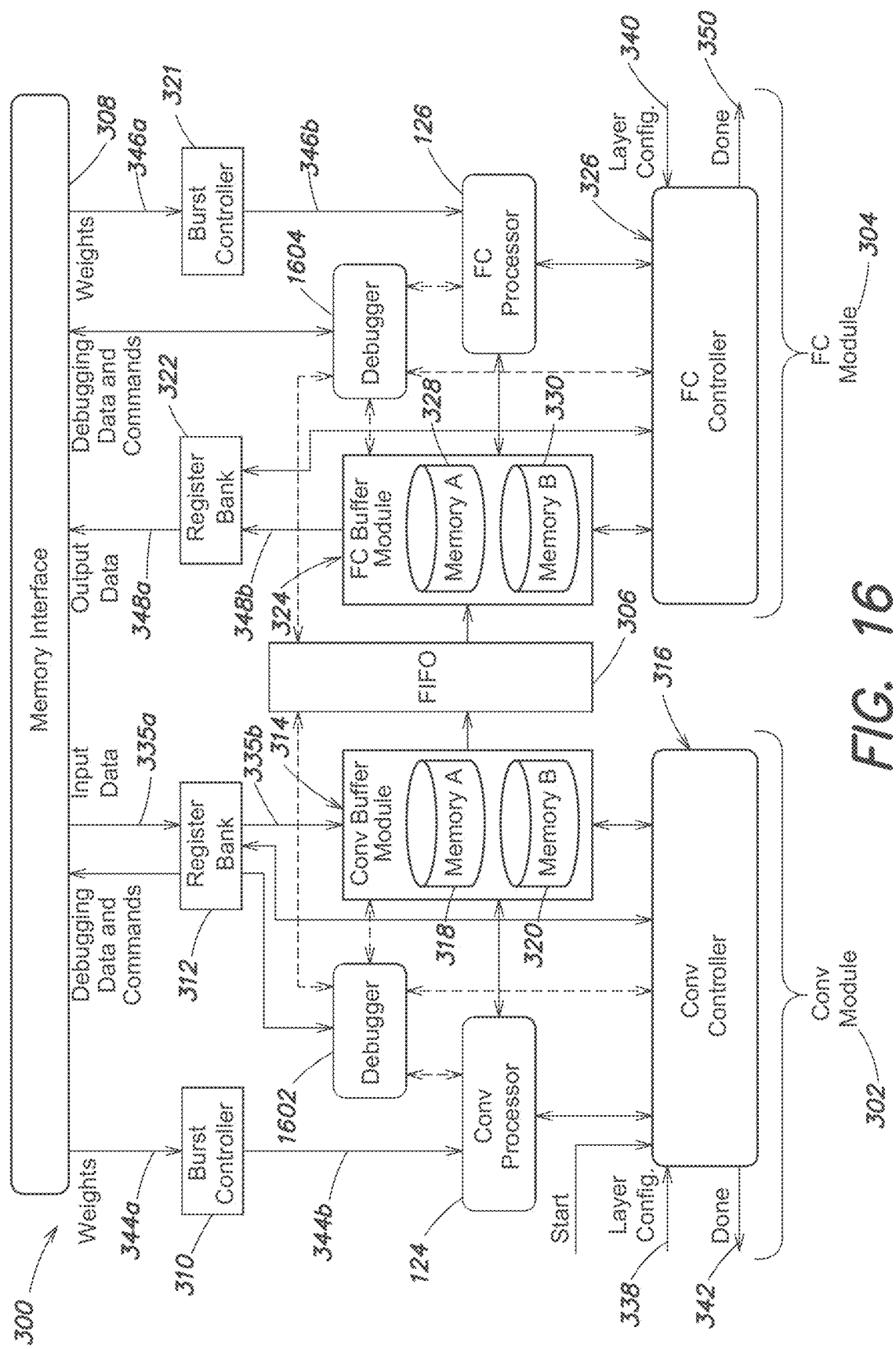
FIG. 16 is a schematic illustration of an example of a portion of a configured programmable logic device including hardware debuggers in accordance with one or more embodiments.

FIG. 16 is a schematic illustration of an example of a portion of the configured FPGA 300 including hardware debuggers in accordance with one or more embodiments. The configured FPGA 300 includes a hardware debugger 1602 as part of the Conv module 302, and another hardware debugger 1604 as part of the FC module 304. The debugger 1602 may be connected to the Conv processor 124, the Conv buffer module 314, the FIFO 306, and the Conv controller 316. Accordingly, the debugger 1602 may access data stored at the Conv buffer module 314 and the FIFO 306, operations performed by the Conv processor 124, and commands issued by the Conv controller 316. The debugger 1604 may be connected to the FC processor 126, the FC buffer module 324, the FIFO 306, and the FC controller 326. Accordingly, the debugger 1604 may access data stored at the FC buffer module 324 and the FIFO 306, operations performed by the FC processor 126, and commands issued by the FC controller 326.

The hardware debuggers 1602 and 1604 may operate under the control of the debugger manager 144, which may be running on the data processing device 104. The debuggers 1602 and 1604 may be configured to perform two general types of functionality: control and access. For example, with regard to control functionality, the debuggers 1602 and 1604 may implement breakpoints, e.g., manually specified by a user, to suspend execution of a DNN at the configured SoC 106' during runtime, and to continue or resume execution of the DNN after the breakpoint in a step-wise manner. In some embodiments, the debuggers 1602 and 1604 may implement the control functionality at a granularity level corresponding to the layers of the DNN, e.g., a user can break the execution at any layer, e.g., convolution, pooling, fully connected, etc., and step one layer at a time.

With regard to access functionality, the debuggers 1602 and 1604 may access information stored at various memories of the configured SoC 106', including the memory 108. For example, the debuggers 1602 and 1604 may access the memories included in the conv and FC modules 302 and 304, such as the memory units of the buffer modules 314 and 324, the instruction memories, and registers, such as profiler event counters and timers. For example, in response to a UI event trigger, e.g., from the user, the debugger manager 144 may direct the debugger 1602 to set a breakpoint at the beginning of a layer of the DNN 116 executed by the Conv processor 124. Execution of the DNN 116 at the configured SoC 106' may be commenced, e.g., starting with the first layer of the DNN 116. When the breakpoint is reached, the debugger 1602 may stop the Conv processor 124. The debugger 1602 may then read out the data in one or more memories of the Conv module 302, such as one or both of the memory units 318 and 320 of the Conv buffer module 314, and transmit that data to the debugger manager 114, which may present it, e.g., on a display. The user may modify the data, and the debugger manager 144 may transmit the modified data to the debugger 1602 with a command to replace the data with the modified data. In response to a UI event from the user, the debugger manager 144 may then direct the debugger 1602 to step through execution of the DNN 116. The results computed during execution of the next layer of the DNN 116 may be retrieved by the debugger 1602, sent to the debugger manager 114, and presented, e.g., for evaluation by the user. In some embodiments, the data stored in the memory units 318 and 320 of the Conv buffer module 314 may be in a format (such as the 3×3 tiled format) that is different from the data's original format (such as an 3D tensor). The debugger manager 144 may be configured to convert the data to the original format, e.g., the 3D tensor, for presentation to the user.

In some embodiments, the debuggers 1602 and 1602 may transfer data read from the various memories of the configured FPGA 300 to the external memory 108. For example, the debuggers 1602 and 1604 may operate as master AXI devices and may share the memory channel represented by the memory interface 308 with the hardware elements of the conv module 302 and the FC module 304.

In some embodiments, the debuggers 1602 and 1604 may not themselves log data. Instead, they may control layer execution, e.g., break, step, and resume, and access data when the execution pauses. Once the execution pauses, the debuggers 1602 and 1604 may access memories/registers, for example upon user request, which may be performed interactively through the debugger manager 144. A profiler, which may be included in the debugger manager 144 or a modeling environment may log data. The Conv and FC processors 124 and 126 may have their own profilers, which may log data asynchronously. Each profiler may have its own set of event taps, and may log memory to record events individually. All of the profilers may share one global counter (timer for event timestamp). When the debugger manager 144 processes the profiling data, the data can be merged based on the timestamps.

In some embodiments, the architecture code 122 as generated by the code generator 210 may provide one master interface for the debuggers 1602 and 1604 to access the external memory 108, since the two debuggers 1602 and 1604 will not access the external memory 108 at the same time. That is, the code generator 210 may merge master interfaces of the debuggers 1602 and 1604. This optimization reduces the number of masters, thereby relieving the pressure on the bus arbitrator logic, which might otherwise slow down if it needed to manage many master devices.

Parallelization Strategies

The architecture code 122 as represented at FIGS. 3 and 16 and the algorithmic code 136 may be single threaded. In some embodiments, the DL configuration system 200 may generate multi-threaded architecture code 122 and algorithmic code 136. Multi-threaded architecture code may define multiple instances of the Conv module 302 and the FC module 304 and/or of the Conv processor 124 and the FC processor 126. Multi-threaded algorithmic code may map different threads to these different instances of the Conv modules and FC modules and/or Conv processors and FC processors. These threads can run in parallel at the configured SoC 106'.

For example, the Conv processor 124 may perform the following nested loop:

```
For each input_features I[i]
    For each output_features O[o]
        O[o] = O[o] + Convolve(W[i,o], I[i])
```

The compiler 206 may unroll the nested loop, e.g., by a factor called threadNumLimit, i.e. number of threads, which may be included in the design constraints 120. Unrolling the nested loop by a thread factor of four, may produce the following:

```
For each input_feature_group I[i]: stride 4
  For each output_feature group O[o]: stride 4
  {
    O[o+0] = O[o+0] + Convolve(W[i+0,o+0], I[i+0]) +
       Convolve(W[i+1,o+0], I[i+1]) +
       Convolve(W[i+2,o+0], I[i+2]) +
       Convolve(W[i+3,o+0], I[i+3])
    O[o+1] = O[o+1] + Convolve(W[i+0, o+1], I[i+0]) +
       Convolve(W[i+1,o+1], I[i+1]) +
       Convolve(W[i+2,o+1], I[i+2]) +
       Convolve(W[i+3,o+1], I[i+3])
    O[o+2] = O[o+2] + Convolve(W[i+0, o+2], I[i+0]) +
       Convolve(W[i+1,o+2], I[i+1]) +
       Convolve(W[i+2,o+2], I[i+2]) +
       Convolve(W[i+3,o+2], I[i+3])
    O[o+3] = O[o+3] + Convolve(W[i+0, o+3], I[i+0]) +
       Convolve(W[i+1,o+3], I[i+1]) +
       Convolve(W[i+2,o+3], I[i+2]) +
       Convolve(W[i+3,o+3], I[i+3])
  }
```

The compiler 206 may generate separate threads for these 16 convolve operations, and may map each thread to a corresponding Conv processor 124 in the configured FPGA 300. The compiler 206 may unroll the loop by a factor of 4 at two levels, thereby creating 16 Convolve calls. The scheduler 205 may schedule each Convolve call to one thread. All 16 threads may be run in parallel. In a convolutional layer, every output feature depends on every input feature (all-to-all). With 4×4 parallelization, e.g., 16 threads, for example, four input features are sent to four Conv processors 124 to compute their contribution, e.g., partial results, to four output features. The input/output features may be grouped, and each group may have threadNumLimit features.

In some embodiments, the threads may scale up in a quadratic order due to the all-to-all relationship in the convolutional layer. For example, a next point of parallelization may be 5×5, e.g., 25 threads.

Multiple threads may also be generated for performing the vector-matrix multiplication of fully connected layers. For example, the input may be divided into multiple, e.g., four streams, and each thread may operate of a different stream of the input. The outputs of the streams may be assembled to form the output of the fully connected layer.

It should be understood that the DL configuration system 200 may be configured to implement other parallelization strategies besides or in addition to multi-threading. For example, it may implement one or more of the following parallelization strategies:
1. Fine-grained pipelining—every thread includes many pipeline stages, allowing many activations to be computed simultaneously.
2. Coarse-grained pipelining—Conv and FC processors 124 and 126 are pipelined, allowing two images for example to be processed in them at the same time. The DL configuration system 200 may even break one conv processor into two or more conv processors and arrange them back to back as small convolution processors to improve throughput further, for example if hardware resources of the FPGA 110 allow.
3. Batch—the DL configuration system 200 may replicate the FC processor 126, for example. The multiple FC processors 126 can process two images, for example, at the same time to reuse weights to save bandwidth.

Other DL Network Types

As described, the DL configuration system 200 may generate different architecture code depending on the type of DNN. For example, for a DAG network, the architecture code may swap intermediate results, e.g., tensors, between the configured FPGA and the external memory, as BRAMs may not be large enough to host all of the intermediate results. The swapping may be scheduled at compile time of the DNN 116. The Conv controller and FC controller may control the swapping of intermediate results.

Figure 18:
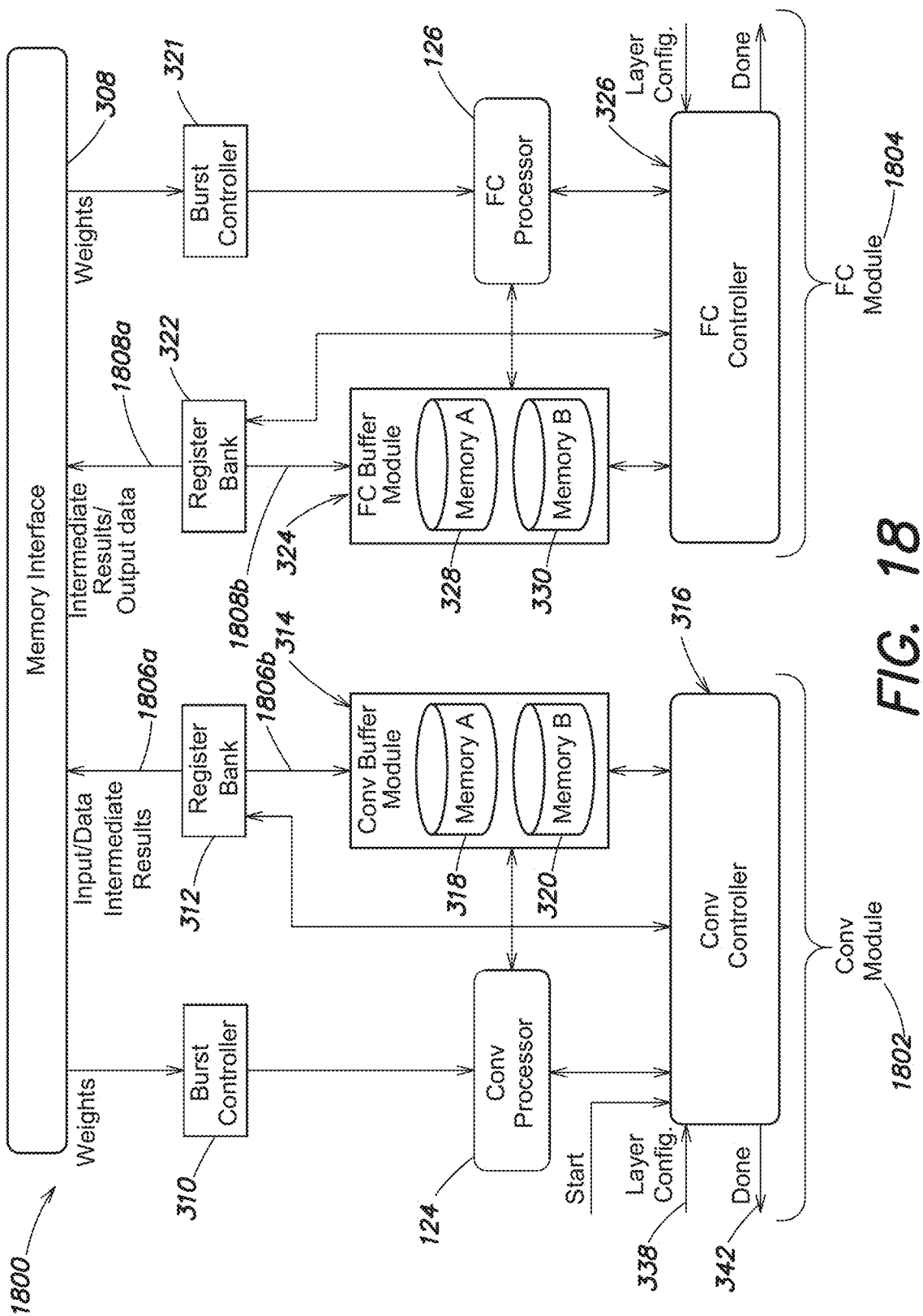
FIG. 18 is a schematic illustration of an example of a portion of a configured programmable logic device in accordance with one or more embodiments.

FIG. 18 is a schematic illustration of an example of a portion of a configured FPGA 1800 in accordance with one or more embodiments. The configured FPGA 1800 may include a Cony module 1802 and a FC module 1804. In this embodiment, the Cony module 1802 and the FC module 1804 are not interconnected, e.g., by a FIFO memory. Instead, the Cony buffer module 314 may be configured to move output data computed by the last layer mapped to the Cony processor 124 to the external memory 108, as indicated by arrows 1806a and 1806b. The output data may be fetched into the FC buffer module 324, as indicated by arrows 1808a and 1808b.

In some embodiments, the architecture code 122 may define other processors in addition to the Conv and FC processors 124 and 126. For example, the architecture code 122 may define one or more add-concatenation layer processors and one or more unpooling processors. In other embodiments, the Conv and FC processors 124 and 126 may be enhanced to have two input features instead of one, for example to support DAG networks.

In some embodiments, architecture code generated for running one DNN may be reused to run another DNN of the same type. In other embodiments, architecture code generated for running one type of DNN may be reused to run another type of DNN. For example, architecture code that defines Conv and FC processors may be reused to run a DNN that includes only Convolution layers, or just the Convolution layers of a DNN while the FC layers are run for example on a workstation.

In addition, changing one or more of the design constraints 120 may result in the code generator 210 generating different architecture code, e.g., changing the structure of the Conv processor 124, the FC processor 126, the FIFO 306, and/or other hardware elements, creating new or additional hardware elements, etc. A user may use a range of different choices in the design constraints 120, and direct the code generator 210 to generate architecture codes for these different choices. The user may then evaluate the different architecture codes, which may represent trade-offs in speed, area usage, and/or power consumption, and choose one of them. The user may then direct the compiler 206 to produce a deployable network for the chosen architecture code.

Exemplary Data Processing Device

Figure 19:
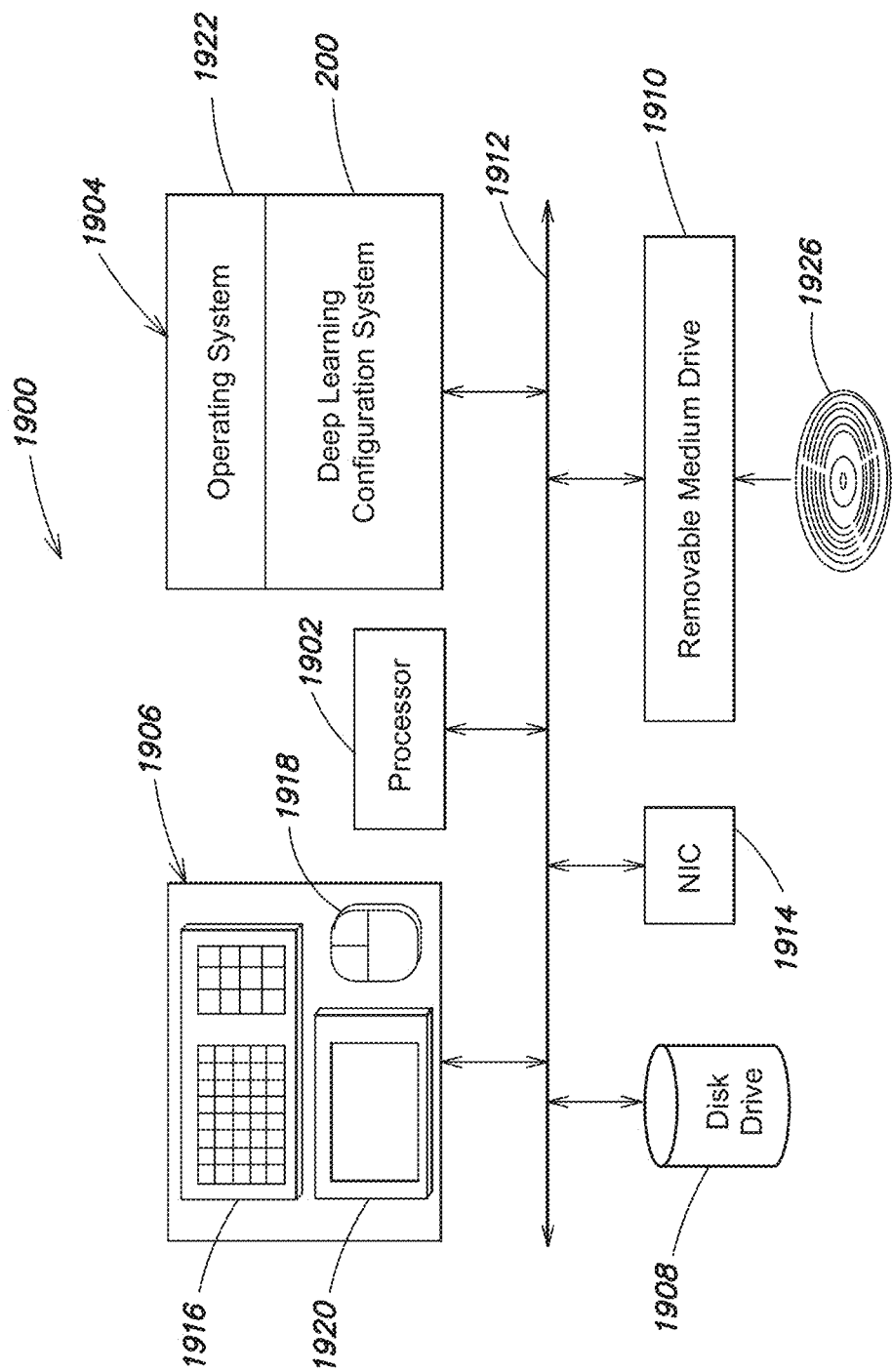
FIG. 19 is a schematic illustration of an example computer or data processing system for implementing one or more embodiments of the disclosure.

FIG. 19 is a schematic illustration of an example computer or data processing system 1900 for implementing one or more embodiments of the disclosure. The computer system 1900 may include one or more processing elements, such as a processor 1902, a main memory 1904, user input/output (I/O) 1906, a persistent data storage unit, such as a disk drive 1908, and a removable medium drive 1910 that are interconnected by a system bus 1912. The computer system 1900 may also include a communication unit, such as a network interface card (NIC) 1914. The user I/O 1906 may include a keyboard 1916, a pointing device, such as a mouse 1918, and a display 1920. Other user I/O 1906 components include voice or speech command systems, touchpads and touchscreens, printers, projectors, etc. Exemplary processors include single or multi-core Central Processing Units (CPUs), Graphics Processing Units (GPUs), Field Programmable Gate Arrays (FPGAs), Application Specific Integrated Circuits (ASICs), microprocessors, microcontrollers, etc.

The main memory 1904, which may be a Random Access Memory (RAM), may store a plurality of program libraries or modules, such as an operating system 1922, and one or more application programs that interface to the operating system 1922, such as deep learning configuration system 200.

The removable medium drive 1910 may accept and read a computer readable medium 1926, such as a CD, DVD, floppy disk, solid state drive, tape, flash memory or other non-transitory medium. The removable medium drive 1910 may also write to the computer readable medium 1926.

Suitable computer systems include personal computers (PCs), workstations, servers, laptops, tablets, palm computers, smart phones, electronic readers, and other portable computing devices, etc. Nonetheless, those skilled in the art will understand that the computer system 1900 of FIG. 19 is intended for illustrative purposes only, and that the present disclosure may be used with other computer, data processing, or computational systems or devices. The present disclosure may also be used in a computer network, e.g., client-server, architecture, or a public and/or private cloud computing arrangement. For example, the deep learning configuration system 200 may be hosted on one or more cloud servers or devices, and accessed by remote clients through a web portal or an application hosting system.

Suitable operating systems 1922 include the Windows series of operating systems from Microsoft Corp. of Redmond, Wash., the Android and Chrome OS operating systems from Google Inc. of Mountain View, Calif., the Linux operating system, the MAC OS® series of operating systems from Apple Inc. of Cupertino, Calif., and the UNIX® series of operating systems, among others. The operating system 1922 may provide services or functions for applications or modules, such as allocating memory, organizing data objects or files according to a file system, prioritizing requests, managing I/O, etc. The operating system 1922 may run on a virtual machine, which may be provided by the data processing system 1900.

As indicated above, a user, such as an engineer, scientist, programmer, developer, etc., may utilize one or more input devices, such as the keyboard 1916, the mouse 1918, and the display 1920 to operate the deep learning configuration system 200.

Figure 20:
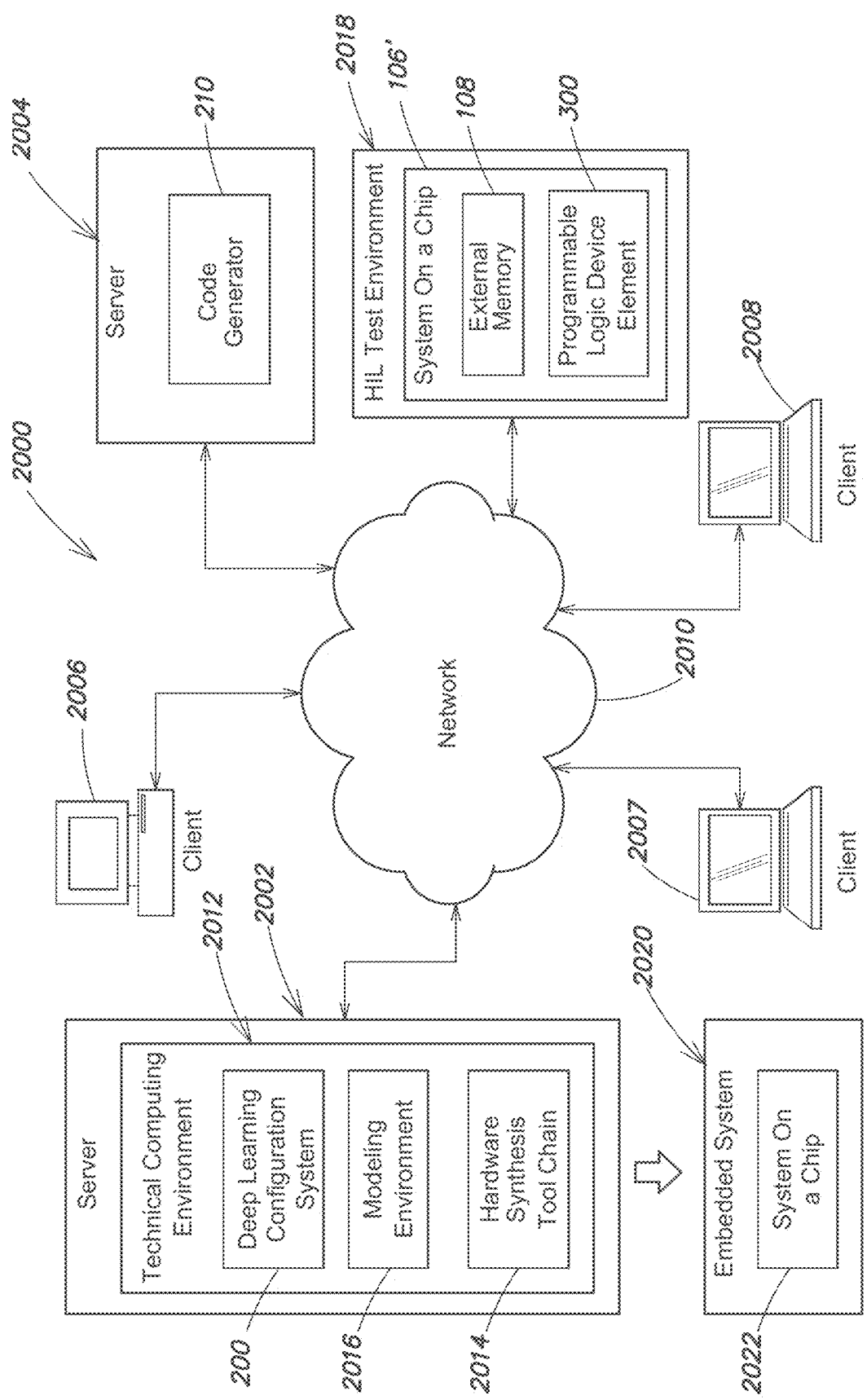
FIG. 20 is a schematic diagram of an example distributed computing environment in which systems and/or methods described herein may be implemented.

FIG. 20 is a schematic diagram of an example distributed computing environment 2000 in which systems and/or methods described herein may be implemented. The environment 2000 may include client and server devices, such as two servers 2002 and 2004, and three clients 2006-2008, interconnected by one or more networks, such as network 2010. The servers 2002 and 2004 may include applications or processes accessible by the clients 2006-2008. For example, the server 2002 may run a technical computing environment 2012 and a hardware synthesis tool chain 2014. The technical computing environment 2012 may run the deep learning configuration system 200 and a modeling environment 2016. The server 2004 may run the code generator 210 and/or some other application. The devices of the environment 2000 may interconnect via wired connections, wireless connections, or a combination of wired and wireless connections.

An exemplary technical computing environment 2012 is the MATLAB® algorithm development environment from The MathWorks, Inc. of Natick, Mass. Exemplary modeling environments 2016 include the Simulink® model-based design environment, the Simscape physical modeling system, and the Stateflow® state chart tool all from The MathWorks, Inc., the MapleSim physical modeling and simulation tool from Waterloo Maple Inc. of Waterloo, Ontario, Canada, the LabVIEW virtual instrument programming system and the NI MatrixX model-based design product from National Instruments Corp. of Austin, Tex., the Keysight VEE graphical programming environment from Keysight Technologies, Inc. of Santa Clara, Calif., the System Studio model-based signal processing algorithm design and analysis tool and the SPW signal processing algorithm tool from Synopsys, Inc. of Mountain View, Calif., a Unified Modeling Language (UML) system, a Systems Modeling Language (SysML) system, and the System Generator system from Xilinx, Inc. of San Jose, Calif.

The MATLAB algorithm development environment is a math-oriented, textual programming environment for digital signal processing (DSP) design, among other uses. The Simulink model-based design environment is a block diagram-based design environment for modeling and simulating dynamic systems, among other uses. The MATLAB and Simulink environments provide a number of high-level features that facilitate algorithm development and exploration, and support model-based design, including dynamic typing, array-based operations, data type inferencing, sample time inferencing, and execution order inferencing, among others.

In some embodiments, a simulation model may be a time-based block diagram. A time-based block diagram may include, for example, model elements, such as blocks, connected by lines, e.g., arrows, that may represent signal values written and/or read by the model elements. A signal is a time varying quantity that may have a value at all points in time during execution of a model, for example at each simulation or time step of the model's iterative execution. A signal may have a number of attributes, such as signal name, data type, numeric type, dimensionality, complexity, sample mode, e.g., sample-based or frame-based, and sample time. The model elements may themselves consist of elemental dynamic systems, such as a differential equation system, e.g., to specify continuous-time behavior, a difference equation system, e.g., to specify discrete-time behavior, an algebraic equation system, e.g., to specify constraints, a state transition system, e.g., to specify finite state machine behavior, an event based system, e.g., to specify discrete event behavior, etc. The connections may specify input/output relations, execution dependencies, variables, e.g., to specify information shared between model elements, physical connections, e.g., to specify electrical wires, pipes with volume flow, rigid mechanical connections, etc., algorithms, e.g., to be applied to an input, an output, a value, etc., or the like.

In a time-based block diagram, ports may be associated with model elements. A relationship between two ports may be depicted as a line, e.g., a connector line, between the two ports. Lines may also, or alternatively, be connected to other lines, for example by creating branch points. A port may be defined by its function, such as an input port, an output port, an enable port, a trigger port, a function-call port, a publish port, a subscribe port, an exception port, an error port, a physics port, an entity flow port, a data flow port, a control flow port, etc.

Relationships between model elements may be causal and/or non-causal. For example, a model may include a continuous-time integration block that may be causally related to a data logging block by depicting a connector line to connect an output port of the continuous-time integration block to an input port of the data logging model element. Further, during execution of the model, the value stored by the continuous-time integrator may change as the current time of the execution progresses. The value of the state of the continuous-time integrator block may be available on the output port and the connection with the input port of the data logging model element may make this value available to the data logging block.

In some implementations, a model element may include or otherwise correspond to a non-causal modeling function or operation. An example of a non-causal modeling function may include a function, operation, or equation that may be executed in different fashions depending on one or more inputs, circumstances, and/or conditions. A non-causal modeling function or operation may include a function, operation, or equation that does not have a predetermined causality.

The modeling environment 2016 may implement a graphical programming language having a syntax and semantics, and models may be constructed according to the syntax and semantics defined by the modeling environment 2016.

Exemplary code generators include the HDL Coder, the Simulink Coder, the Embedded Coder, and the Simulink PLC Coder products from The MathWorks, Inc., and the TargetLink product from dSpace GmbH of Paderborn Germany.

In some embodiments, the distributed environment 2000 may include a Hardware-in-the-Loop (HIL) test environment 2018, which may include one or more hardware elements, such as the configured SoC 106' having the external memory 108 and the configured FPGA 300. The hardware synthesis tool chain 2014 may synthesize, e.g., fabricate, the configured FPGA 300.

The hardware synthesis tool chain 2014 may also synthesize, as indicated by arrow 2019, is at least a portion of an embedded system 2020, which may include a configured SoC indicated at 2022. The embedded system 2020 may be a deployed or deployable system.

The servers 2002 and 2004 may include one or more devices capable of receiving, generating, storing, processing, executing, and/or providing information. For example, the servers 2002 and 2004 may include a computing device, such as a server, a desktop computer, a laptop computer, a tablet computer, a handheld computer, or a similar device.

The clients 2006-2008 may be capable of receiving, generating, storing, processing, executing, and/or providing information. Information may include any type of machine-readable information having substantially any format that may be adapted for use, e.g., in one or more networks and/or with one or more devices. The information may include digital information and/or analog information. The information may further be packetized and/or non-packetized. In an embodiment, the clients 2006-2008 may download data and/or code from the servers 2002 and 2004 via the network 2010. In some implementations, the clients 2006-2008 may be desktop computers, workstations, laptop computers, tablet computers, handheld computers, mobile phones (e.g., smart phones, radiotelephones, etc.), electronic readers, or similar devices. In some implementations, the clients 2006-2008 may receive information from and/or transmit information to the servers 2002 and 2004.

The network 2010 may include one or more wired and/or wireless networks. For example, the network 2010 may include a cellular network, a public land mobile network (PLMN), a local area network (LAN), a wide area network (WAN), a metropolitan area network (MAN), a telephone network (e.g., the Public Switched Telephone Network (PSTN)), an ad hoc network, an intranet, the Internet, a fiber optic-based network, and/or a combination of these or other types of networks. Information may be exchanged between network devices using any network protocol, such as, but not limited to, the Internet Protocol (IP), Asynchronous Transfer Mode (ATM), Synchronous Optical Network (SONET), the User Datagram Protocol (UDP), Institute of Electrical and Electronics Engineers (IEEE) 802.11, etc.

The number of devices and/or networks shown in FIG. 20 is provided as an example. In practice, there may be additional devices and/or networks, fewer devices and/or networks, different devices and/or networks, or differently arranged devices and/or networks than those shown in FIG. 20. Furthermore, two or more devices shown in FIG. 20 may be implemented within a single device, or a single device shown in FIG. 20 may be implemented as multiple, distributed devices. Additionally, one or more of the devices of the distributed computing environment 2000 may perform one or more functions described as being performed by another one or more devices of the environment 2000.

The foregoing description of embodiments is intended to provide illustration and description, but is not intended to be exhaustive or to limit the disclosure to the precise form disclosed. Modifications and variations are possible in light of the above teachings or may be acquired from a practice of the disclosure. For example, while a series of acts has been described above with respect to the flow diagrams, the order of the acts may be modified in other implementations. In addition, the acts, operations, and steps may be performed by additional or other modules or entities, which may be combined or separated to form other modules or entities. Further, non-dependent acts may be performed in parallel. Also, the term "user", as used herein, is intended to be broadly interpreted to include, for example, a computer or data processing system or a human user of a computer or data processing system, unless otherwise stated.

Further, certain embodiments of the disclosure may be implemented as logic that performs one or more functions. This logic may be hardware-based, software-based, or a combination of hardware-based and software-based. Some or all of the logic may be stored in one or more tangible non-transitory computer-readable storage media and may include computer-executable instructions that may be executed by a computer or data processing system. The computer-executable instructions may include instructions that implement one or more embodiments of the disclosure. The tangible non-transitory computer-readable storage media may be volatile or non-volatile and may include, for example, flash memories, dynamic memories, removable disks, and non-removable disks.

No element, act, or instruction used herein should be construed as critical or essential to the disclosure unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

The foregoing description has been directed to specific embodiments of the present disclosure. It will be apparent, however, that other variations and modifications may be made to the described embodiments, with the attainment of some or all of their advantages. For example, the compiler 206 and the code generator 210 may be combined into a single entity, such as a single code generator. In some embodiments, the scheduler 205, the compiler 206, and the code generator 210 may all be combined into a single code generator. Therefore, it is the object of the appended claims to cover all such variations and modifications as come within the true spirit and scope of the disclosure.

What is claimed is:

1. A computer-implemented method comprising:
for a trained deep neural network that includes layers including one or more convolutional (conv) layers and one or more fully connected (FC) layers,
generating Hardware Description Language (HDL) code for running the deep neural network on at least one programmable logic device, wherein the HDL code defines
a first soft core processor defined to perform the one or more conv layers of the deep neural network,
a first buffer module of the first soft core processor,
a second soft core processor defined to perform the one or more FC layers of the deep neural network, and
a second buffer module of the second soft core processor;
compiling the deep neural network to run on the at least one programmable logic device, the compiling including:
creating instructions for running the layers of the deep neural network,
mapping a first set of the instructions to the first soft core processor for execution,
mapping a second set of the instructions to the second soft core processor for execution,
scheduling an order of execution of the first set of instructions and the second set of instructions by the first soft core processor and the second soft core processor,
scheduling outputs computed by one or more instructions of the first set of the instructions to the first buffer module,
scheduling outputs computed by one or more instructions of the second set of the instructions to the second buffer module,
scheduling at least one of the outputs computed by the one or more instructions of the first set of the instructions to a memory accessible by the first soft core processor and the second soft core processor; and
executing the instructions to run the deep neural network on the at least one programmable logic device configured with the HDL code.

2. The computer-implemented method of claim 1 wherein the HDL code further defines at least one hardware debugger configured to:
set one or more breakpoints during the executing the instructions to run the deep neural network at the configured programmable logic device;
step through the executing the instructions to run the deep neural network at the configured programmable logic device; and
access data stored at one or more of
the first buffer module,
the second buffer module, or
the memory accessible by the first soft core processor and the second soft core processor.

3. The computer-implemented method of claim 2 wherein the access is read/write access.

4. The computer-implemented method of claim 3 further comprising:
providing a debugger manager operably connected to the at least one hardware debugger, where the debugger manager is configured to:
control operation of the at least one hardware debugger;
present the data; and
modify the data as stored at the one or more of
the first buffer module,
the second buffer module, or
the memory accessible by the first soft core processor and the second soft core processor.

5. The computer-implemented method of claim 1 further comprising:
estimating one or more performance attributes of running the deep neural network on the at least one programmable logic device based on an analysis of the instructions for running the layers of the deep neural network.

6. The computer-implemented method of claim 5 wherein the one or more performance attributes includes speed, area usage, and power consumption.

7. The computer-implemented method of claim 1 wherein the first soft core processor is configured to perform a convolution operation between a filter containing weights and a 3×3 array of elements from an input.

8. The computer-implemented method of claim 7 wherein at least one of the one or more conv layers has a stride and the first buffer module includes two memory units each configured as a 3×3 array of memory bins, and the scheduling the outputs computed by the one or more instructions of the first set of the instructions to the first buffer module includes
scheduling elements of a given output which is also an input to the at least one of the one or more conv layers for storage at selected ones of the 3×3 array of memory bins of one of the two memory units where each element of the given output is stored at one of the memory bins and each memory bin is accessed once when performing each step of the stride of the at least one of the one or more conv layers.

9. The computer-implemented method of claim 1 wherein the deep neural network includes weights, the programmable logic device is in communication with an external memory, and the programmable logic device and the external memory are part of a System on a Chip (SoC), the method further comprising:
storing the weights at the external memory, wherein the HDL code further defines
a first burst controller for accessing the weights from the external memory and providing the weights to the first soft core processor.

10. The computer-implemented method of claim 9 wherein the compiling further includes:
scheduling at least a portion of the outputs computed by the one or more instructions of the first set of the instructions to be buffered at the external memory.

11. The computer-implemented method of claim 9 wherein the memory accessible by the first soft core processor and the second soft core processor is the external memory.

12. The computer-implemented method of claim 1 wherein the HDL code is programmable logic device vendor independent.

13. The computer-implemented method of claim 1 wherein the deep neural network is at least one of a series type network, a Directed Acyclic Graph (DAG) type network, or a Long Short-Term Memory (LSTM) type networks.

14. The computer-implemented method of claim 1 further comprising:
configuring the at least one programmable logic device utilizing the HDL code to produce at least one configured programmable logic device that includes: the first soft core processor, the first buffer module, the second soft core processor, and the second buffer module.

15. The computer-implemented method of claim 1 wherein the deep neural network has a type, the computer-implemented method further comprising:
    deriving information defining a hardware design space for running the deep neural network on the at least one programmable logic device based on the type of the deep neural network and design constraints associated with the deep neural network,
    wherein the information defining the hardware design space includes (i) first information indicating limits on inputs to the layers of the deep neural network and on outputs computed by the layers of the deep neural network, and (ii) second information indicating latencies of operations performed by the layers of the deep neural network, and
    further wherein the HDL code generated for running the deep neural network on the at least one programmable logic device is based on the information defining the hardware design space.

16. The computer-implemented method of claim 1 wherein the first buffer module includes two memory units configured for ping-pong buffering.

17. The computer-implemented method of claim 1 wherein the HDL code further defines the memory accessible by the first soft core processor and the second soft core processor.

18. A computer-implemented method comprising:
    for a trained deep neural network that includes layers including one or more convolutional (conv) layers and one or more fully connected (FC) layers,
    generating Hardware Description Language (HDL) code for running the deep neural network on at least one programmable logic device, wherein the HDL code defines
        a first soft core processor defined to perform the one or more conv layers of the deep neural network,
        a first buffer module of the first soft core processor to store inputs and outputs of the one or more conv layers of the deep neural network,
        a second soft core processor defined to perform the one or more FC layers of the deep neural network,
        a second buffer module of the second soft core processor to store inputs and outputs of the one or more FC layers of the deep neural network, and
        at least one hardware debugger configured to:
            set one or more breakpoints during execution of the deep neural network at the at least one programmable logic device;
            step through the execution of the deep neural network at the at least one programmable logic device; and
            access data stored at one or more of
            the first buffer module,
            the second buffer module, or
            a memory accessible by the first soft core processor and the second soft core processor.

19. The computer-implemented method of claim 18 wherein the hardware debugger communicates the data with one or more data processing devices.

20. The computer-implemented method of claim 18 wherein the one or more breakpoints are at the one or more conv layers of the deep neural network, the one or more FC layers of the deep neural network, a pooling layer of the deep neural network, an activation layer of the deep neural network, or a softmax layer of the deep neural network.

21. The computer-implemented method of claim 16 further comprising:
    providing a debugger manager operably connected to the at least one hardware debugger, where the debugger manager is configured to:
        control operation of the at least one hardware debugger;
        present the data; and
        modify the data as stored at the one or more of
            the first buffer module,
            the second buffer module, or
            the memory accessible by the first soft core processor and the second soft core processor.

22. One or more non-transitory computer-readable media, having stored thereon instructions that when executed by a computing device, cause the computing device to perform operations comprising:
    for a trained deep neural network that includes layers including one or more convolutional (conv) layers and one or more fully connected (FC) layers,
    generating Hardware Description Language (HDL) code for running the deep neural network on at least one programmable logic device, wherein the HDL code defines
        at least one first soft core processor defined to perform the one or more conv layers of the deep neural network,
        a first buffer module of the at least one first soft core processor,
        at least one second soft core processor defined to perform the one or more FC layers of the deep neural network, and
        a second buffer module of the at least one second soft core processor; and
    compiling the deep neural network to run on the at least one programmable logic device, the compiling including:
        creating instructions for running the layers of the deep neural network,
        mapping a first set of the instructions to the at least one first soft core processor for execution,
        mapping a second set of the instructions to the at least one second soft core processor for execution,
        scheduling an order of execution of the first set of instructions and the second set of instructions by the at least one first soft core processor and the at least one second soft core processor,
        scheduling outputs computed by one or more instructions of the first set of the instructions to the first buffer module, and
        scheduling outputs computed by one or more instructions of the second set of the instructions to the second buffer module.

23. The one or more non-transitory computer-readable media of claim 22 wherein the HDL code further defines at least one hardware debugger configured to:
    set one or more breakpoints during the executing the instructions to run the deep neural network at the configured programmable logic device;
    step through the executing the instructions to run the deep neural network at the configured programmable logic device; and
    access data stored at one or more of
    the first buffer module,
    the second buffer module, or a memory accessible by the first soft core processor and the second soft core processor.

24. The one or more non-transitory computer-readable media of claim 22 wherein the deep neural network has a type and the instructions cause the computing device to perform operations further comprising:
deriving information defining a hardware design space for running the deep neural network on the at least one programmable logic device based on the type of the deep neural network and design constraints associated with the deep neural network,
wherein the information defining the hardware design space includes (i) first information indicating limits on inputs to the layers of the deep neural network and on outputs computed by the layers of the deep neural network, and (ii) second information indicating latencies of operations performed by the layers of the deep neural network, and
further wherein the HDL code generated for running the deep neural network on the at least one programmable logic device is based on the information defining the hardware design space.

25. The one or more non-transitory computer-readable media of claim 22 wherein
the first soft core processor is configured to perform a convolution operation between a filter containing weights and a 3×3 array of elements from an input,
at least one of the one or more conv layers has a stride and the first buffer module includes two memory units each configured as a 3×3 array of memory bins, and the scheduling the outputs computed by the one or more instructions of the first set of the instructions to the first buffer module includes
scheduling elements of a given output which is also an input to the at least one of the one or more conv layers for storage at selected ones of the 3×3 array of memory bins of one of the two memory units where each element of the given output is stored at one of the memory bins and each memory bin is accessed once when performing each step of the stride of the at least one of the one or more conv layers.

26. The one or more non-transitory computer-readable media of claim 22 wherein the deep neural network includes weights, the programmable logic device is in communication with an external memory, and the programmable logic device and the external memory are part of a System on a Chip (SoC), the operations further comprising:
storing the weights at the external memory, wherein the HDL code further defines
a first burst controller for accessing the weights from the external memory and providing the weights to the first soft core processor.

27. The one or more non-transitory computer-readable media of claim 22 wherein the compiling further includes scheduling at least one of the outputs computed by the one or more instructions of the first set of the instructions to a memory accessible by the first soft core processor and the second soft core processor, and the operations further comprise:
executing the instructions to run the deep neural network on the at least one programmable logic device configured with the HDL code.

28. The one or more non-transitory computer-readable media of claim 27 wherein the HDL code further defines the memory accessibly by the first soft core processor and the second soft core processor, or wherein the memory accessible by the first soft core processor and the second soft core processor is an external memory.

29. An apparatus comprising:
a memory storing a trained deep neural network that includes layers including one or more convolutional (conv) layers and one or more fully connected (FC) layers; and
one or more processors configured to:
generate Hardware Description Language (HDL) code for running the deep neural network on at least one programmable logic device, wherein the HDL code defines
at least one first soft core processor defined to perform the one or more conv layers of the deep neural network,
a first buffer module of the at least one first soft core processor,
at least one second soft core processor defined to perform the one or more FC layers of the deep neural network, and
a second buffer module of the at least one second soft core processor; and
compile the deep neural network to run on the at least one programmable logic device, the compile including:
create instructions for running the layers of the deep neural network,
map a first set of the instructions to the at least one first soft core processor for execution,
map a second set of the instructions to the at least one second soft core processor for execution,
schedule an order of execution of the first set of instructions and the second set of instructions by the at least one first soft core processor and the at least one second soft core processor,
schedule outputs computed by one or more instructions of the first set of the instructions to the first buffer module, and
schedule outputs computed by one or more instructions of the second set of the instructions to the second buffer module.

30. The apparatus of claim 29 wherein
the first soft core processor is configured to perform a convolution operation between a filter containing weights and a 3×array of elements from an input,
at least one of the one or more conv layers has a stride and the first buffer module includes two memory units each configured as a 3×3 array of memory bins, and the scheduling the outputs computed by the one or more instructions of the first set of the instructions to the first buffer module includes
scheduling elements of a given output which is also an input to the at least one of the one or more conv layers for storage at selected ones of the 3×3 array of memory bins of one of the two memory units where each element of the given output is stored at one of the memory bins and each memory bin is accessed once when performing each step of the stride of the at least one of the one or more conv layers.

31. The apparatus of claim 29 wherein the deep neural network includes weights, the programmable logic device is in communication with an external memory, and the programmable logic device and the external memory are part of a System on a Chip (SoC), the one or more processors further configured to:
store the weights at the external memory, wherein the HDL code further defines a first burst controller for accessing the weights from the external memory and providing the weights to the first soft core processor.

32. The apparatus of claim 29 wherein the compiling further includes scheduling at least one of the outputs computed by the one or more instructions of the first set of the instructions to a memory accessible by the first soft core processor and the second soft core processor.

33. The apparatus of claim 32 wherein the HDL code further defines the memory accessible by the first soft core processor and the second soft core processor, or wherein the memory accessible by the first soft core processor and the second soft core processor is an external memory.

34. One or more non-transitory computer-readable media, having stored thereon instructions that when executed by a computing device, cause the computing device to perform operations comprising:
for a trained deep neural network that includes layers including one or more convolutional (conv) layers and one or more fully connected (FC) layers,
generating Hardware Description Language (HDL) code for running the deep neural network on at least one programmable logic device, wherein the HDL code defines
a first soft core processor defined to perform the one or more conv layers of the deep neural network,
a first buffer module of the first soft core processor to store inputs and outputs of the one or more conv layers of the deep neural network,
a second soft core processor defined to perform the one or more FC layers of the deep neural network,
a second buffer module of the second soft core processor to store inputs and outputs of the one or more FC layers of the deep neural network, and
atleast one hardware debugger configured to:
set one or more breakpoints during execution of the deep neural network at the at least one programmable logic device;
step through the execution of the deep neural network at the at least one programmable logic device; and
access data stored at one or more of
the first buffer module,
the second buffer module, or
a memory accessible by the first soft core processor and the second soft core processor.

35. The one or more non-transitory computer-readable media of claim 34 wherein the hardware debugger communicates the data with one or more data processing devices.

36. The one or more non-transitory computer-readable media of claim 34 wherein the one or more breakpoints are at the one or more conv layers of the deep neural network, the one or more FC layers of the deep neural network, a pooling layer of the deep neural network, an activation layer of the deep neural network, or a softmax layer of the deep neural network.

37. The one or more non-transitory computer-readable media of claim 34 wherein the operations further comprise:
providing a debugger manager operably connected to the at least one hardware debugger, where the debugger manager is configured to:
control operation of the at least one hardware debugger;
present the data; and
modify the data as stored at the one or more of
the first buffer module,
the second buffer module, or
the memory accessible by the first soft core processor and the second soft core processor.

38. An apparatus comprising:
a memory storing a trained deep neural network that includes layers including one or more convolutional (conv) layers and one or more fully connected (FC) layers; and
one or more processors configured to:
generate Hardware Description Language (HDL) code for running the deep neural network on at least one programmable logic device, wherein the HDL code defines
a first soft core processor defined to perform the one or more conv layers of the deep neural network,
a first buffer module of the first soft core processor to store inputs and outputs of the one or more conv layers of the deep neural network,
a second soft core processor defined to perform the one or more FC layers of the deep neural network,
a second buffer module of the second soft core processor to store inputs and outputs of the one or more FC layers of the deep neural network, and
at least one hardware debugger configured to:
set one or more breakpoints during execution of the deep neural network at the at least one programmable logic device;
step through the execution of the deep neural network at the at least one programmable logic device; and
access data stored at one or more of
the first buffer module,
the second buffer module, or
a memory accessible by the first soft core processor and the second soft core processor.

39. The apparatus of claim 38 wherein the hardware debugger communicates the data with one or more data processing devices.

40. The apparatus of claim 38 wherein the one or more breakpoints are at the one or more conv layers of the deep neural network, the one or more FC layers of the deep neural network, a pooling layer of the deep neural network, an activation layer of the deep neural network, or a softmax layer of the deep neural network.

41. The apparatus of claim 38 wherein the one or more processors are further configured to:
provide a debugger manager operably connected to the at least one hardware debugger, where the debugger manager is configured to:
control operation of the at least one hardware debugger;
present the data; and
modify the data as stored at the one or more of
the first buffer module,
the second buffer module, or
the memory accessible by the first soft core processor and the second soft core processor.

* * * * *

UNITED STATES PATENT AND TRADEMARK OFFICE
CERTIFICATE OF CORRECTION

Page 1 of 3

PATENT NO. : 11,023,360 B2
APPLICATION NO. : 16/270082
DATED : June 1, 2021
INVENTOR(S) : Yongfeng Gu et al.

It is certified that error appears in the above-identified patent and that said Letters Patent is hereby corrected as shown below:

In the Specification

Column 10, Lines 64-65:
"example, one or more of the Cony controller 316, the burst controller 310, the Cony processor 124, the register bank"
Should read:
--example, one or more of the Conv controller 316, the burst controller 310, the Conv processor 124, the register bank--

Column 12, Line 55:
"data, attributes of the Cony module 302, attributes of the FC"
Should read:
--data, attributes of the Conv module 302, attributes of the FC--

Column 16, Line 34:
"represents the output features,"
Should read:
--O represents the output features,--

Column 18, Line 19:
"convolution, as indicated by the ConyStart command 1708."
Should read:
--convolution, as indicated by the ConvStart command 1708.--

Column 26, Line 12:
"The Cony Controller 316 may direct the external memory"
Should read:
--The Conv Controller 316 may direct the external memory--

Signed and Sealed this
Seventeenth Day of June, 2025

Coke Morgan Stewart
*Acting Director of the United States Patent and Trademark Office*

CERTIFICATE OF CORRECTION (continued)
U.S. Pat. No. 11,023,360 B2

Column 26, Line 14:
"Mem A 318 or Mem B 320 of the Cony buffer module 314"
Should read:
--Mem A 318 or Mem B 320 of the Conv buffer module 314--

Column 26, Line 22:
"the configured FPGA 300 may be transferred to Cony"
Should read:
--the configured FPGA 300 may be transferred to Conv--

Column 26, Line 24:
"104 to the instruction memory 332 of the Cony Controller"
Should read:
--104 to the instruction memory 332 of the Conv Controller--

Column 26, Line 27:
"current convolutional layer are transferred to the Cony"
Should read:
--current convolutional layer are transferred to the Conv--

Column 26, Lines 31-33:
"is moved into the Cony processor 124 from the scheduled memory unit 318 or 320 of the Cony buffer module 314, as indicated at step 1414 (FIG. 14B). The Cony processor 124"
Should read:
--is moved into the Conv processor 124 from the scheduled memory unit 318 or 320 of the Conv buffer module 314, as indicated at step 1414 (FIG. 14B). The Conv processor 124--

Column 32, Lines 10-11:
"include a Cony module 1802 and a FC module 1804. In this embodiment, the Cony module 1802 and the FC module"
Should read:
--include a Conv module 1802 and a FC module 1804. In this embodiment, the Conv module 1802 and the FC module--

Column 32, Line 13:
"Instead, the Cony buffer module 314 may be configured to"
Should read:
--Instead, the Conv buffer module 314 may be configured to--

Column 32, Line 15:
"Cony processor 124 to the external memory 108, as indi-"
Should read:
--Conv processor 124 to the external memory 108, as indi- --

CERTIFICATE OF CORRECTION (continued)
U.S. Pat. No. 11,023,360 B2

In the Claims

Column 40, Line 3:
"21. The computer-implemented method of claim 16 fur-"
Should read:
--21. The computer-implemented method of claim 18 fur- --

Column 43, Line 35:
"atleast one hardware debugger configured to:"
Should read:
--at least one hardware debugger configured to--